United States Patent
Yen et al.

(10) Patent No.: US 10,886,477 B2
(45) Date of Patent: Jan. 5, 2021

(54) IRIDIUM COMPLEX AND ORGANIC ELECTROLUMINESCENCE DEVICE USING THE SAME

(71) Applicants: Feng-Wen Yen, Taipei (TW); Wen-Feng Hsiao, Nantou (TW)

(72) Inventors: Feng-Wen Yen, Taipei (TW); Wen-Feng Hsiao, Nantou (TW)

(*) Notice: Subject to any disclaimer, the term of this patent is extended or adjusted under 35 U.S.C. 154(b) by 329 days.

(21) Appl. No.: 15/933,392

(22) Filed: Mar. 23, 2018

(65) Prior Publication Data

US 2019/0296251 A1 Sep. 26, 2019

(51) Int. Cl.
| | |
|---|---|
| *H01L 51/00* | (2006.01) |
| *C07F 15/00* | (2006.01) |
| *C09K 11/06* | (2006.01) |
| *H01L 51/50* | (2006.01) |

(52) U.S. Cl.
CPC ...... *H01L 51/0085* (2013.01); *C07F 15/0033* (2013.01); *C09K 11/06* (2013.01); *H01L 51/0067* (2013.01); *H01L 51/0072* (2013.01); *C09K 2211/1033* (2013.01); *C09K 2211/1037* (2013.01); *C09K 2211/1048* (2013.01); *C09K 2211/1059* (2013.01); *C09K 2211/185* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 9,893,305 B2 | 2/2018 | Yen | |
| 2007/0231600 A1* | 10/2007 | Kamatani | C09K 11/06 428/690 |
| 2013/0341600 A1* | 12/2013 | Lin | C07F 7/0816 257/40 |
| 2016/0233442 A1* | 8/2016 | Yen | H01L 51/0085 |
| 2016/0351835 A1* | 12/2016 | Yen | H01L 51/0085 |
| 2016/0372679 A1* | 12/2016 | Yen | H01L 51/0067 |
| 2016/0380207 A1* | 12/2016 | Yen | H01L 51/0072 257/40 |
| 2017/0077410 A1* | 3/2017 | Yen | C07D 491/048 |
| 2018/0026210 A1* | 1/2018 | Dyatkin | H01L 51/0085 257/40 |
| 2018/0233677 A1* | 8/2018 | Yen | H01L 51/0085 |

OTHER PUBLICATIONS

Park et al. "Synthesis and characterization of red iridium(III) complexes containng phenothiazine-phenylquinoline based on main ligand for solution-processed phosphorescent organic light-emitting diodes" Synthetic Metals, 2011, 161, 213-218. (Year: 2011).*

* cited by examiner

*Primary Examiner* — Robert S Loewe

(57) ABSTRACT

The present invention discloses an iridium complex of formula (1) below and an organic electroluminescence device employing the iridium complex as the phosphorescent dopant material. The organic EL device can display good performance, such as reduced driving voltage, increased current efficiency, and longer half-life time.

Formula (1)

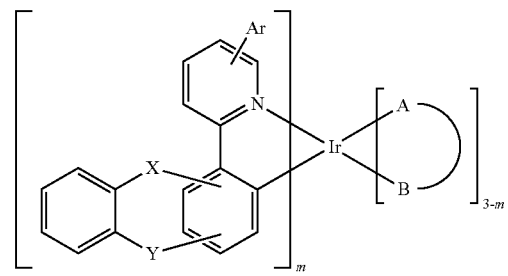

8 Claims, 1 Drawing Sheet

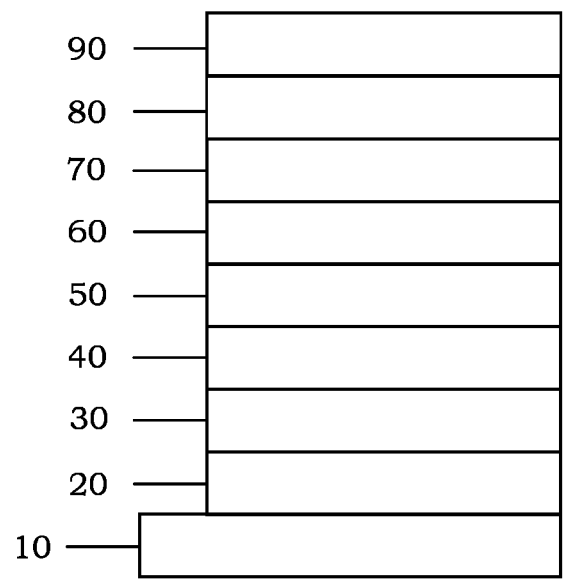

IRIDIUM COMPLEX AND ORGANIC ELECTROLUMINESCENCE DEVICE USING THE SAME

FIELD OF INVENTION

The present invention relates generally to an iridium complex, and, more specifically, to an organic electroluminescence (hereinafter referred to as organic EL) device using the iridium complex.

BACKGROUND OF THE INVENTION

An organic EL device is a light-emitting diode (LED) in which the light emitting layer is a film made from organic compounds, which emits light in response to an electric current. The light emitting layer containing the organic compound is sandwiched between two electrodes. The organic EL device is applied to flat panel displays due to its high illumination, low weight, ultra-thin profile, self-illumination without back light, low power consumption, wide viewing angle, high contrast, simple fabrication methods and rapid response time.

The first observation of electroluminescence in organic materials was in the early 1950s by Andre Bernanose and his co-workers at the Nancy-University in France. Martin Pope and his co-workers at New York University first observed direct current (DC) electroluminescence on a single pure crystal of anthracene and on anthracene crystals doped with tetracene under vacuum in 1963. The first diode device was created by Ching W. Tang and Steven Van Slyke at Eastman Kodak in 1987. The diode device used a two-layer structure with separate hole transporting and electron transporting layers, resulting in reduction of operating voltage and improvement of the efficiency, thereby leading to the current era of organic EL research and device production.

Typically, organic EL device is composed of organic material layers sandwiched between two electrodes. The organic material layers include the hole transporting layer, the light emitting layer, and the electron transporting layer. The basic mechanism of organic EL involves the injection, transport, and recombination of carriers as well as exciton formation for emitting light. When an external voltage is applied across the organic EL device, electrons and holes are injected from the cathode and the anode, respectively. Electrons will be injected from a cathode into a LUMO (lowest unoccupied molecular orbital) and holes will be injected from an anode into a HOMO (highest occupied molecular orbital). Subsequently, the electrons recombine with holes in the light emitting layer to form excitons and then emit light. When luminescent molecules absorb energy to achieve an excited state, the exciton may either be in a singlet state or a triplet state, depending on how the spins of the electrons and holes have been combined. 75% of the excitons is formed by recombination of electrons and holes to achieve the triplet excited state. Decay from triplet states is spin forbidden, thus, a fluorescence electroluminescent device has only 25% internal quantum efficiency. In contrast to fluorescence electroluminescent device, phosphorescent organic EL device make use of spin-orbit interactions to facilitate intersystem crossing between singlet and triplet states, thus obtaining emission from both singlet and triplet states and the internal quantum efficiency of electroluminescent devices from 25% to 100%. The spin-orbit interactions is achieved by certain heavy atoms, such as iridium, rhodium, platinum, and palladium, and the phosphorescent transition may be observed from an excited MLCT (metal to ligand charge transfer) state of organic metallic complexes.

The phosphorescent organic EL device utilizes both triplet and singlet excitions. Cause of longer lifetime and diffusion length of triplet excitions compared to those of singlet excitions, the phosphorescent organic EL device generally need an additional hole blocking layer (HBL) between the emitting layer (EML) and the electron transporting layer (ETL) or an electron blocking layer (EBL) between the emitting layer (EML) and the hole transporting layer (HTL). The purpose of the use of HBL or EBL is to confine the recombination of injected holes and electrons and the relaxation of created excitons within the EML, hence the device's efficiency can be improved. To meet such roles, the hole blocking materials or the electron blocking materials must have HOMO (highest occupied molecular orbital) and LUMO (lowest unoccupied molecular orbital) energy levels suitable to block hole or electron transport from the EML to the ETL or the HTL.

For full-colored flat panel displays in AMOLED or OLED lighting field, the conventional materials used for the phosphorescent dopant in light emitting layer, such as the metallic complexes, are still unsatisfactory in driving voltage, current efficiency and half-life time, and still have disadvantages for industrial practice use.

SUMMARY OF THE INVENTION

According to the reasons described above, the present invention has the objective of resolving the problems of prior arts and offering an organic EL device, which has high current efficiency and long half-life time. The present invention discloses an iridium complex, which is used as a phosphorescent dopant to lower driving voltage and power consumption and increase current efficiency and half-life time of organic EL devices. The iridium complex exhibits good thermal stability in the process for producing the organic EL device.

The present invention has the economic advantages for industrial practice. Accordingly, the present invention discloses an iridium complex which can be used in organic EL devices. The mentioned iridium complex is represented by the following formula (1):

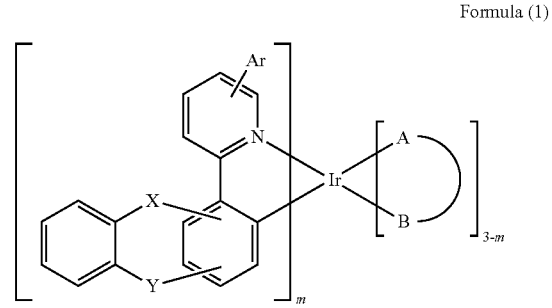

Formula (1)

wherein A-B represents a bidentate ligand; Ar represents a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, a substituted or unsubstituted heteroaryl group having 3 to 30 carbon atoms, or a fused carbocyclic ring; m represents an integer of 1 or 2; X and Y are independently O, Se, $CR_1R_2$, $SiR_3R_4$, or $NR_5$; and $R_1$ to $R_5$ are independently a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, or a substituted or unsubstituted heteroaryl group having 3 to 30 carbon atoms.

The present invention further discloses an organic electroluminescence device. The organic electroluminescence device comprises a pair of electrodes composed of a cathode and an anode, and a light emitting layer between the pair of electrodes. The light emitting layer comprises the iridium complex of formula (1).

BRIEF DESCRIPTION OF THE DRAWINGS

The FIGURE is a schematic view showing an organic EL device according to an embodiment of the present invention.

DESCRIPTION OF THE PREFERRED EMBODIMENTS

What probed into the invention is the iridium complex and organic EL device using the iridium complex. Detailed descriptions of the production, structure and elements will be provided as follows such that the invention can be fully understood. Obviously, the application of the invention is not confined to specific details familiar to those skilled in the art. On the other hand, the common elements and procedures that are well known are not described in details to avoid unnecessary limits of the invention. Some preferred embodiments of the present invention will now be described in greater detail as follows. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In one embodiment of the present invention, an iridium complex which can be used as phosphorescent dopant material of light emitting layer for organic EL device is disclosed. The iridium complex is represented by the following formula (1):

Formula (1)

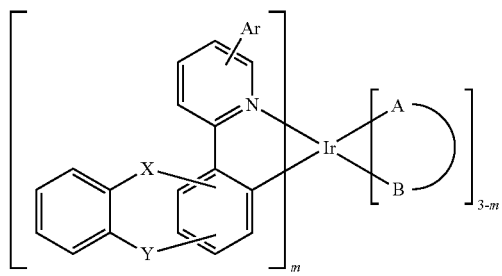

wherein A-B represents a bidentate ligand; Ar represents a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, a substituted or unsubstituted heteroaryl group having 3 to 30 carbon atoms, or a fused carbocyclic ring; m represents an integer of 1 or 2; X and Y are independently O, Se, $CR_1R_2$, $SiR_3R_4$, or $NR_5$; and $R_1$ to $R_5$ are independently a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, or a substituted or unsubstituted heteroaryl group having 3 to 30 carbon atoms.

In some embodiments, A-B represents one of the following formulas:

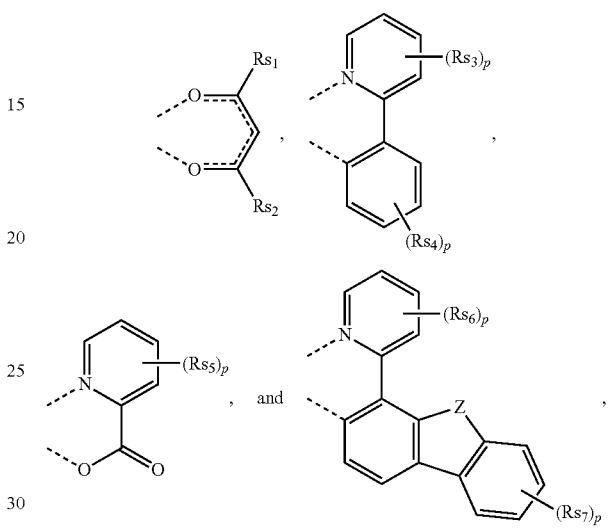

wherein Z is O, S, Se, $CR_6R_7$, $NR_8$ or $SiR_9R_{10}$, $R_6$ to $R_{10}$ are independently a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, or a substituted or unsubstituted heteroaryl group having 3 to 30 carbon atoms, $R_{s1}$ to $R_{s7}$ are independently a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, or a substituted or unsubstituted heteroaryl group having 3 to 30 carbon atoms, and p is an integer of 0 to 4.

In certain embodiments, $R_{s1}$ to $R_{s7}$ are independently a hydrogen atom, a methyl group, an isopropyl group, an isobutyl group, a cyclopentyl group, a cyclohexyl group, or a phenyl group.

Preferably, the iridium complex is one of the following compounds:

EX1

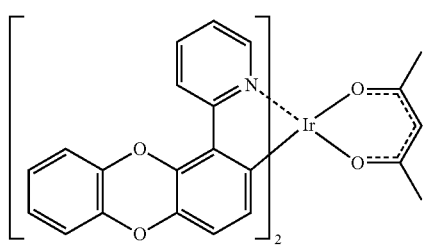

EX2
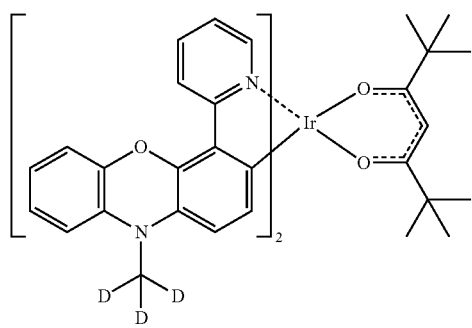
EX3
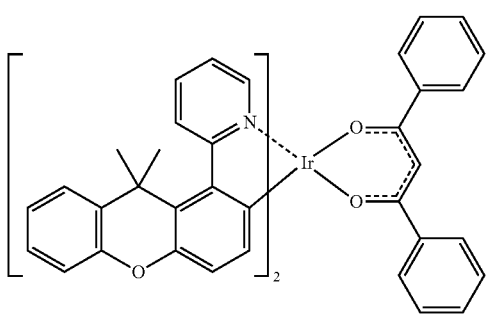
EX4
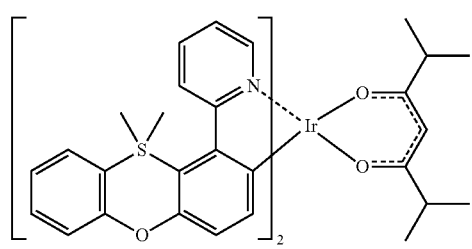
EX5
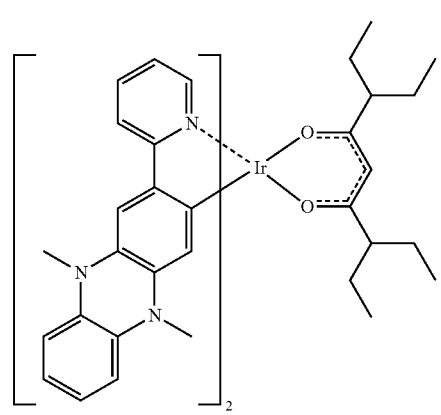
EX6
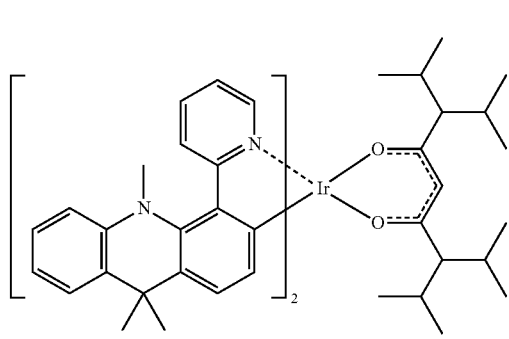
EX7
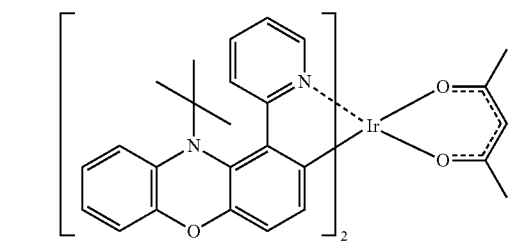
EX8
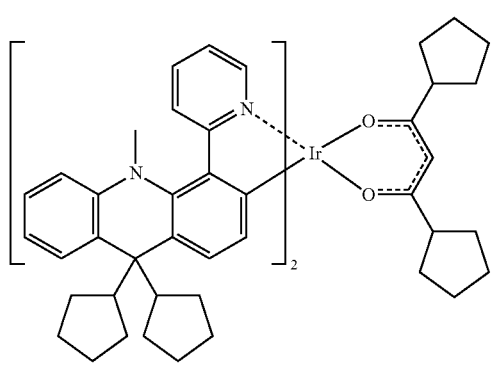
EX9
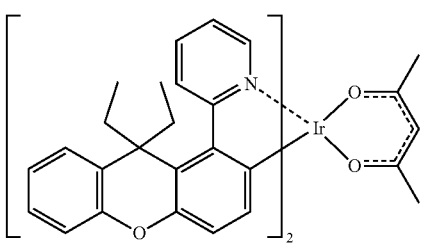
EX10
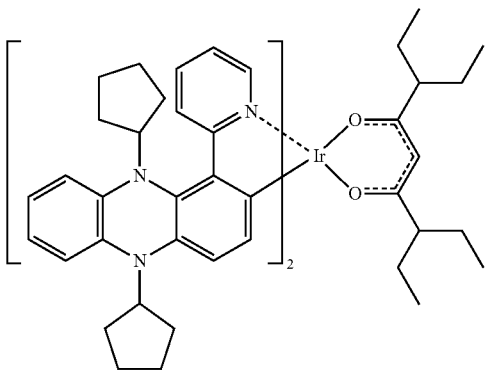
EX11
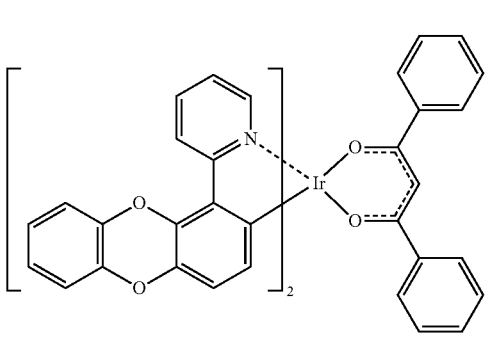

EX12
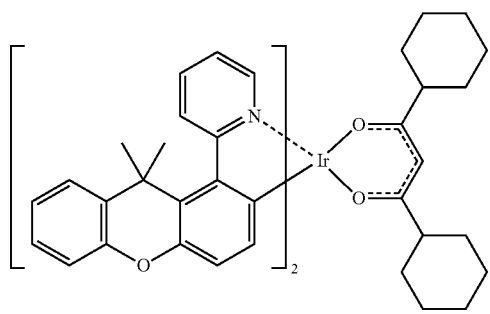
EX13
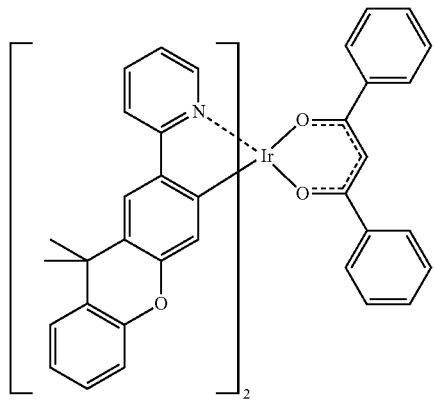
EX14
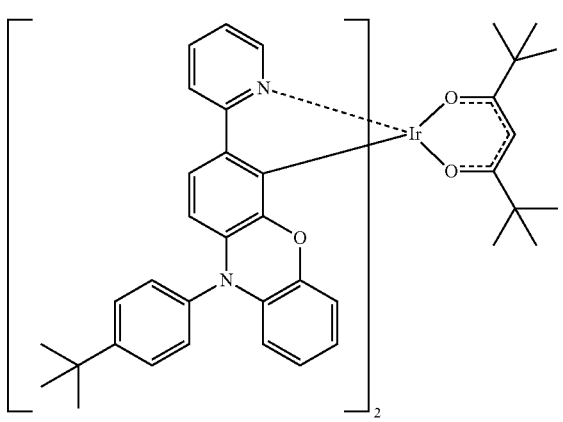
EX15
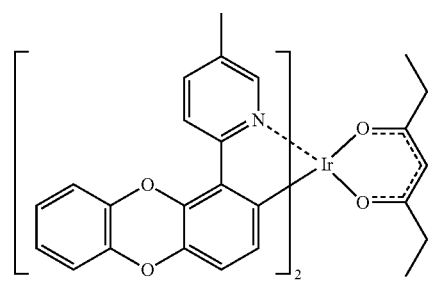
EX16
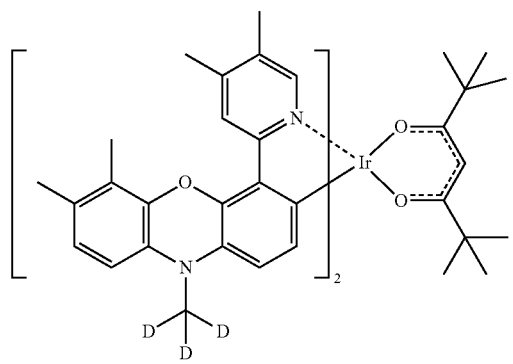
EX17
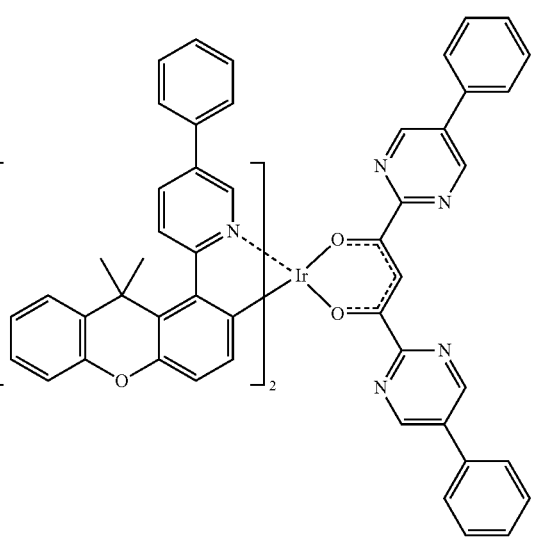
EX18
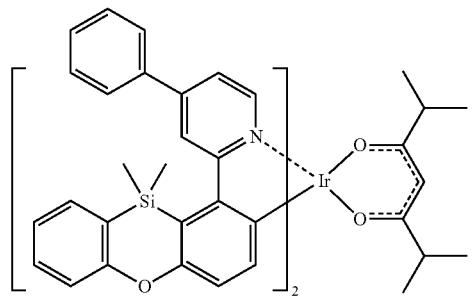

-continued
EX19
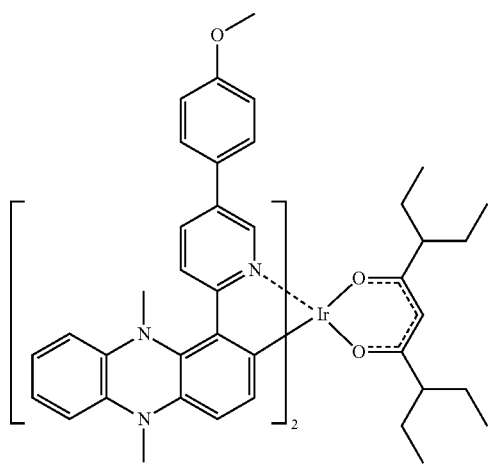
EX20
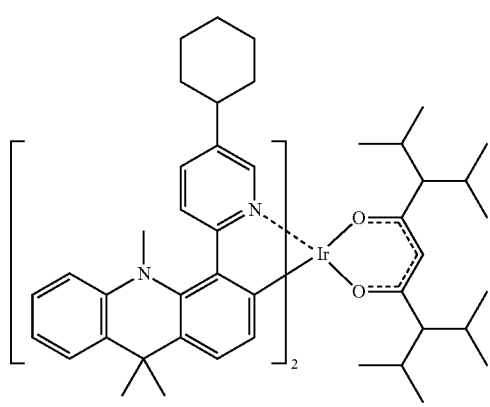
EX21
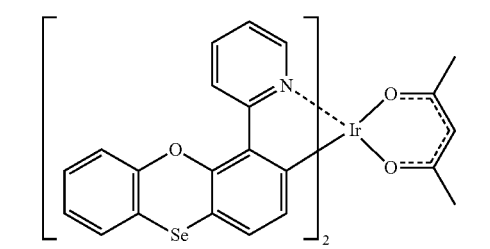
EX22
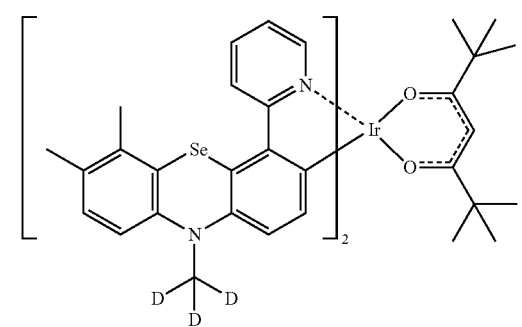
-continued
EX23
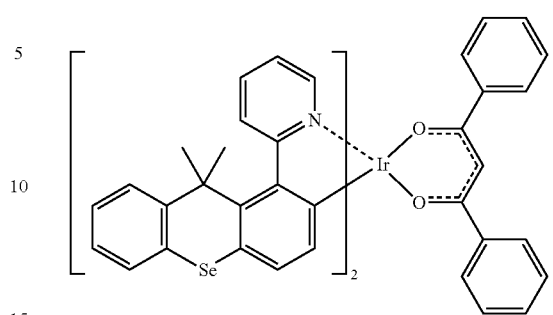
EX24
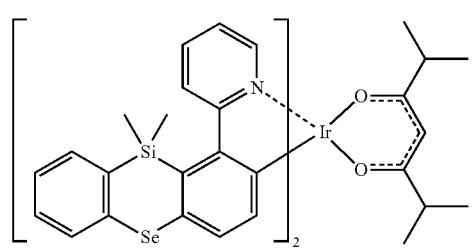
EX25
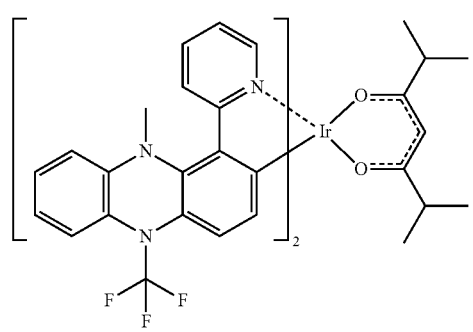
EX26
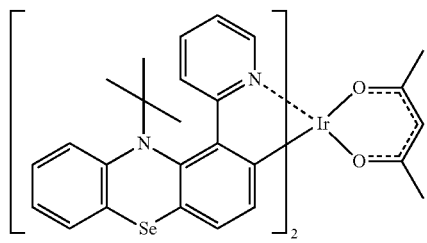
EX27
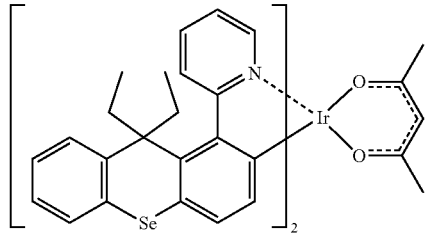

EX28
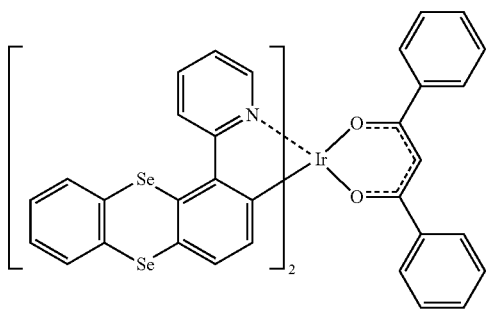
EX29
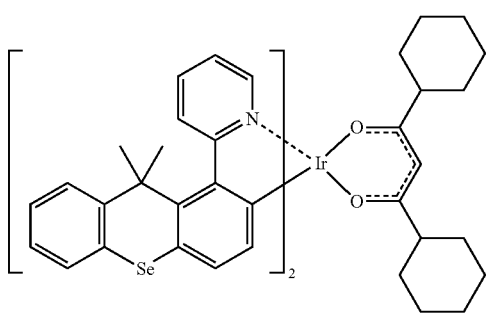
EX30
EX31
EX32
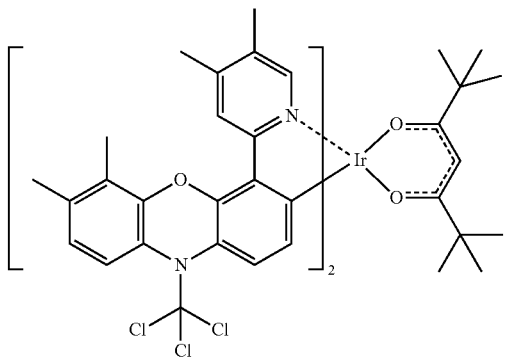
EX33
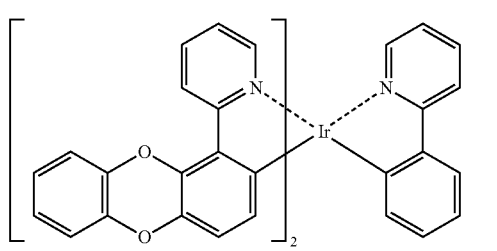
EX34
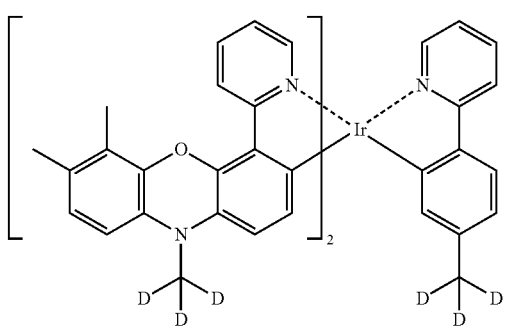
EX35
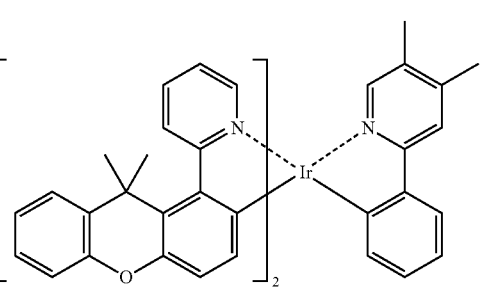
EX36
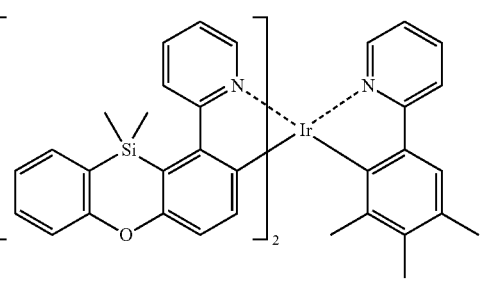

EX37
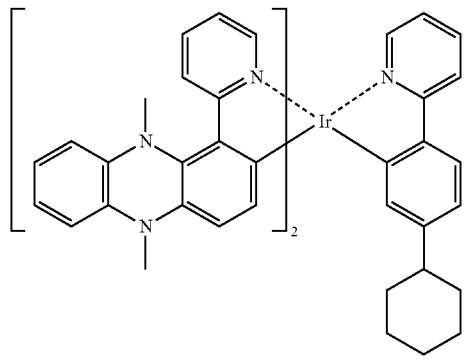
EX38
EX39
EX40
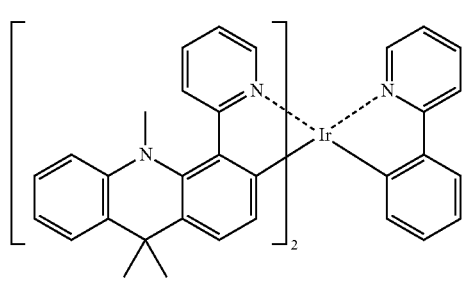
EX41
EX42
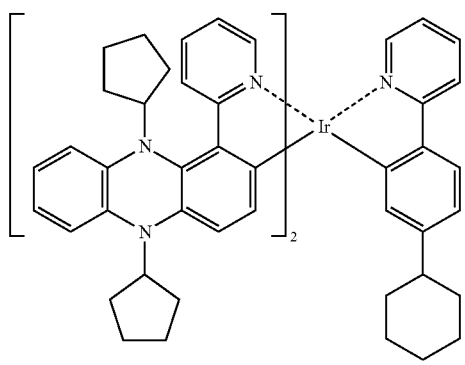
EX43
EX44
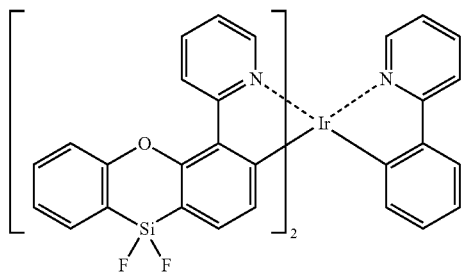
EX45
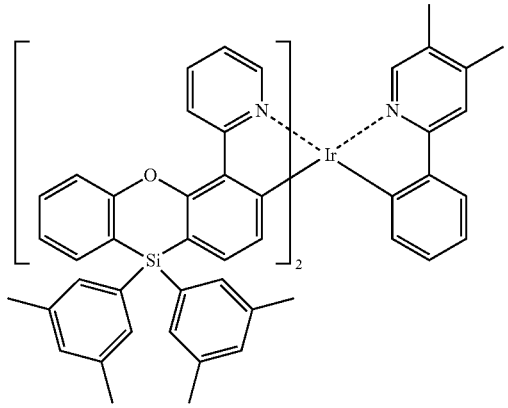

-continued
EX46
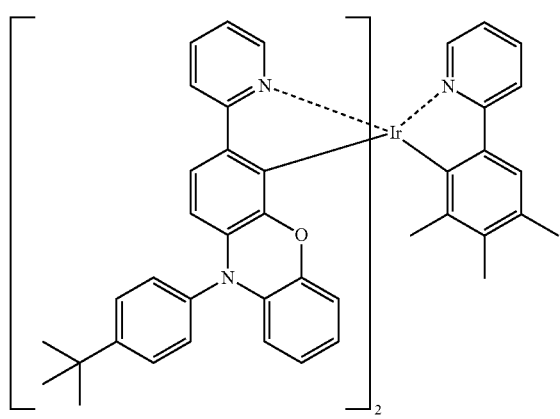
EX47
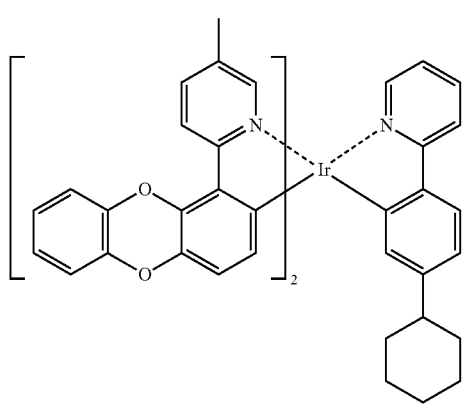
EX48
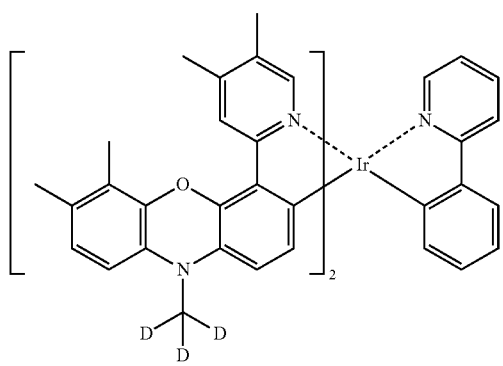
EX49
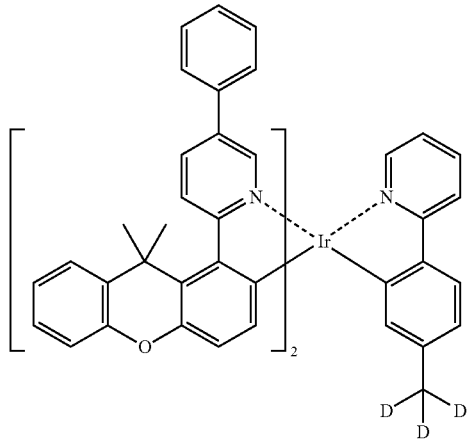
-continued
EX50
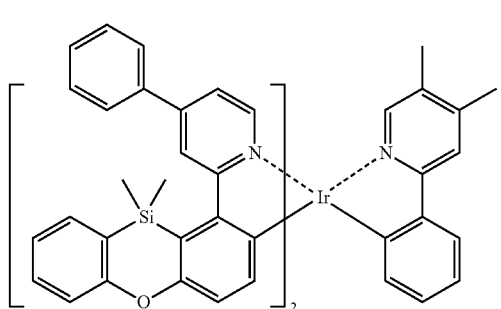
EX51
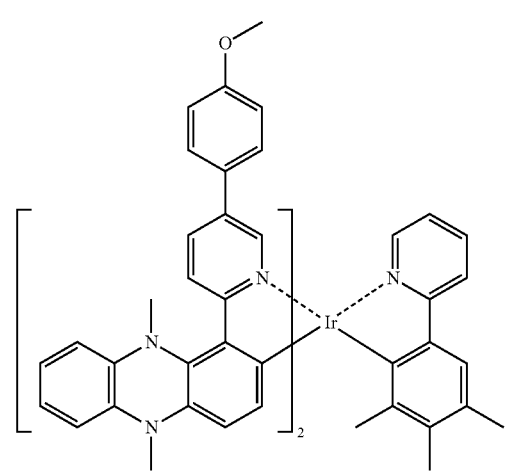
EX52
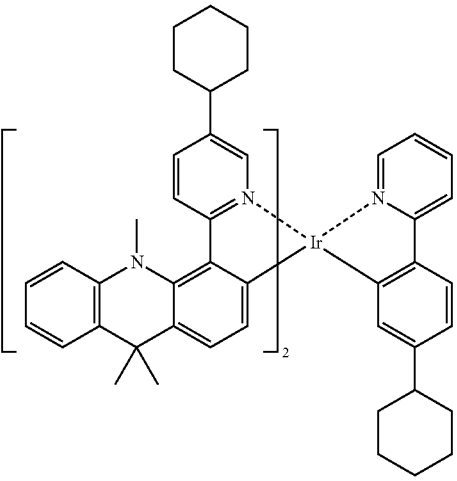
EX53
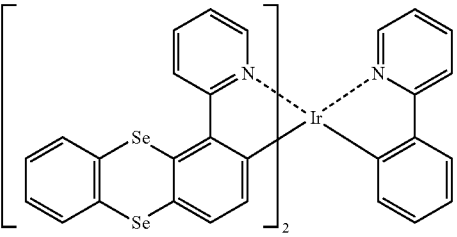

EX54
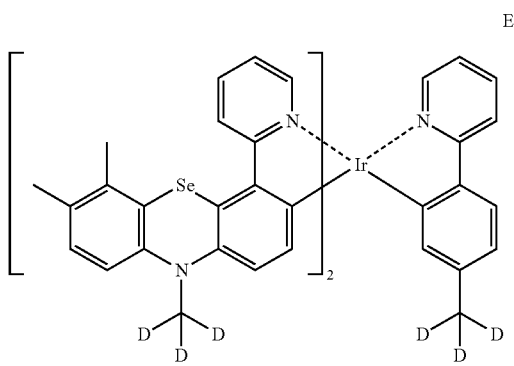
EX55
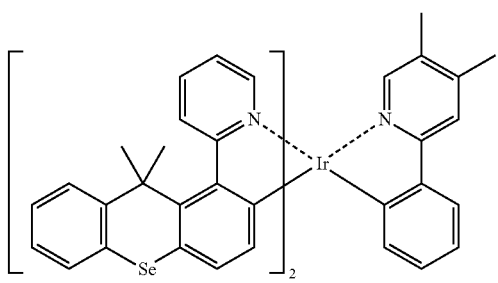
EX56
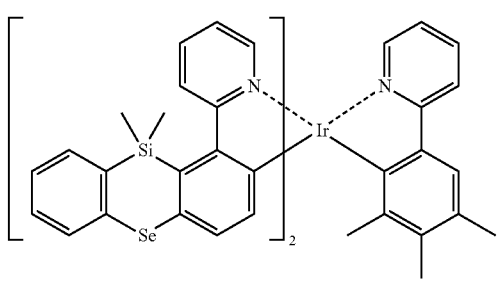
EX57
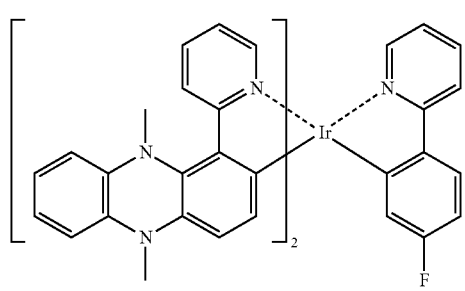
EX58
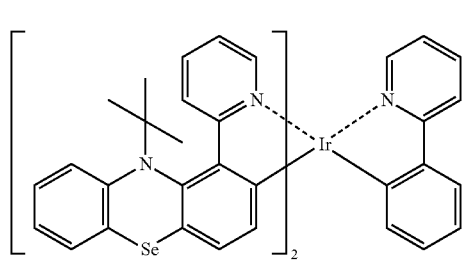
EX59
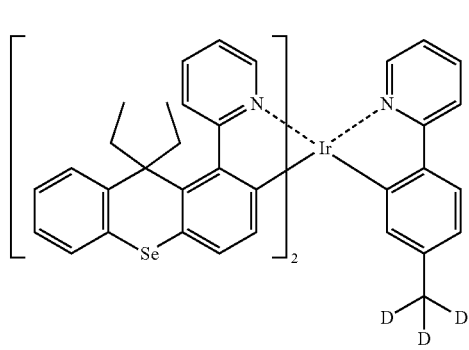
EX60
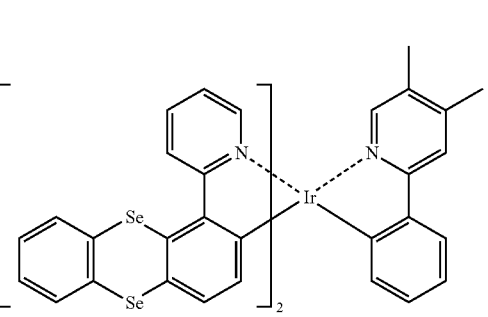
EX61
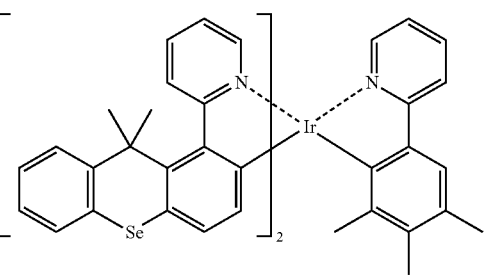
EX62
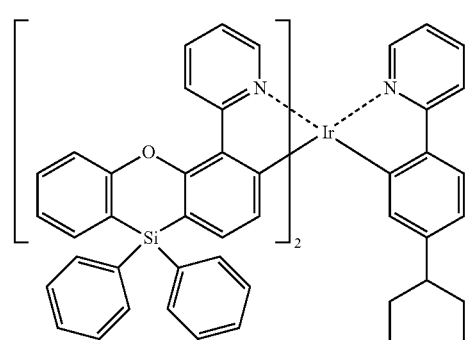

EX63
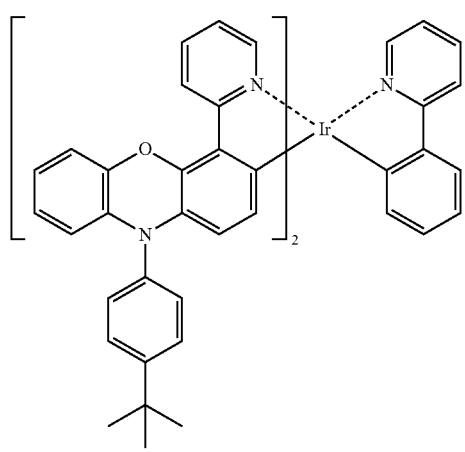
EX64
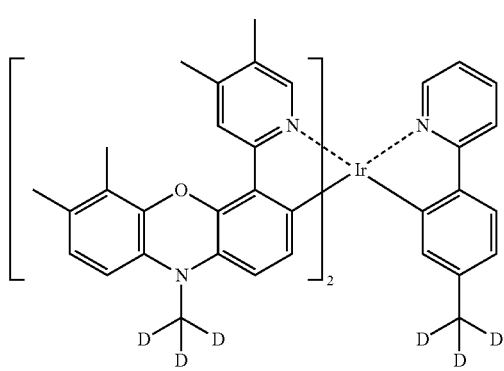
EX65
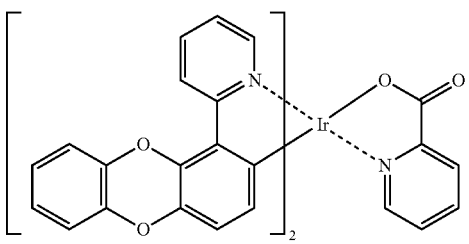
EX66
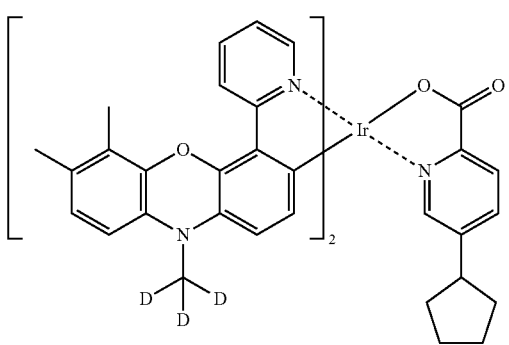
EX67
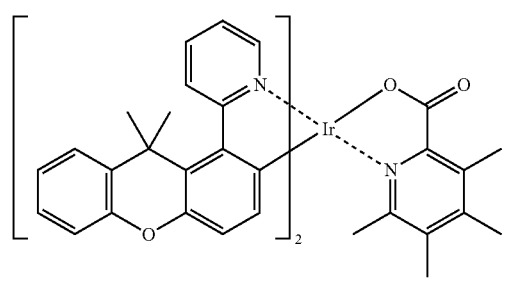
EX68
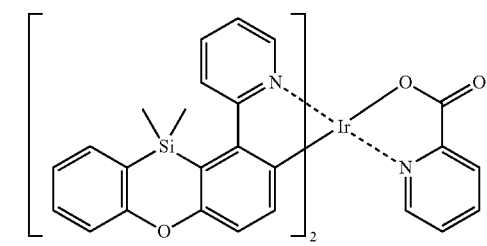
EX69
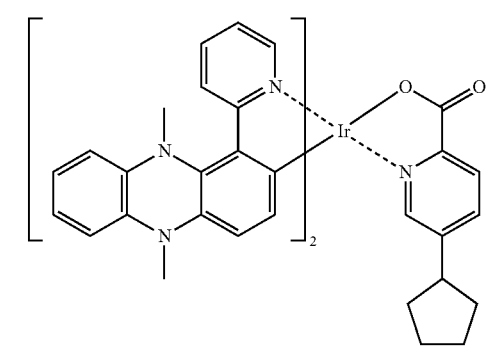
EX70
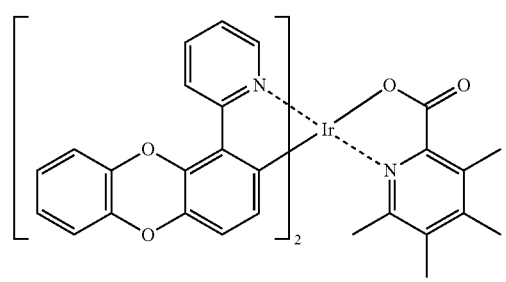
EX71
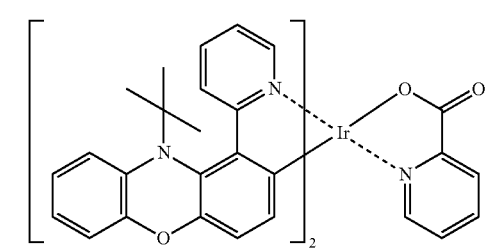

EX72
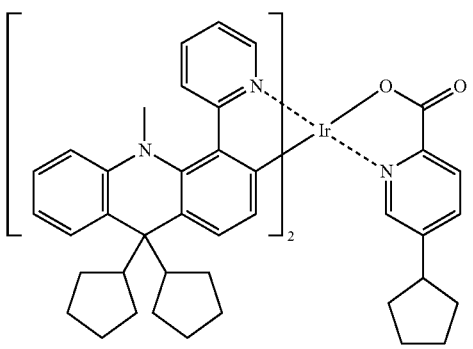
EX73
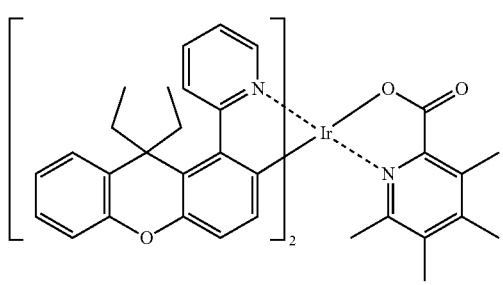
EX74
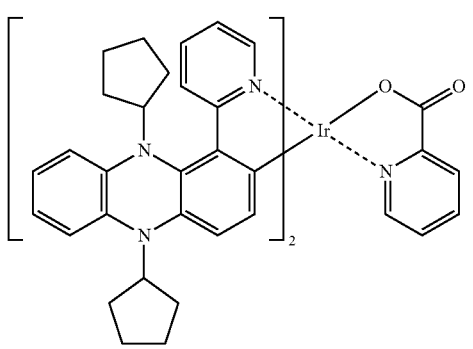
EX75
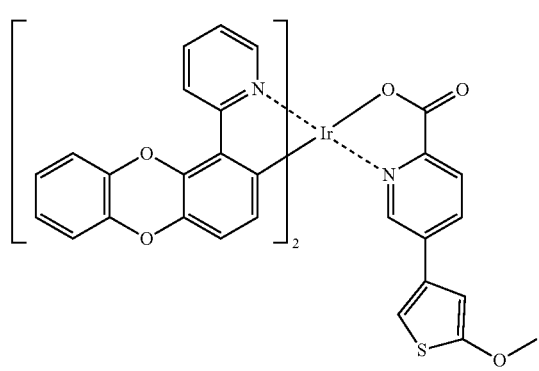
EX76
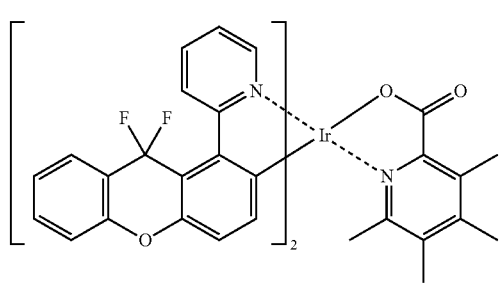
EX77
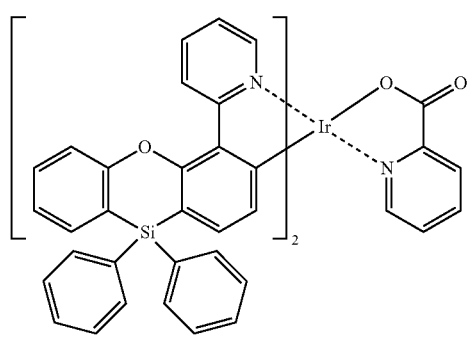
EX78
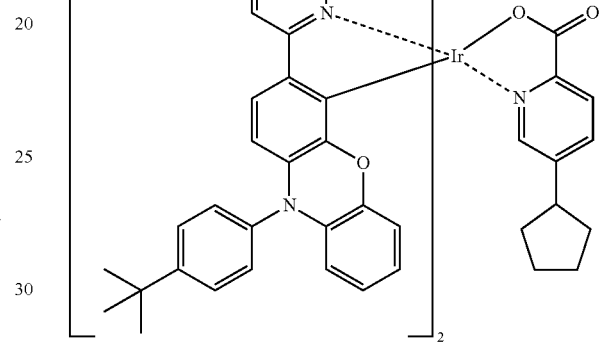
EX79
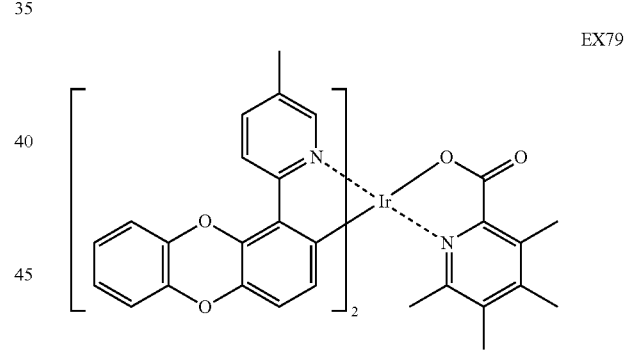
EX80
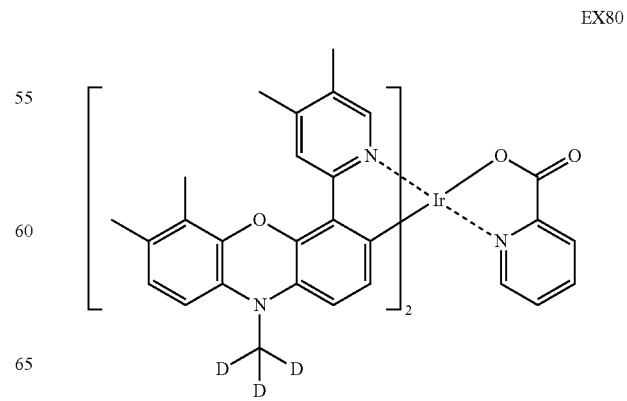

EX81
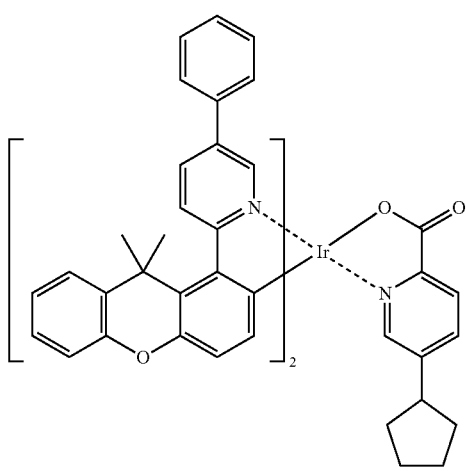
EX82
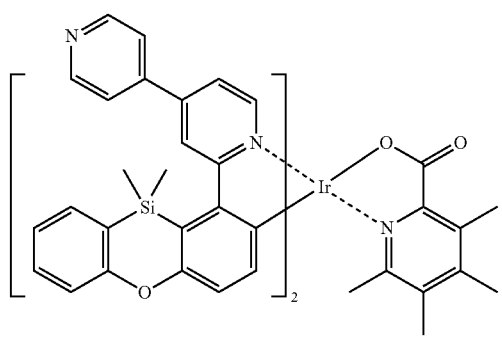
EX83
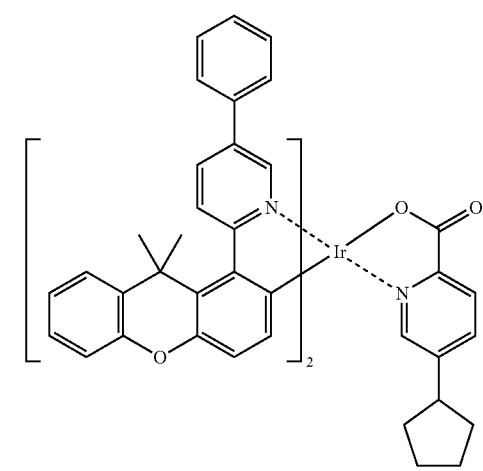
EX84
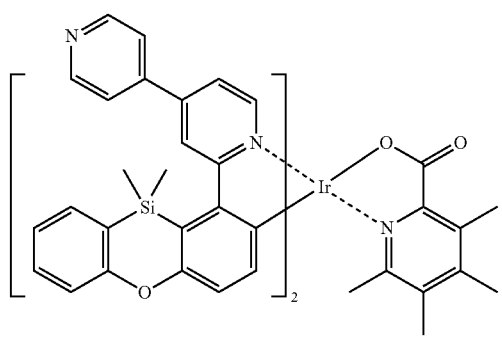
EX85
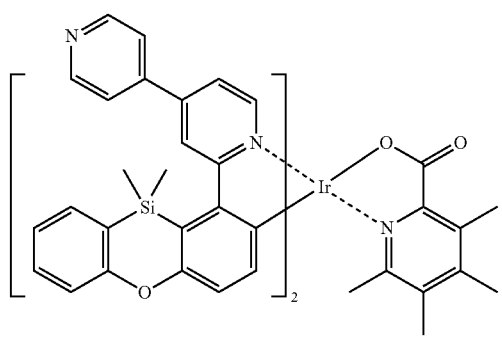
EX86
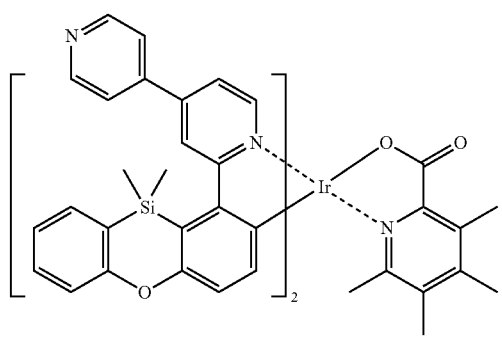
EX87
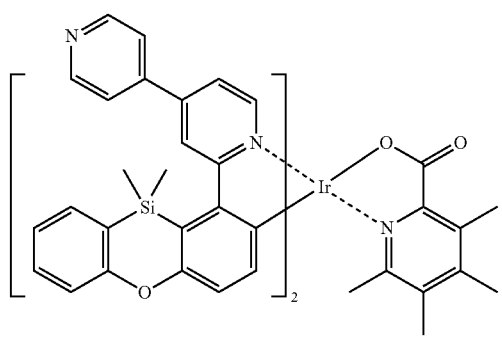
EX88
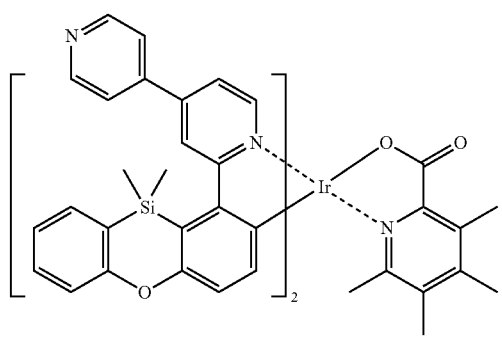

EX89
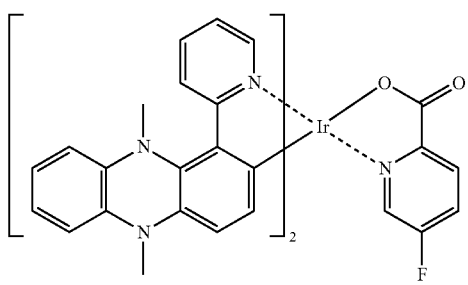
EX90
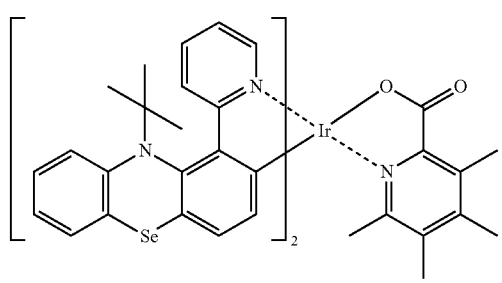
EX91
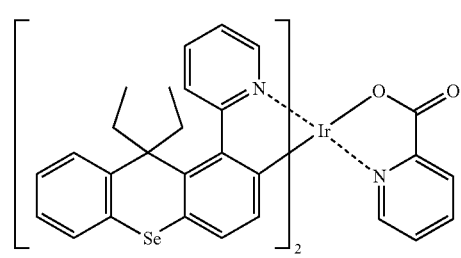
EX92
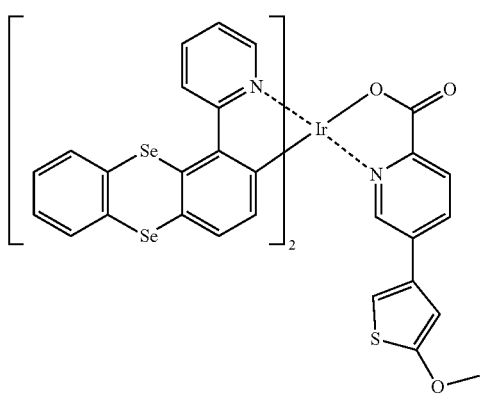
EX93
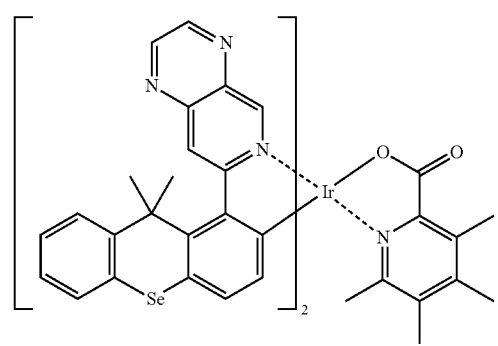
EX94
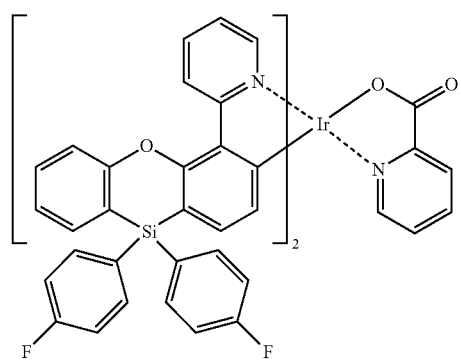
EX95
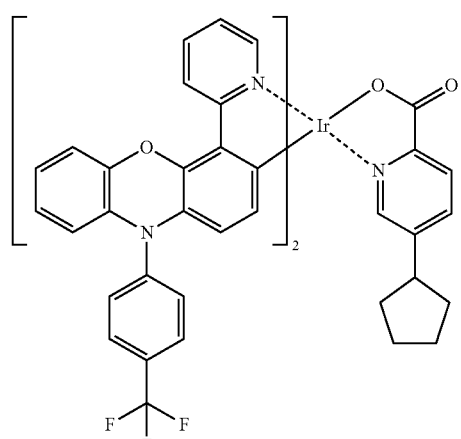
EX96
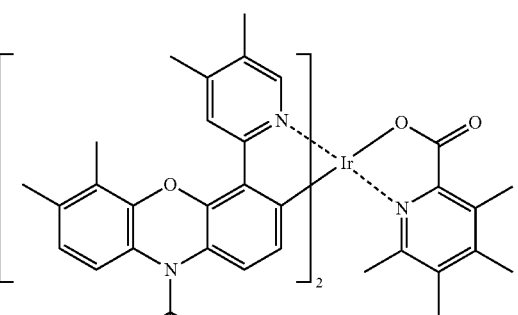
EX97
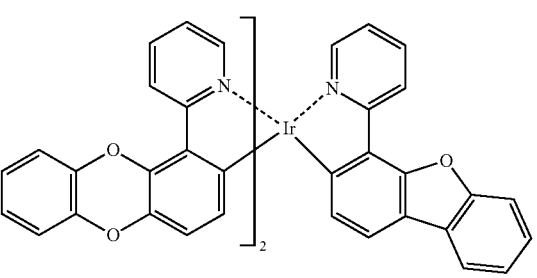

EX98
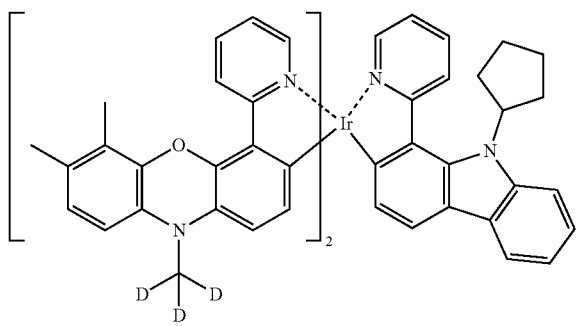
EX103
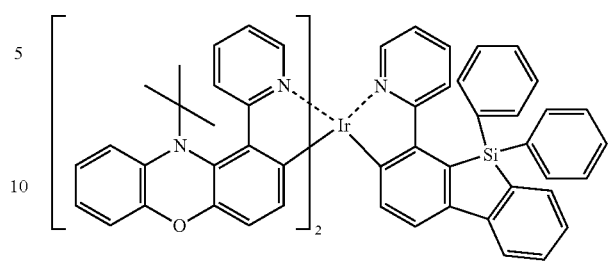
EX99
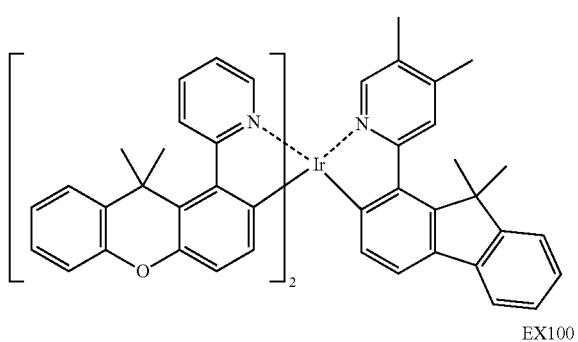
EX104
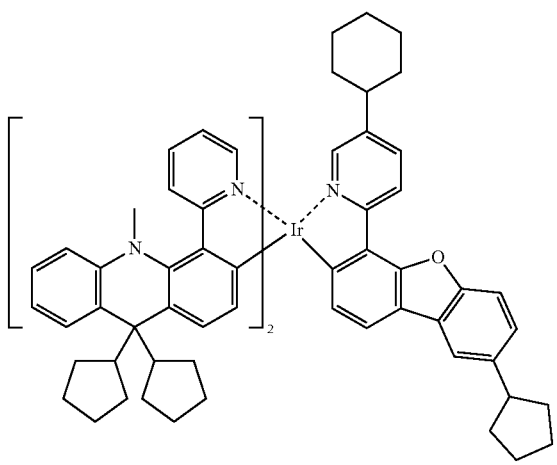
EX100
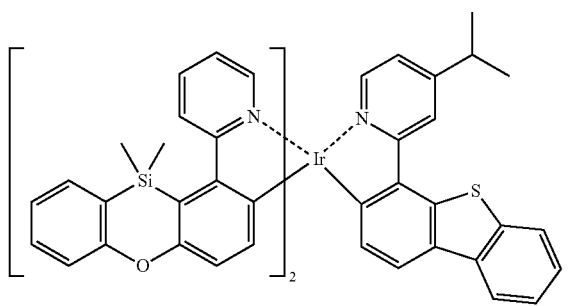
EX101
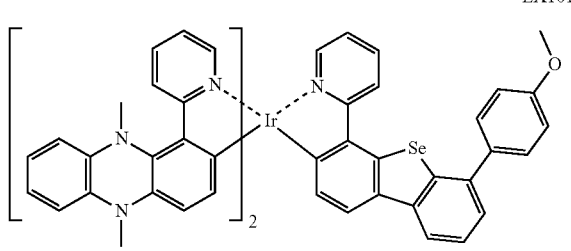
EX105
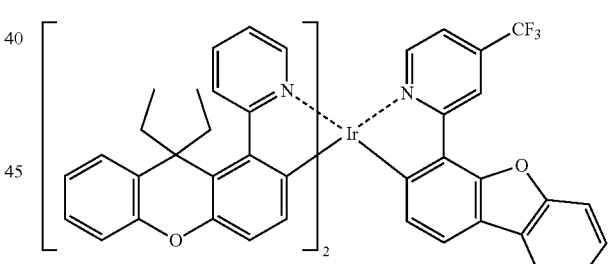
EX102
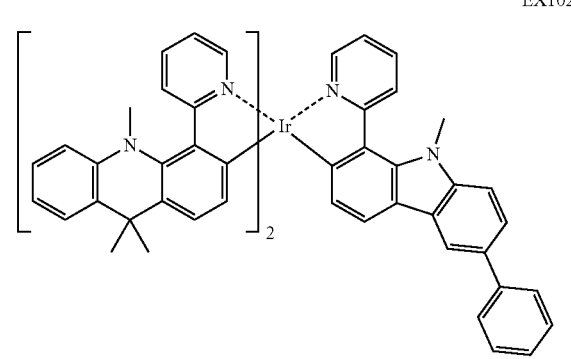
EX106
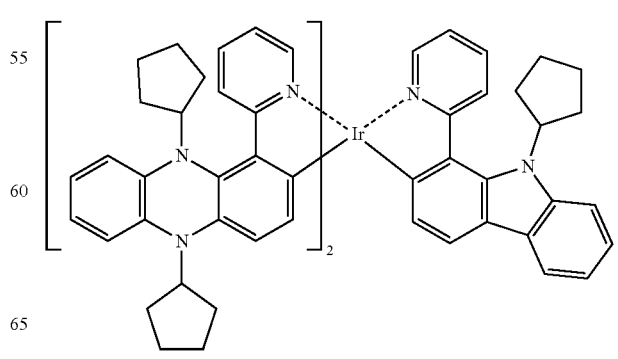

EX107
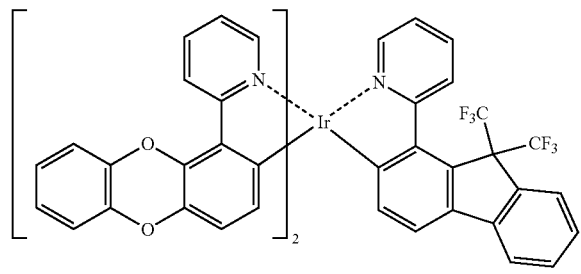
EX108
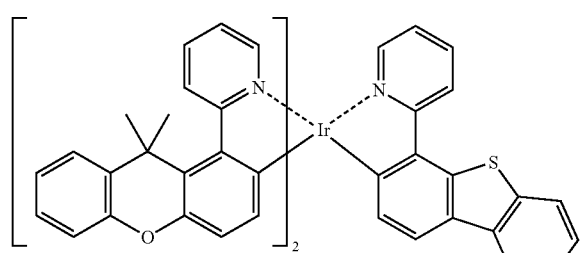
EX109
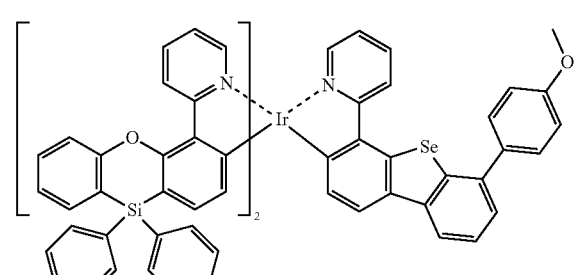
EX110
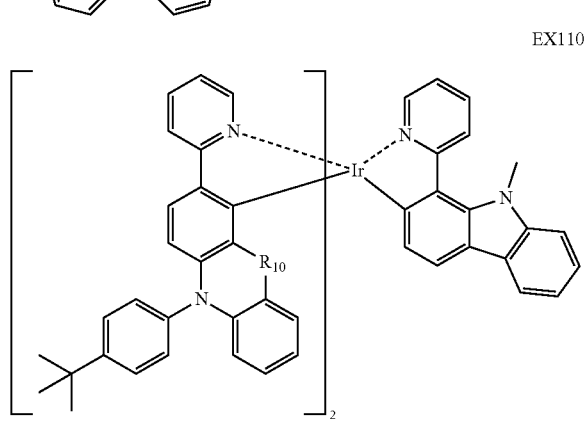
EX111
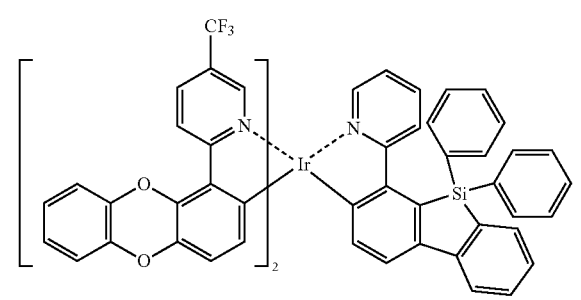
EX112
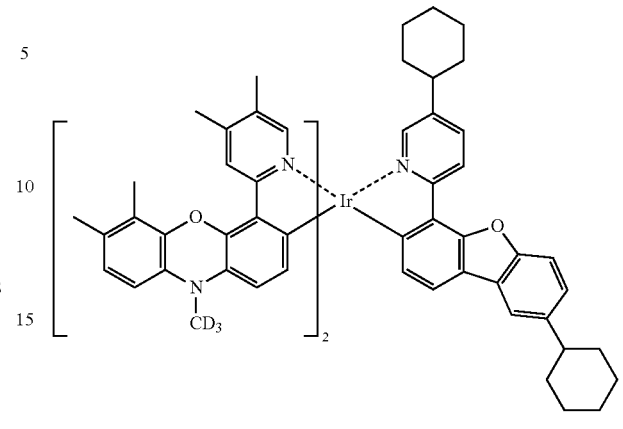
EX113
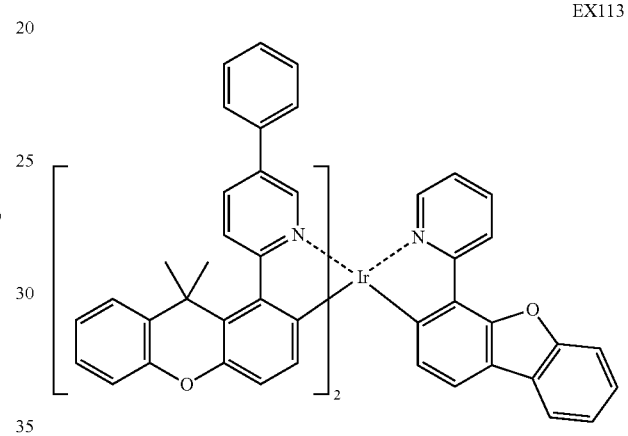
EX114
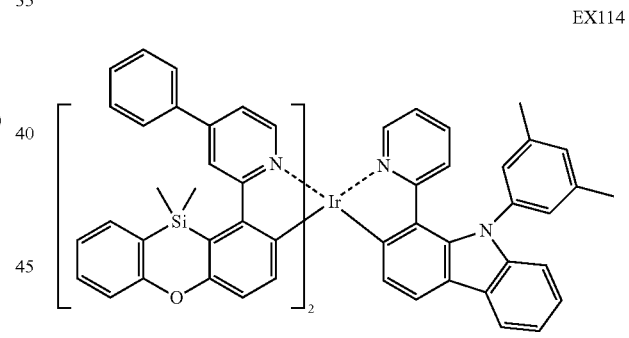
EX115
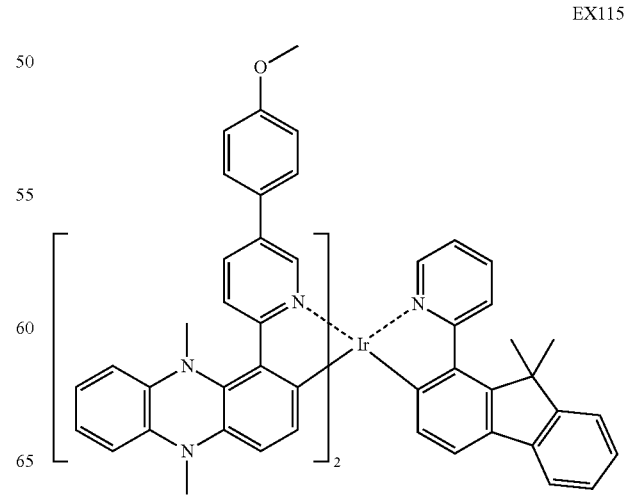

EX116
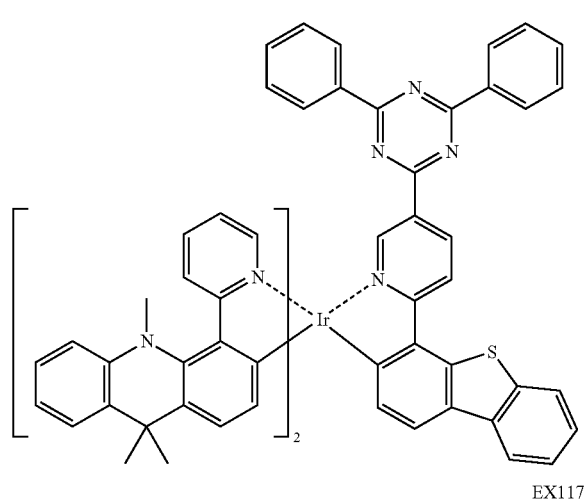
EX117
EX118
EX119
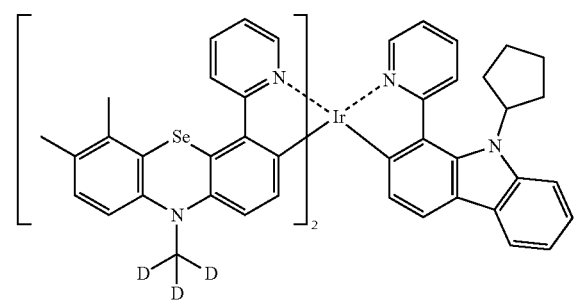
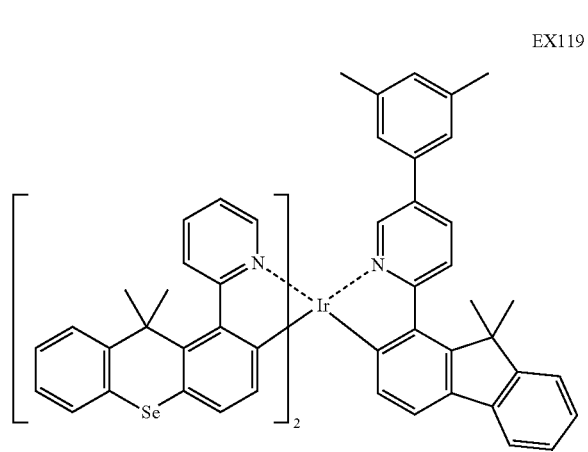
EX120
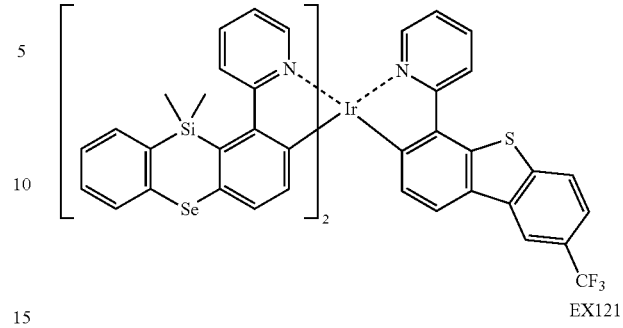
EX121
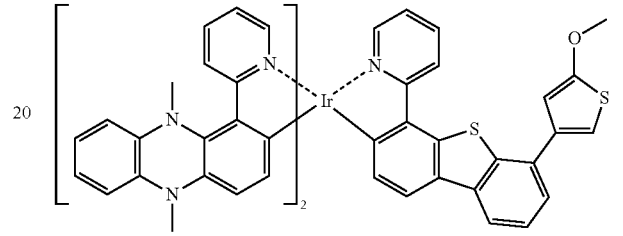
EX122
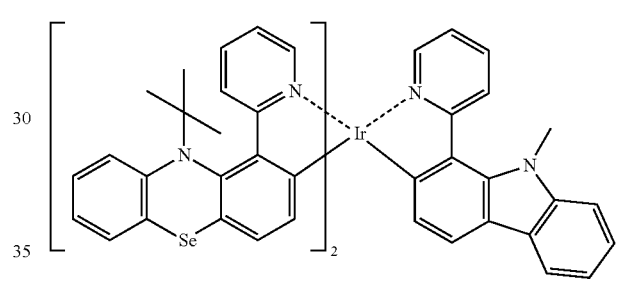
EX123
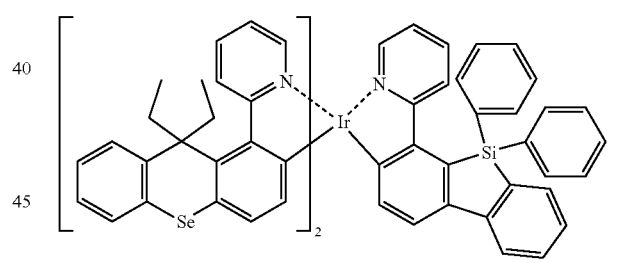
EX124
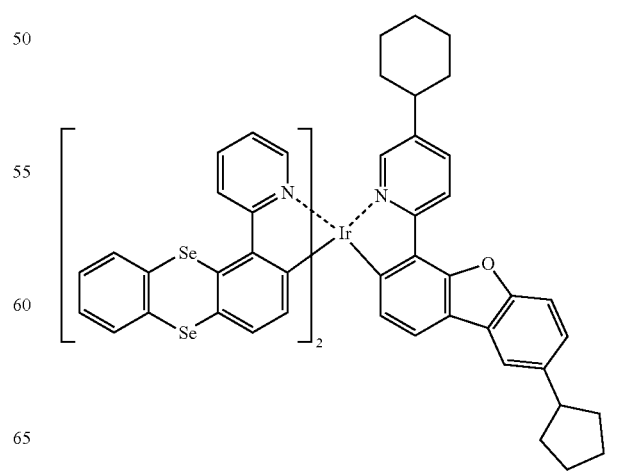

EX125
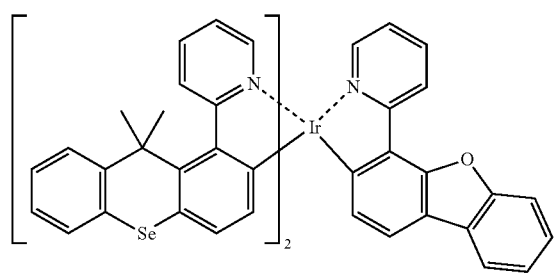
EX126
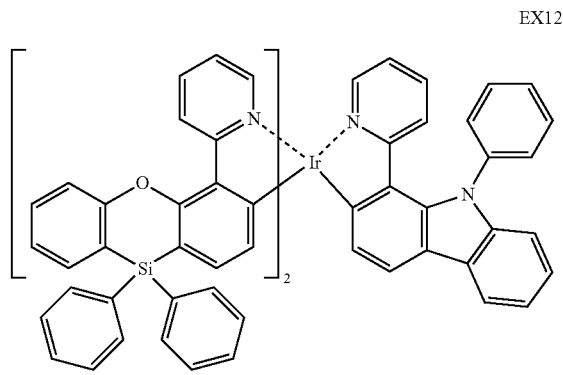
EX127
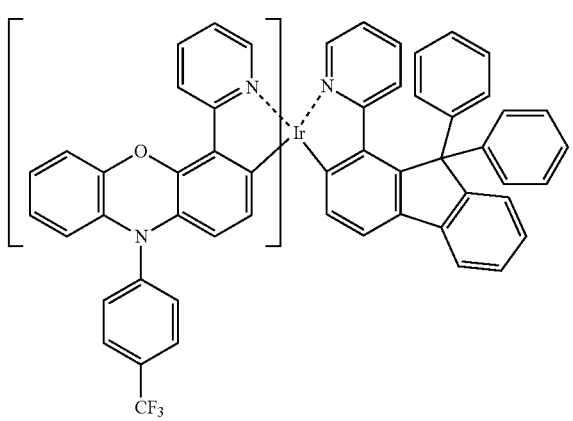
EX128
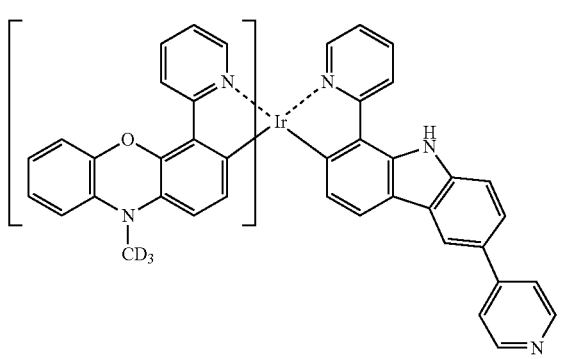
EX129
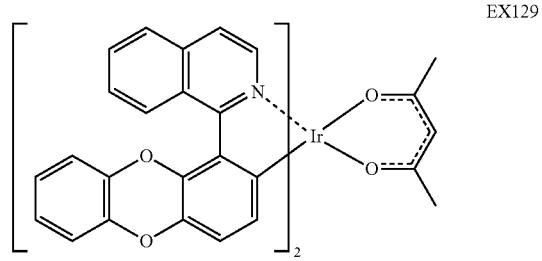
EX130
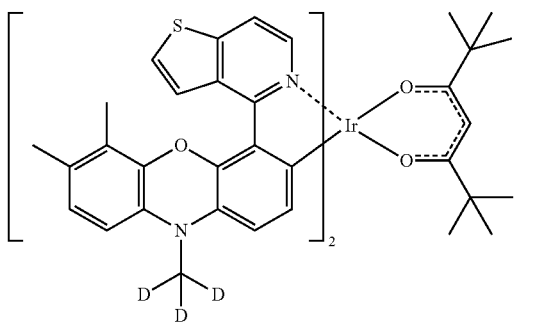
EX131
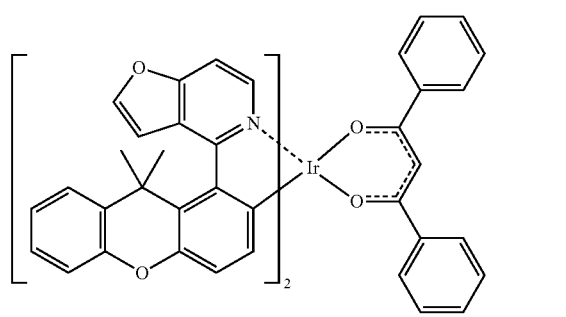
EX132
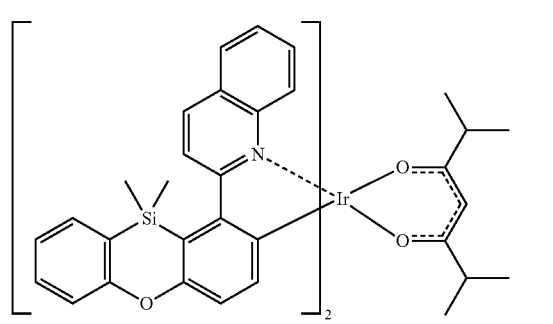
EX133
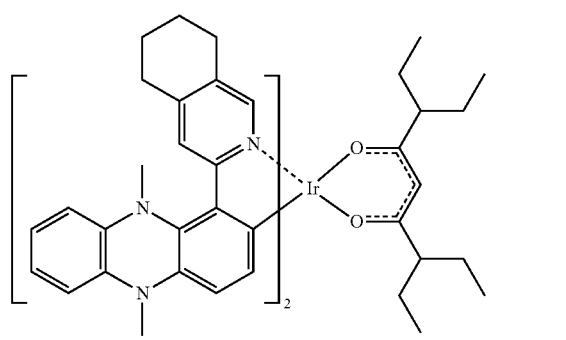

EX134
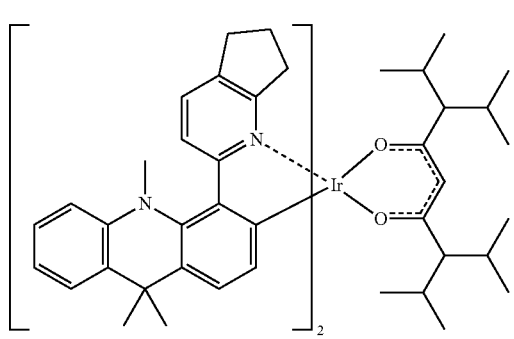
EX135
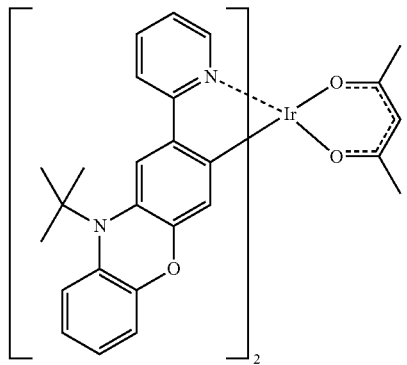
EX136
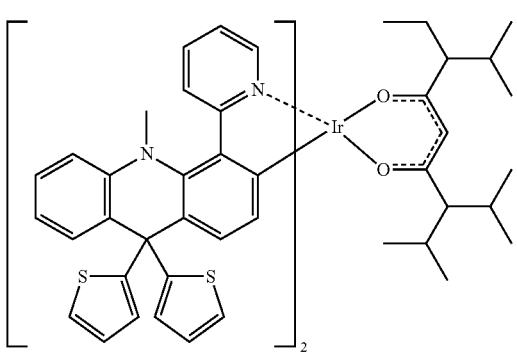
EX137
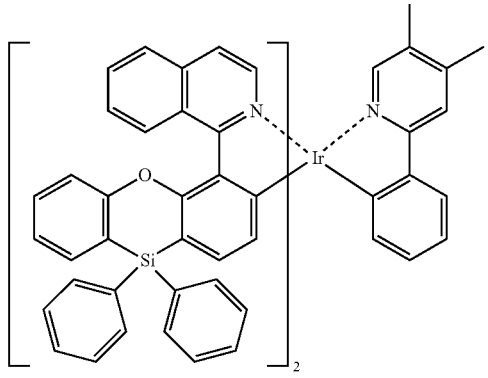
EX138
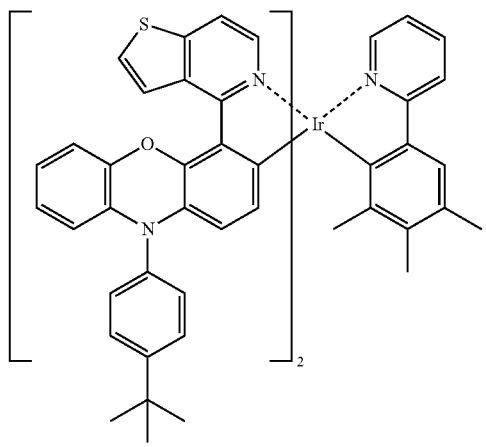
EX139
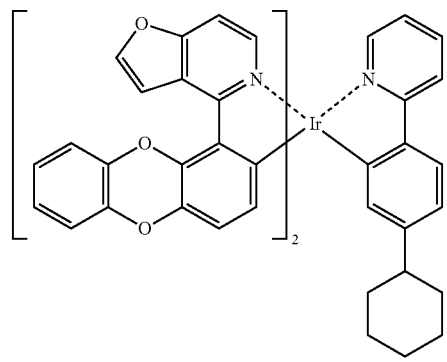
EX140
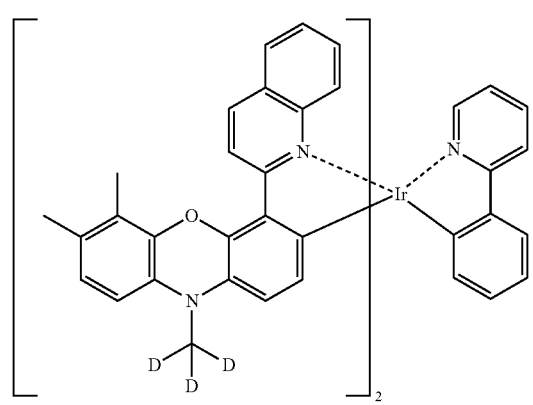
EX141
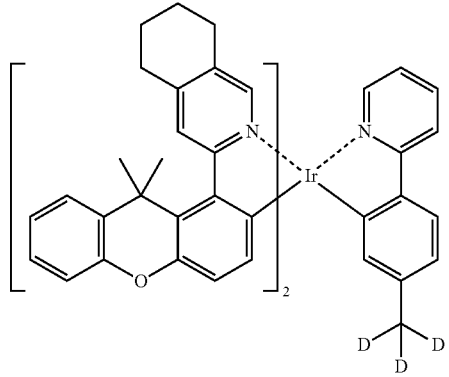

EX142
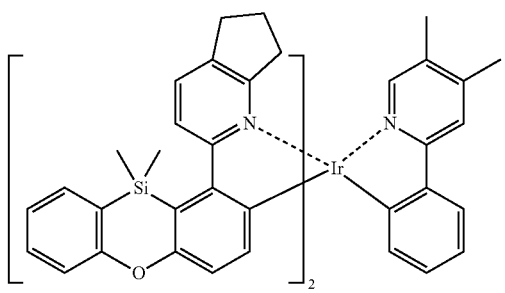
EX143
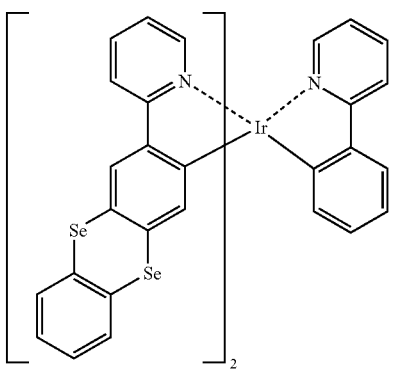
EX144
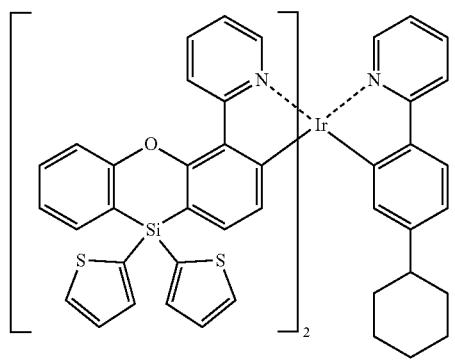
EX145
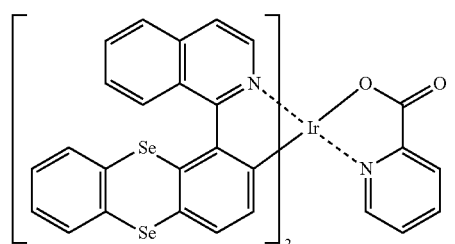
EX146
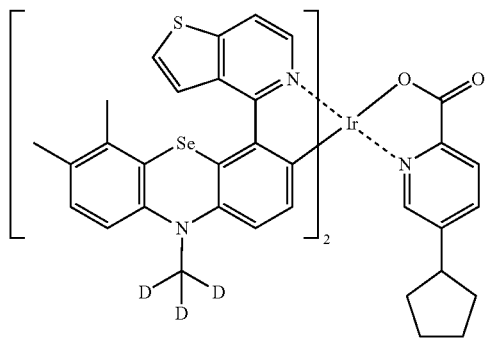
EX147
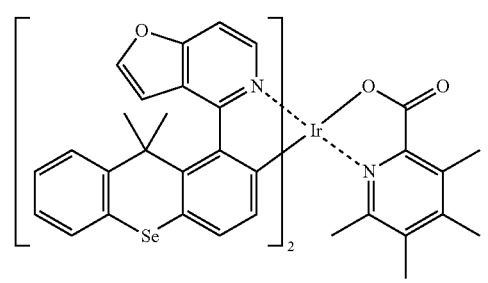
EX148
EX149
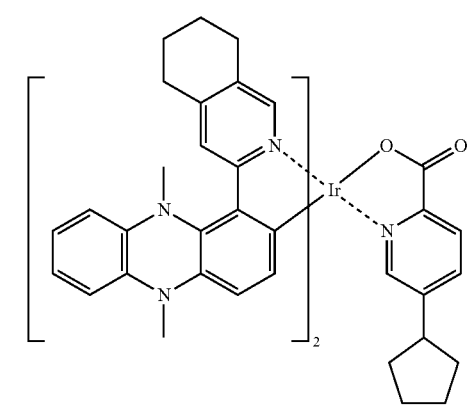

EX150
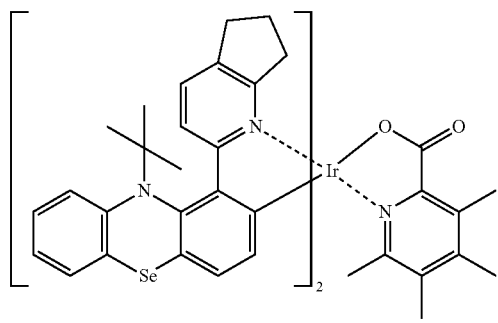
EX151
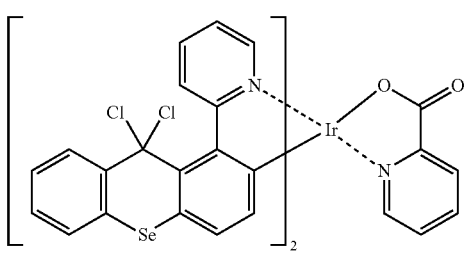
EX152
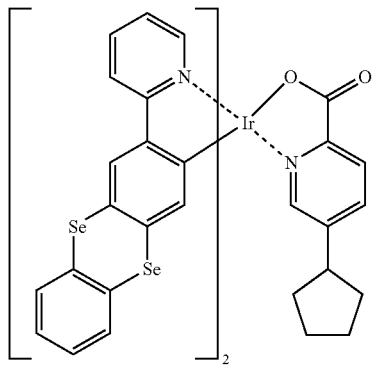
EX153
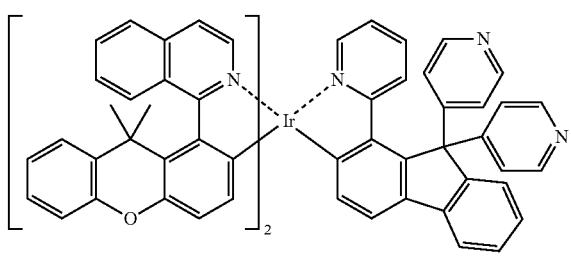
EX154
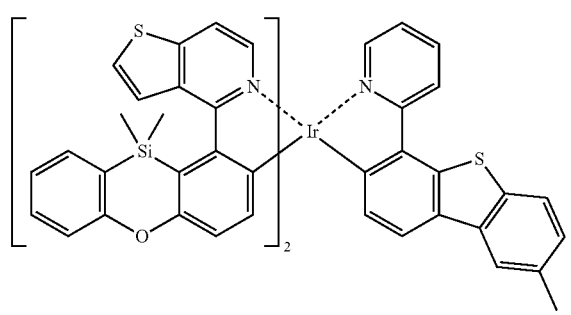
EX155
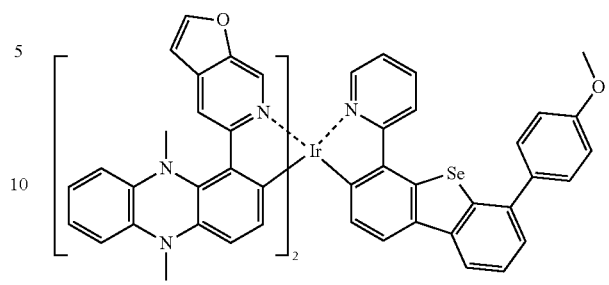
EX156
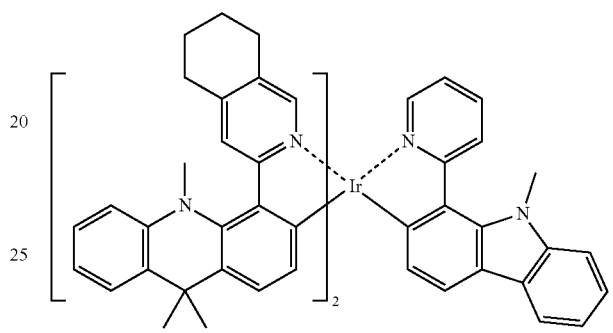
EX157
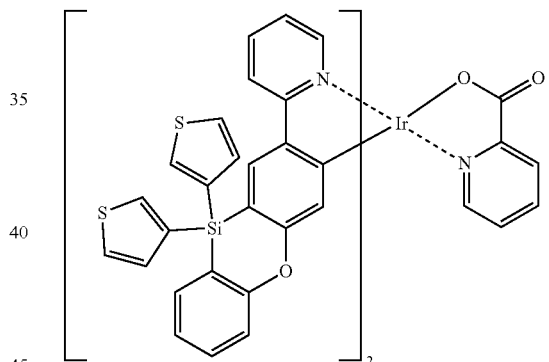
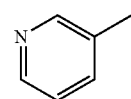
EX158
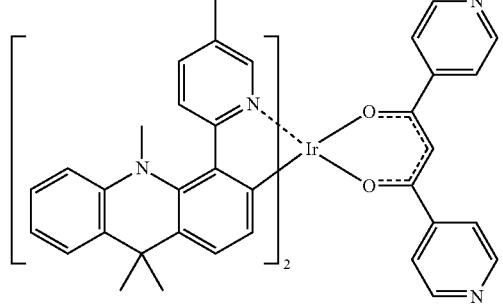

EX159
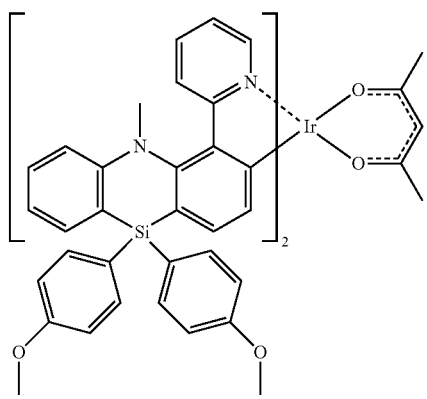
EX163
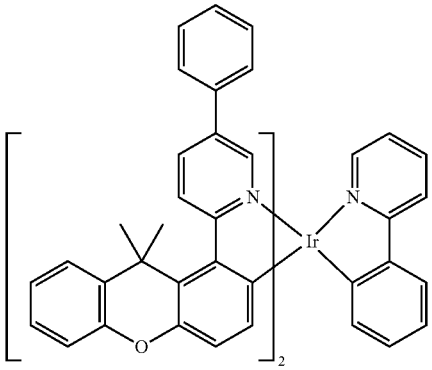
EX160
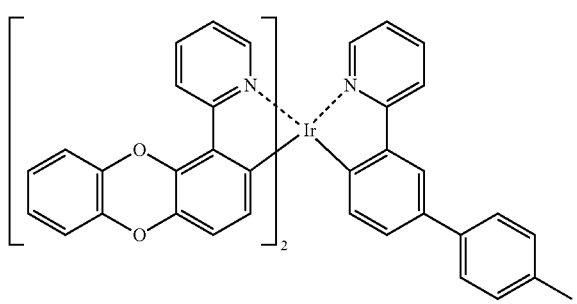
EX164
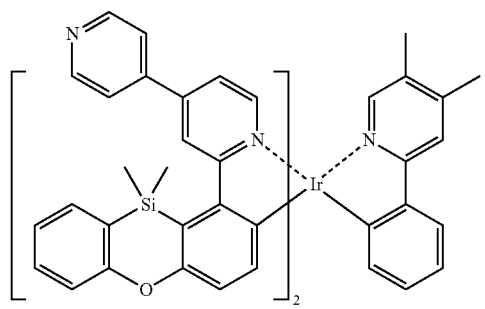
EX161
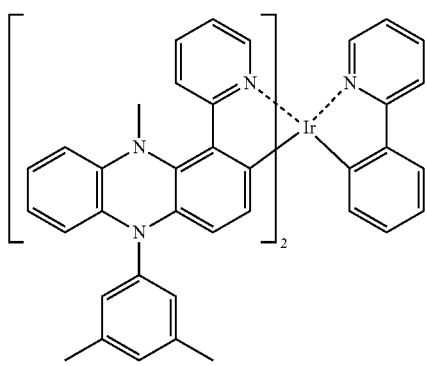
EX165
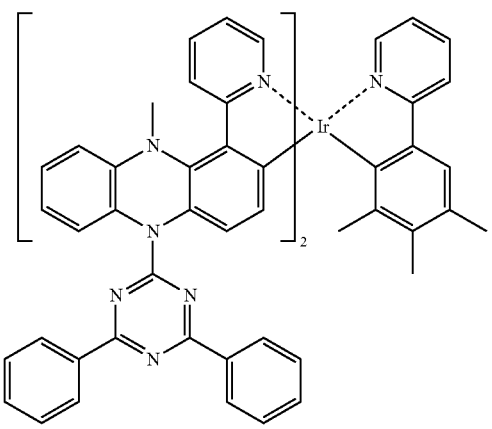
EX162
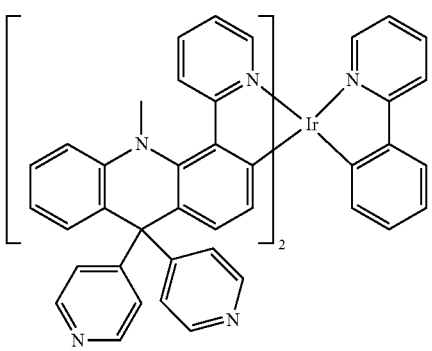
EX166
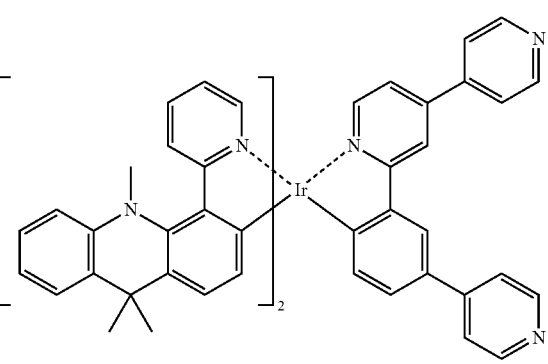

EX167
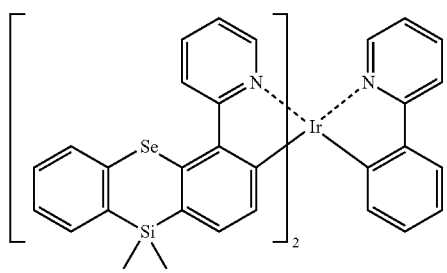
EX171
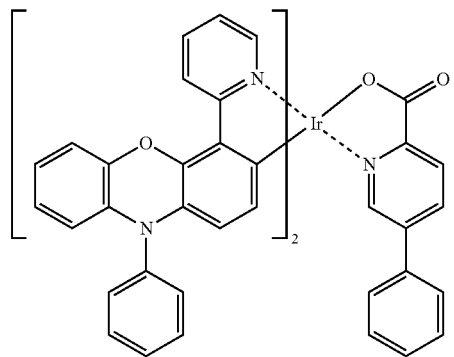
EX168
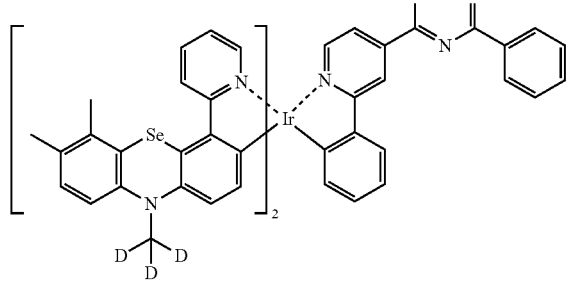
EX172
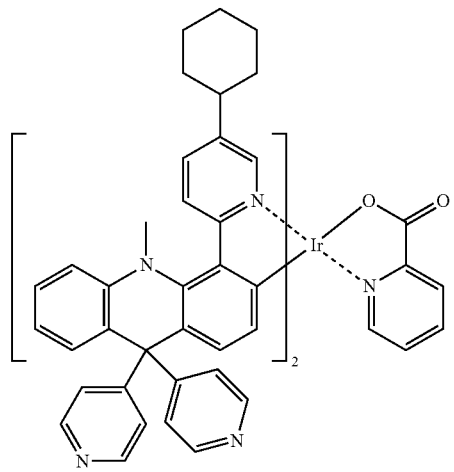
EX169
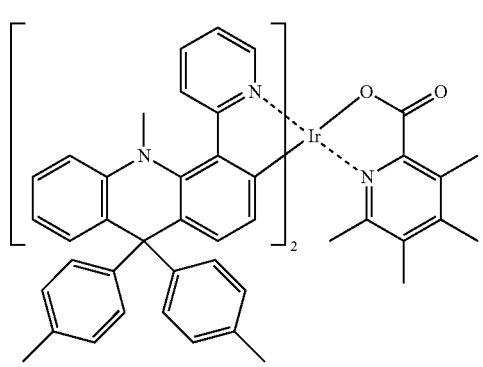
EX173
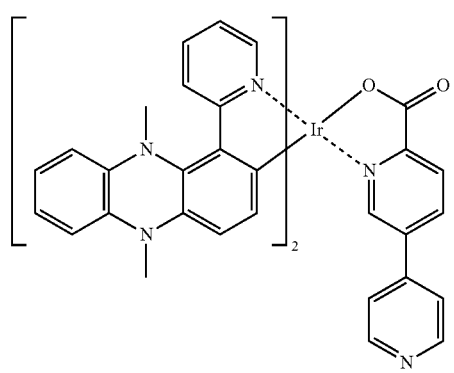
EX170
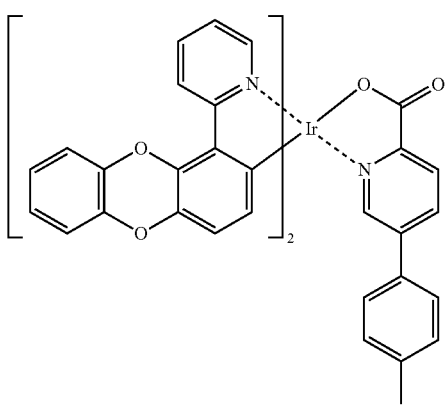
EX174
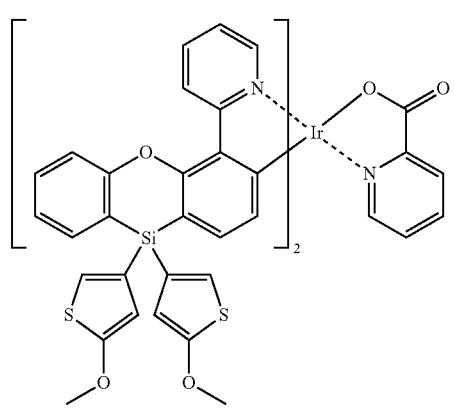

EX175
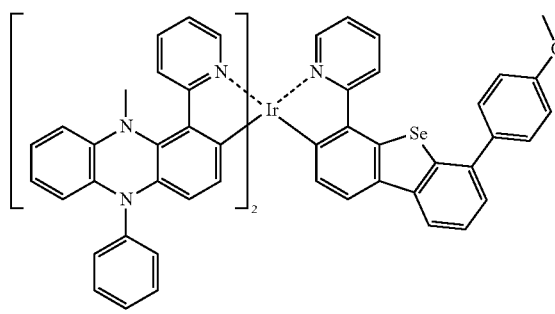
EX176
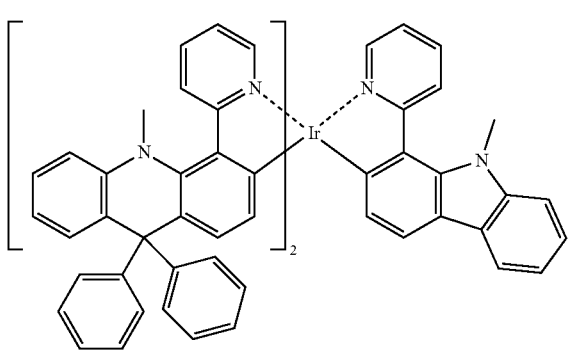
EX177
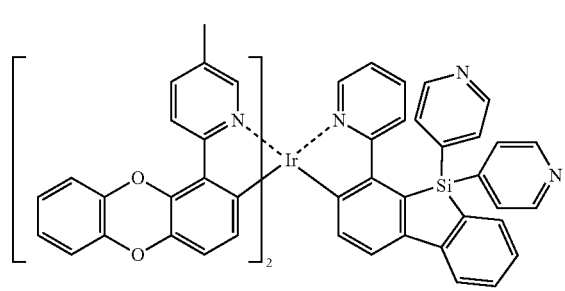
EX178
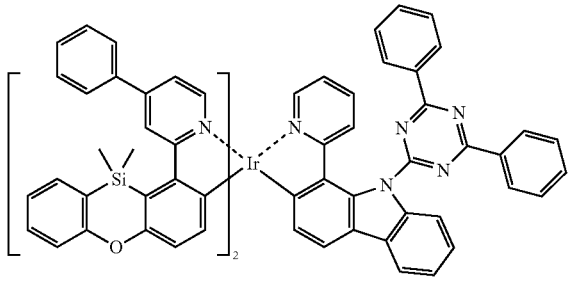
EX179
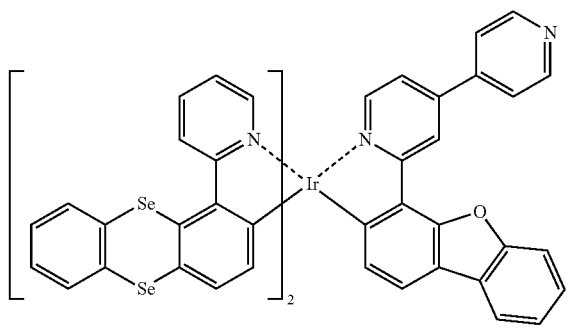
EX180
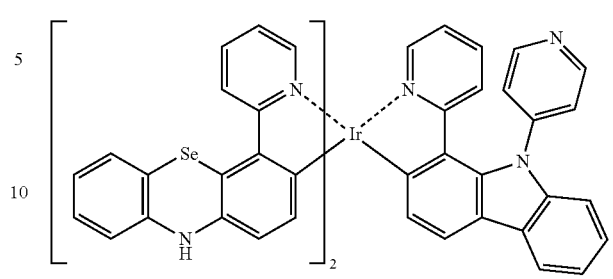
EX181
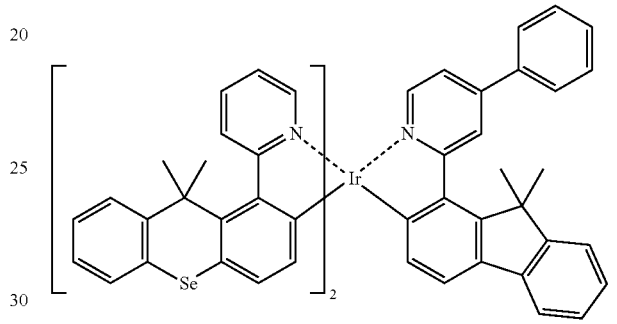
EX182
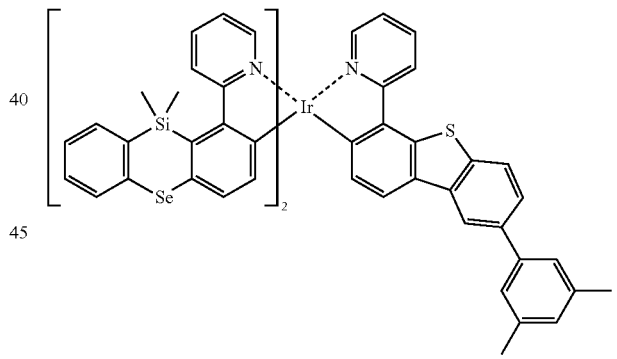
EX183
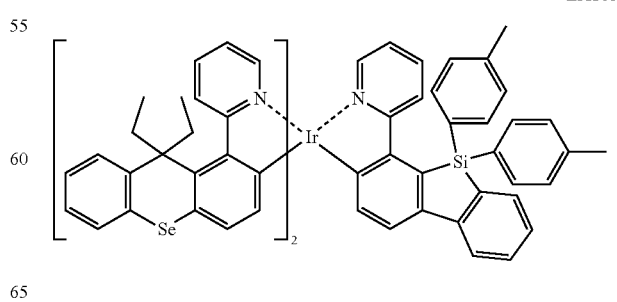

EX184
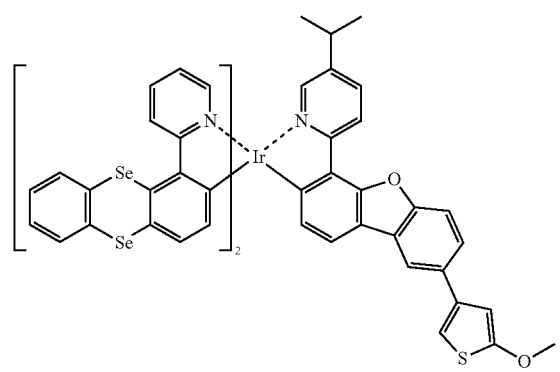
EX185
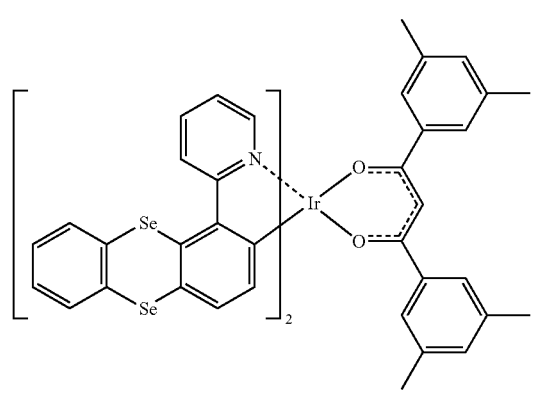
EX186
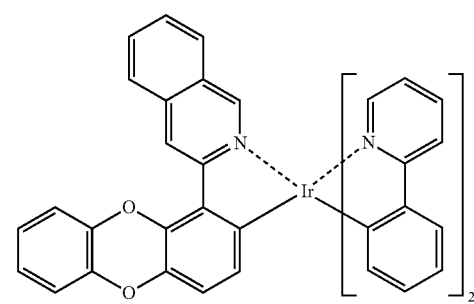
EX187
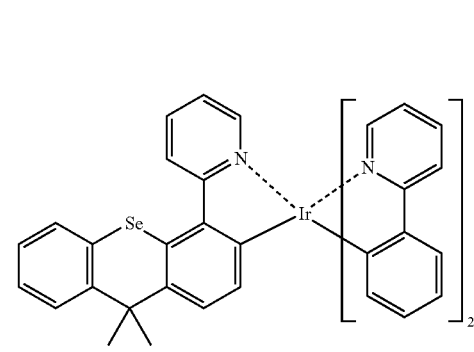
EX188
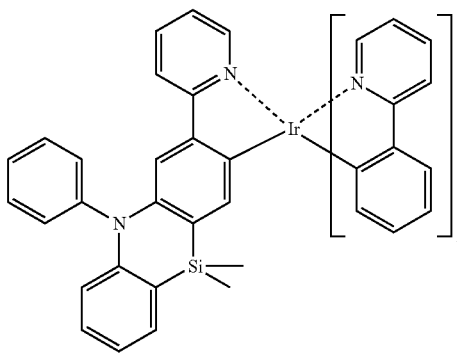
EX189
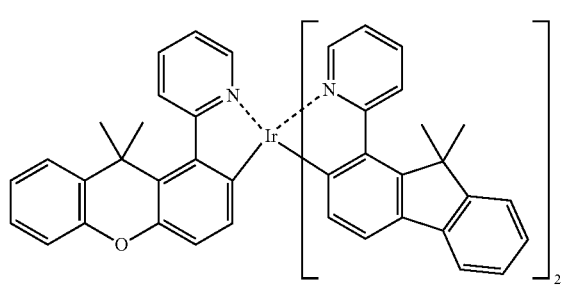
EX190
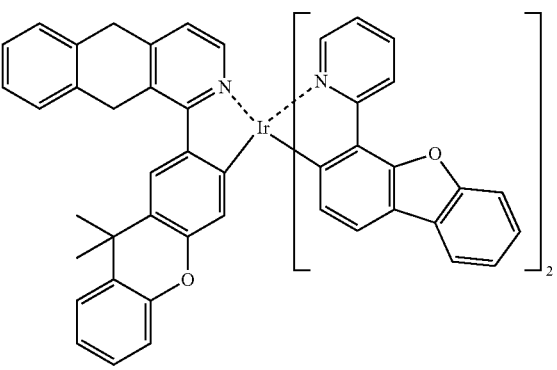
EX191
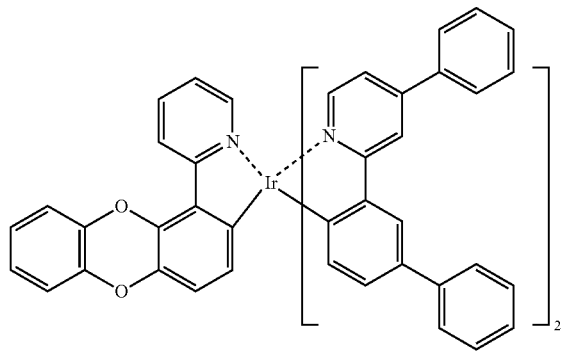

EX192
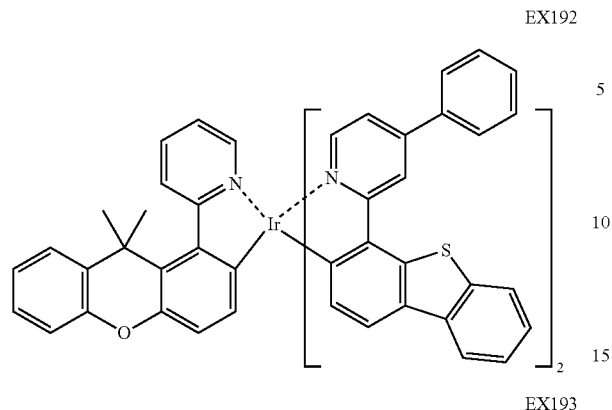
EX193
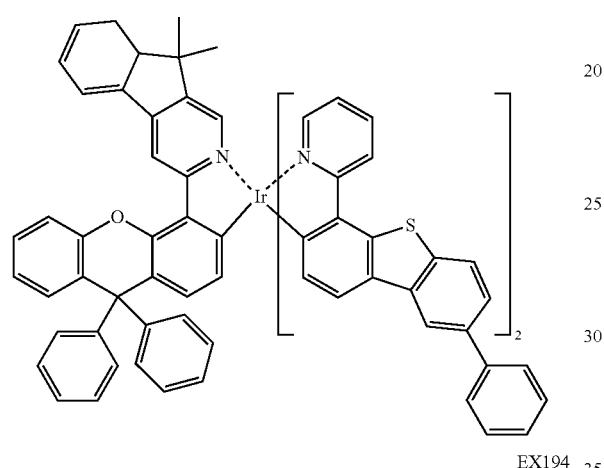
EX194
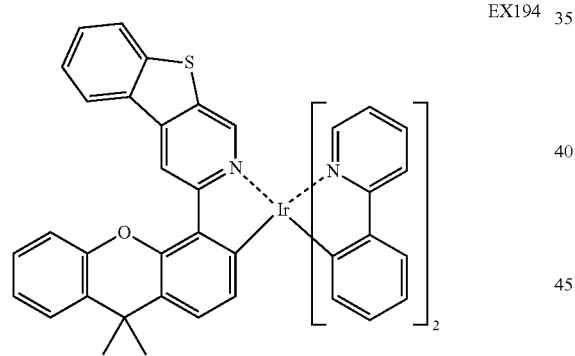
EX195
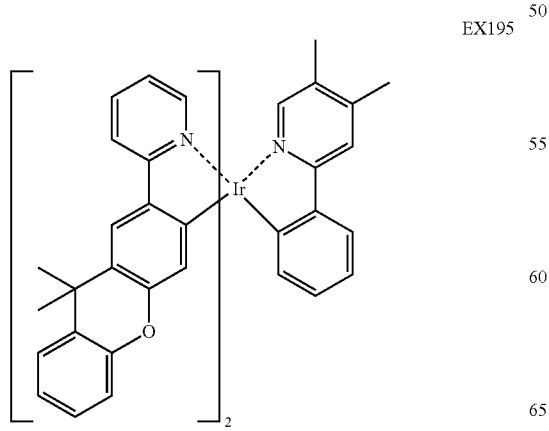
EX196
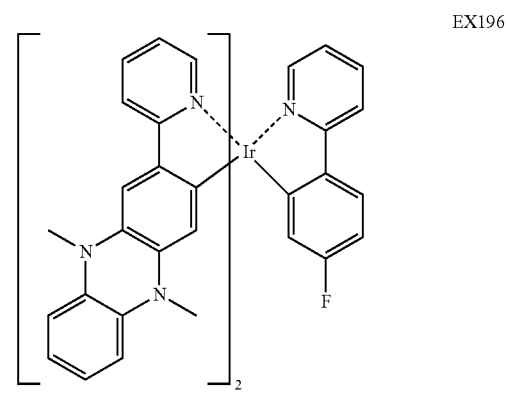
EX197
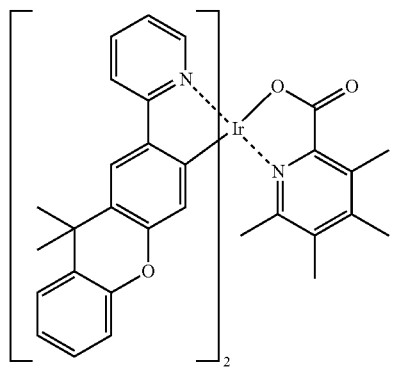
EX198
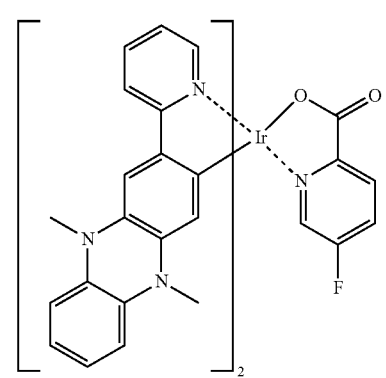
EX199
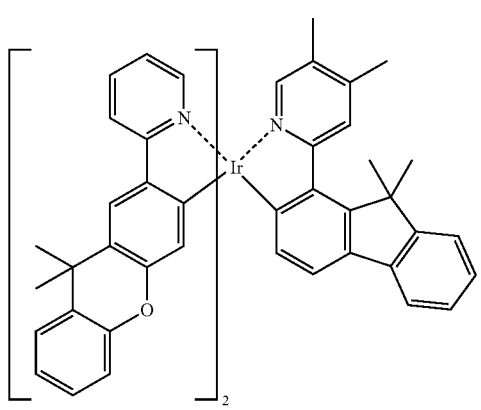

-continued

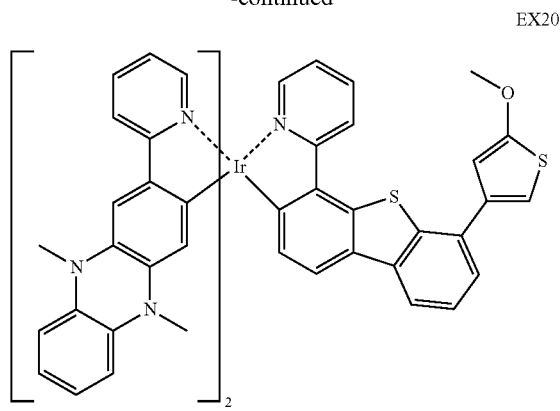
EX200

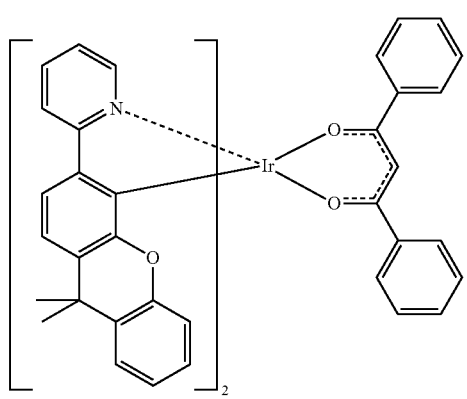
EX201

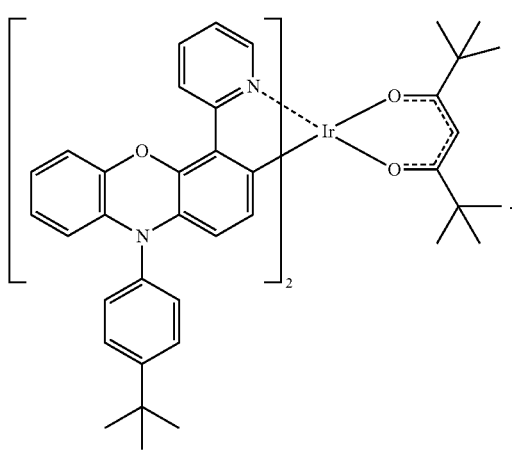
EX202

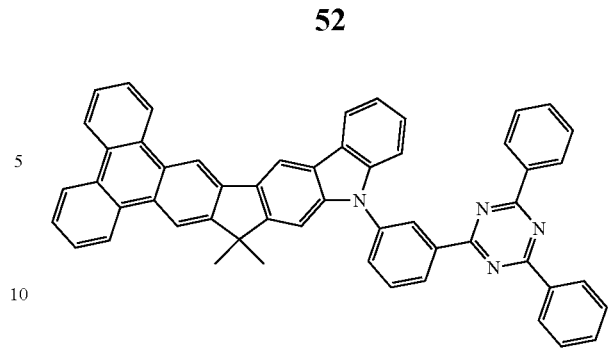

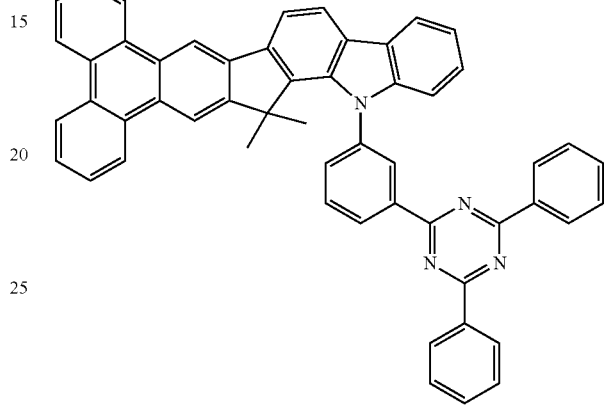
lp;3p

In another embodiment of the present invention, an organic electroluminescence device is disclosed. The organic electroluminescence device comprises a pair of electrodes composed of a cathode and an anode, and a light emitting layer between the pair of electrodes. The light emitting layer comprises the iridium complex of formula (1).

In some embodiments, the light emitting layer further includes a host material, and the iridium complex of formula (1) is used as a phosphorescent dopant material. The host material may be selected from the following compounds:

In some embodiments, the light emitting layer emits red, green, blue, or yellow phosphorescence. In yet another embodiment of the present invention, the organic electroluminescent device is a lighting panel. In a further embodiment of the present invention, the organic electroluminescent device is a backlight panel.

Detailed preparation of the iridium complex of the present invention will be clarified by exemplary embodiments below, but the present invention is not limited thereto. EXAMPLES 1 to 17 show the preparation of the iridium complex of the present invention, and EXAMPLE 18 shows the fabrication and the testing report of the organic EL devices.

Example 1

Synthesis of EX1
Synthesis of Intermediate A

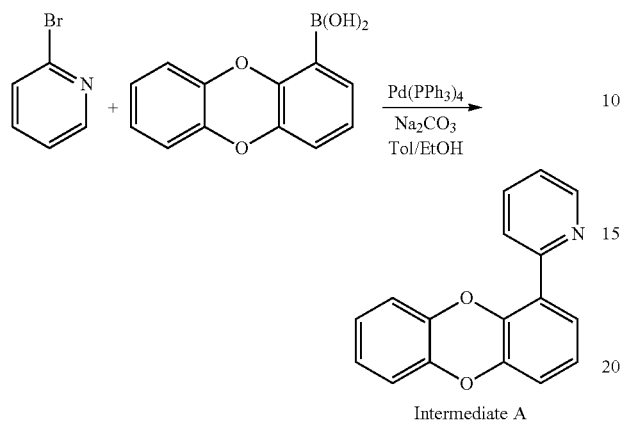

Intermediate A

A mixture of 20 g (126 mmole) of 2-Bromopyridine, 31.8 g (148.4 mmole) of Dibenzo[b,e][1,4]dioxin-1-ylboronic acid, 2.92 g (2.53 mmole) of Pd(PPh$_3$)$_4$, 1.77 g (5.06 mmole) of 2-Dicyclophosphine-2',6'-dimethoxy-biphenyl, 20.2 g (190 mmole) of Na$_2$CO$_3$, 300 ml of Toluene and 100 ml of Ethanol, and 95 ml of H$_2$O was placed under nitrogen, and then heated at 80° C. while stirring for 16 h. After the reaction finished, the mixture was allowed to cool to room temperature. The solution was extracted with 100 ml of ethyl acetate (3 times) and then 300 ml of water. The organic layer was dried with anhydrous magnesium sulfate, and then the solvent was evaporated under reduced pressure. The residue was purified by column chromatography on silica to give product (26.4 g, 80%) as a pale yellow solid.

Synthesis of Intermediate B

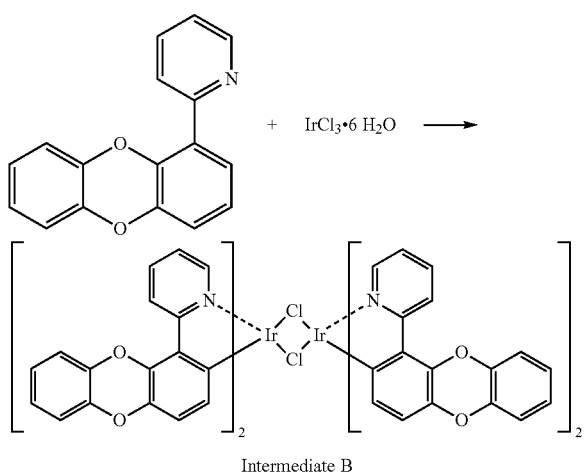

Intermediate B

A mixture of 10 g (38.2 mmol) of Intermediate A, 5.93 g (16.6 mmol) of Iridium(III) chloride hydrate, 180 ml of 2-Ethoxyethanol and 60 ml of DI water was degassed and placed under nitrogen, and then heated at 100° C. while stirring for 16 h. After the reaction finished, the mixture was allowed to cool to room temperature. The precipitated product was filtered with suction and then washed with water. Afterwards, 200 ml of water was added and stirred for 1 hr, and then the precipitated product was filtered with suction. Subsequently, 200 ml of EtOH was added and stirred for 1 hr, and then the precipitated product was filtered with suction to give 7.84 g (63%) of red product.

Synthesis of EX1

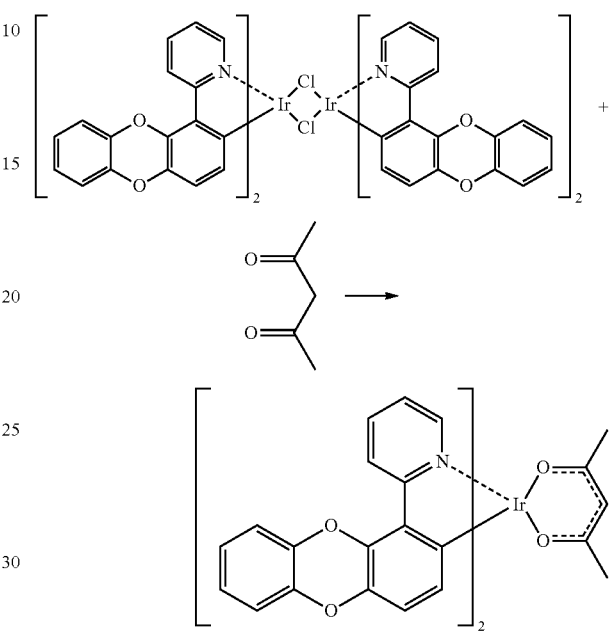

A mixture of 7.84 g (5.24 mmol) of Intermediate B, 5.3 g (52.4 mmol) of acetylacetone, 11.1 g (104.8 mmol) of sodium carbonate, and 160 ml of 2-ethoxyethanol was degassed and placed under nitrogen, and then heated at 80° C. while stirring for 16 h. After the reaction finished, the mixture was allowed to cool to room temperature. The precipitated product was filtered with suction and then washed with water. Afterwards, 100 ml of water was added and stirred for 1 hr, and then the precipitated product was filtered with suction. Subsequently, 50 ml of EtOH was added and stirred for 1 hr, and then the precipitated product was filtered with suction to give 0.4 g (52%) of brown product. MS(m/z, EI$^+$):811.87

Example 2

Synthesis of EX13
Synthesis of Intermediate C

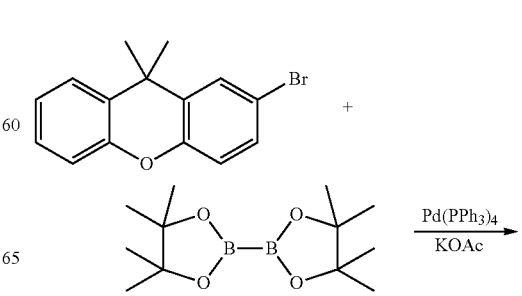

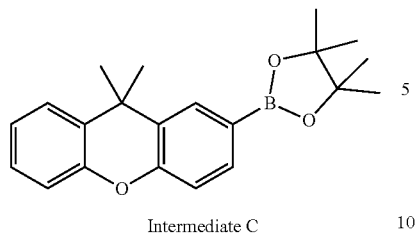

Intermediate C

A mixture of 2 g (6.916 mmole) of 2-Bromo-9,9-dimethyl-9H-xanthene, 2.63 g (10.37 mmol) of bis(pinacolato)diboron, 0.16 g (0.138 mmol) of tetrakis(triphenylphosphine)palladium, 1.35 g (13.83 mmol) of potassium acetate, and 40 ml of 1,4-dioxane was degassed and placed under nitrogen, and then heated at 90° C. for 16 h. After the reaction finished, the mixture was allowed to cool to room temperature. The organic phase was separated, washed with ethyl acetate and water, and then dried with magnesium sulfate. The solvent was removed in vacuo. The residue was purified by column chromatography on silica to give product (1.62 g, 70%) as an off-white solid.

Synthesis of Intermediate D

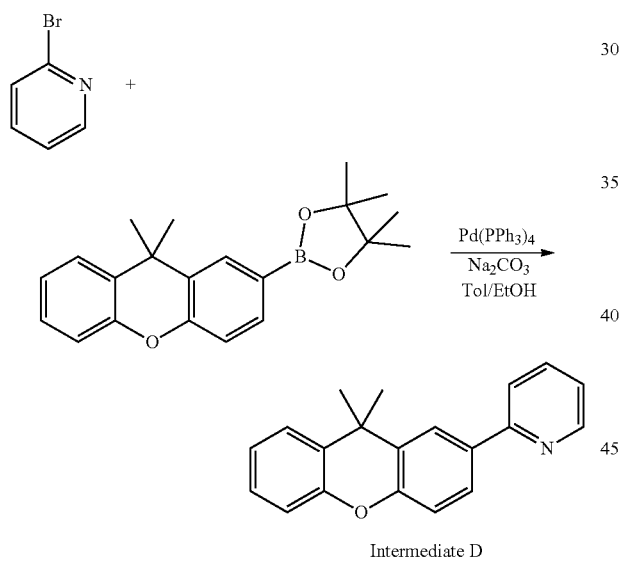

Intermediate D

A mixture of 0.7 g (4.38 mmole) of 2-Bromopyridine, 1.62 g (4.82 mmole) of Intermediate C, 0.1 g (0.088 mmole) of Pd(PPh₃)₄, 0.06 g (0.176 mmole) of 2-Dicyclophosphine-2',6'-dimethoxy-biphenyl, 0.7 g (6.6 mmole) of Na₂CO₃, 15 ml of Toluene and 5 ml of Ethanol, and 3.5 ml of H₂O was placed under nitrogen, and then heated at 80° C. while stirring for 16 h. After the reaction finished, the mixture was allowed to cool to room temperature. The solution was extracted with 20 ml of ethyl acetate (3 times) and then 50 ml of water. The organic layer was dried with anhydrous magnesium sulfate and the solvent was evaporated under reduced pressure. The residue was purified by column chromatography on silica to give product (1.02 g, 81%) as a pale yellow solid.

Synthesis of Intermediate E

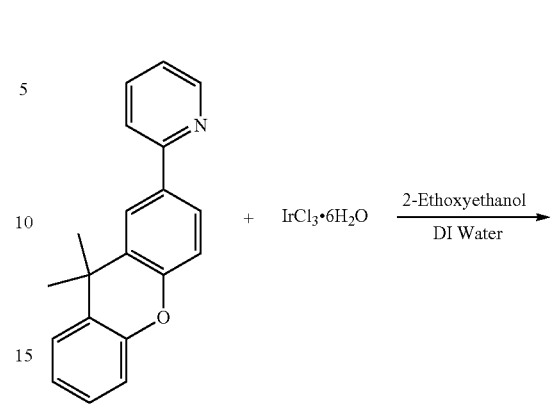

Intermediate E

A mixture of 1.02 g (3.55 mmol) of Intermediate D, 0.55 g (1.54 mmol) of Iridium(III) chloride hydrate, 16.5 ml of 2-Ethoxyethanol and 5.5 ml of DI water was degassed and placed under nitrogen, and then heated at 100° C. while stirring for 16 h. After the reaction finished, the mixture was allowed to cool to room temperature. The precipitated product was filtered with suction and then washed with water. Afterwards, 30 ml of water was added and stirred for 1 hr, and then the precipitated product was filtered with suction. Subsequently, 20 ml of EtOH was added and stirred for 1 hr, and then the precipitated product was filtered with suction to give 2.41 g (85%) of red product.

Synthesis of EX13

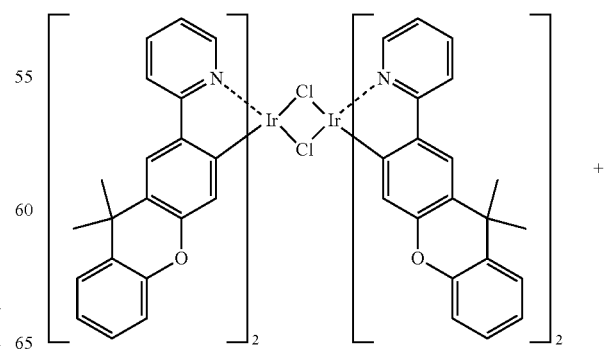

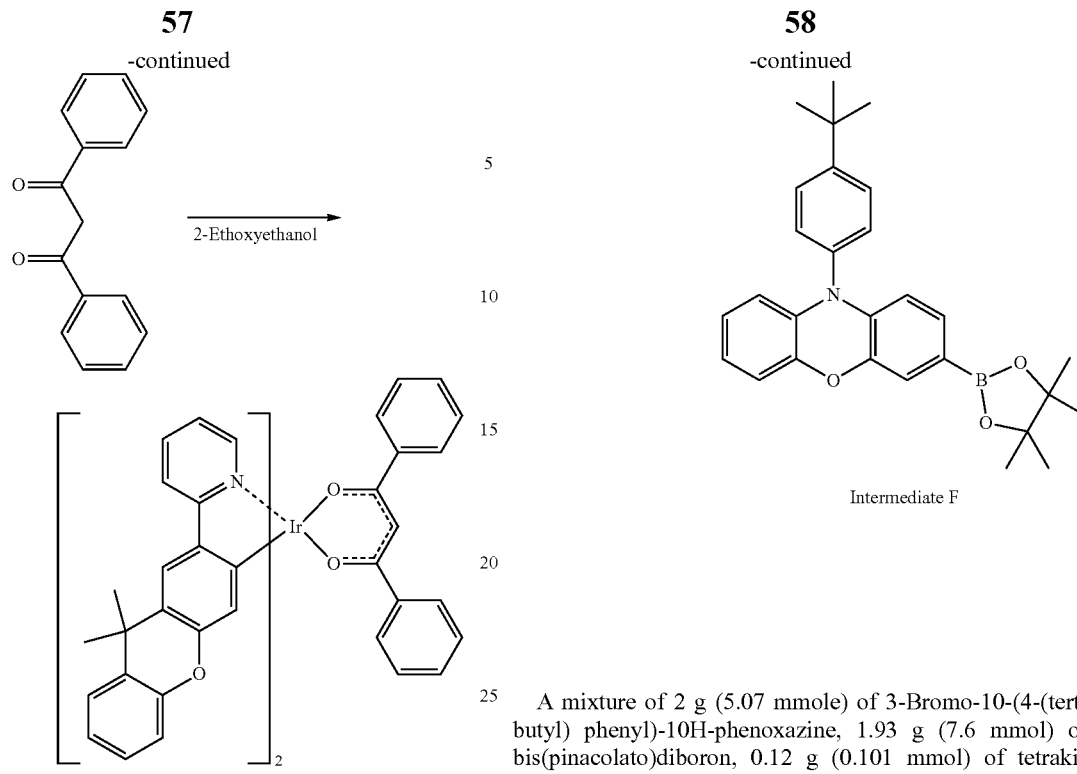

A mixture of 2.41 g (1.5 mmol) of Intermediate E, 3.37 g (15 mmol) of 1,3-Diphenylpropane-1,3-dione, 3.2 g (30.1 mmol) of sodium carbonate, and 50 ml of 2-ethoxyethanol was degassed and placed under nitrogen, and then heated at 80° C. while stirring for 16 h. After the reaction finished, the mixture was allowed to cool to room temperature. The precipitated product was filtered with suction and then washed with water. Afterwards, 100 ml of water was added and stirred for 1 hr, and then the precipitated product was filtered with suction. Subsequently, 10 ml of EtOH was added and stirred for 1 hr, and then the precipitated product was filtered with suction to give 1.78 g (60%) of red product. MS(m/z, EI$^+$):988.18

Example 3

Synthesis of EX14

Synthesis of Intermediate F

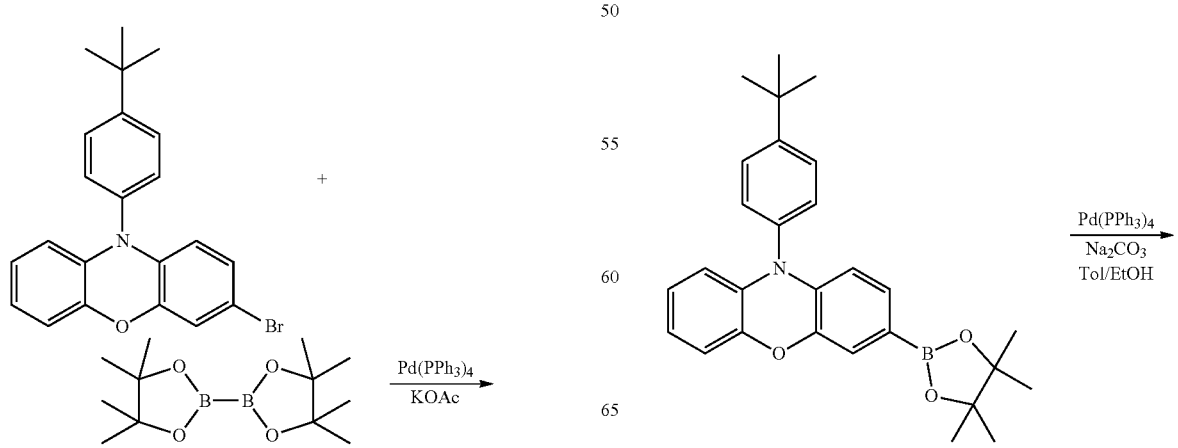

Intermediate F

A mixture of 2 g (5.07 mmole) of 3-Bromo-10-(4-(tert-butyl) phenyl)-10H-phenoxazine, 1.93 g (7.6 mmol) of bis(pinacolato)diboron, 0.12 g (0.101 mmol) of tetrakis(triphenylphosphine)palladium, 1 g (10.14 mmol) of potassium acetate, and 40 ml of 1,4-dioxane was degassed and placed under nitrogen, and then heated at 90° C. for 16 h. After the reaction finished, the mixture was allowed to cool to room temperature. The organic phase was separated, washed with ethyl acetate and water, and then dried with magnesium sulfate. The solvent was removed in vacuo. The residue was purified by column chromatography on silica to give product (1.62 g, 73%) as an off-white solid.

Synthesis of Intermediate G

-continued

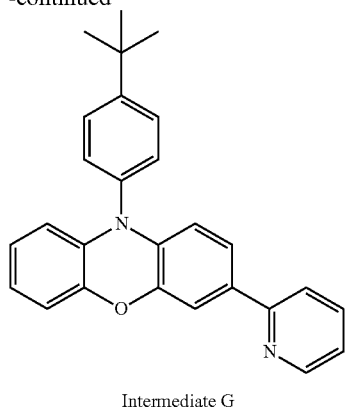

Intermediate G

A mixture of 0.53 g (3.33 mmole) of 2-Bromopyridine, 1.62 g (3.67 mmole) of Intermediate F, 0.08 g (0.067 mmole) of Pd(PPh$_3$)$_4$, 0.05 g (0.134 mmole) of 2-Dicyclophosphine-2',6'-dimethoxy-biphenyl, 0.7 g (6.6 mmole) of Na$_2$CO$_3$, 15 ml of Toluene and 5 ml of Ethanol, and 3.5 ml of H$_2$O was placed under nitrogen, and then heated at 80° C. while stirring for 16 h. After the reaction finished, the mixture was allowed to cool to room temperature. The solution was extracted with 20 ml of ethyl acetate (3 times) and then 50 ml of water. The organic layer was dried with anhydrous magnesium sulfate and then the solvent was evaporated under reduced pressure. The residue was purified by column chromatography on silica to give product (1.04 g, 79%) as a light yellow solid.

Synthesis of Intermediate H

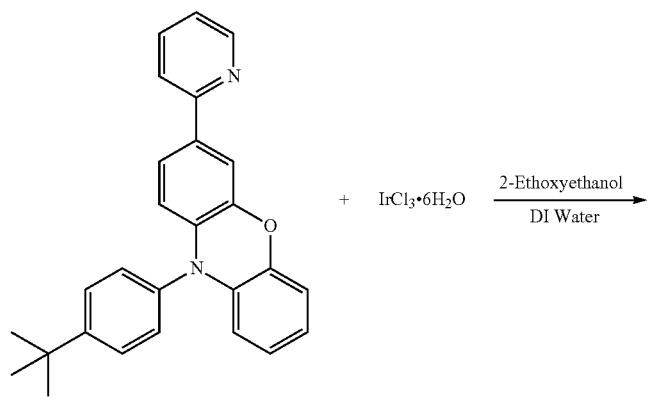

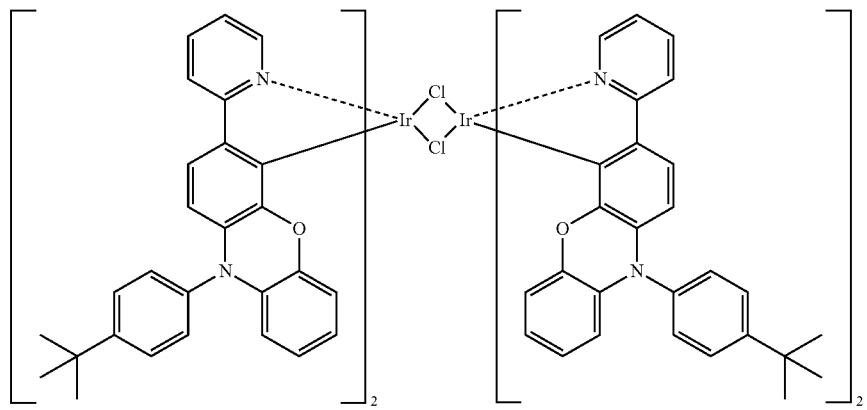

Intermediate H

A mixture of 1.04 g (2.65 mmol) of Intermediate G, 0.41 g (1.54 mmol) of Iridium(III) chloride hydrate, 15 ml of 2-Ethoxyethanol and 5.5 ml DI water was degassed and placed under nitrogen, and then heated at 100° C. while stirring for 16 h. After the reaction finished, the mixture was allowed to cool to room temperature. The precipitated product was filtered with suction and then washed with water. Afterwards, 30 ml of water was added and stirred for 1 hr, and then the precipitated product was filtered with suction. Subsequently, 20 ml of EtOH was added and stirred for 1 hr, and then the precipitated product was filtered with suction to give 2.19 g (82%) of red product.

Synthesis of EX14

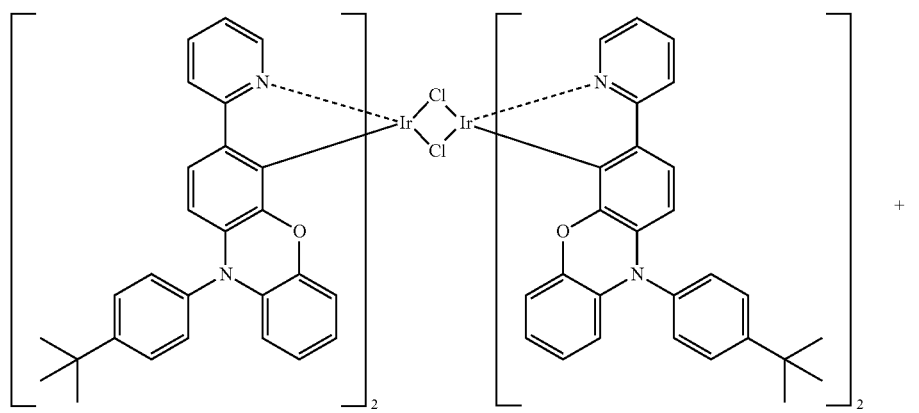

A mixture of 2.19 g (1.08 mmol) of Intermediate H, 2 g (10.8 mmol) of 2,2,6,6-tetramethylheptane-3,5-dione, 2.3 g (21.6 mmol) of sodium carbonate, and 50 ml of 2-ethoxyethanol was degassed and placed under nitrogen, and then heated at 80° C. while stirring for 16 h. After the reaction finished, the mixture was allowed to cool to room temperature. The precipitated product was filtered with suction and then washed with water. Afterwards, 100 ml of water was added and stirred for 1 hr, and then the precipitated product was filtered with suction. Subsequently, 10 ml of EtOH was added and stirred for 1 hr, and then the precipitated product was filtered with suction to give 1.56 g (62%) of red product. MS(m/z, EI⁺):1161.49

Example 4

Synthesis of EX5

Synthesis of Intermediate I

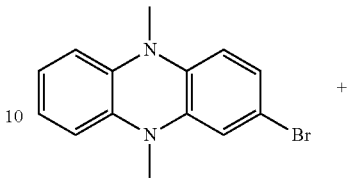

+

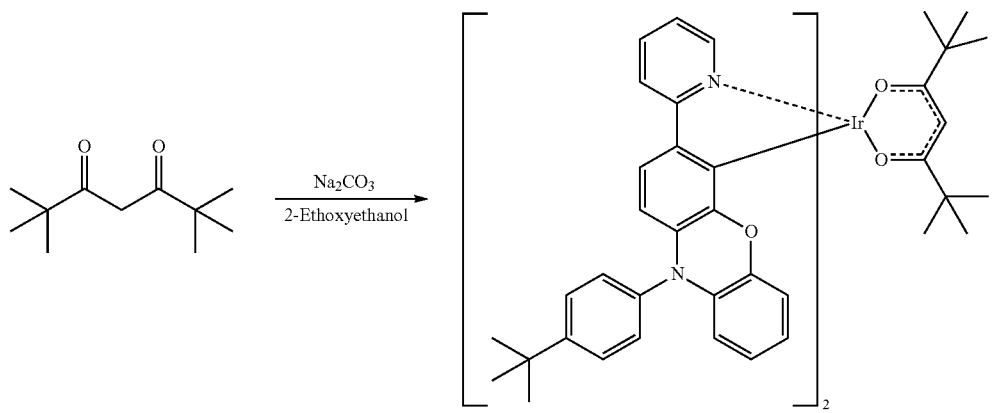

-continued

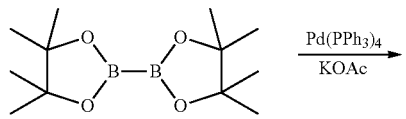

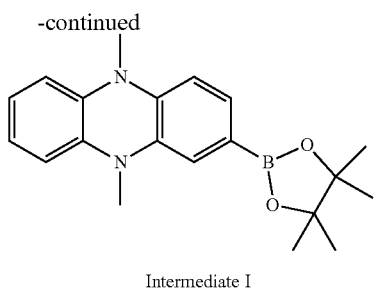

Intermediate I

A mixture of 2 g (6.92 mmole) of 2-Bromo-5,10-dimethyl-5,10-dihydrophenazine, 2.63 g (10.3 mmol) of bis(pinacolato)diboron, 0.16 g (0.138 mmol) of tetrakis(triphenylphosphine)palladium, 1 g (13.8 mmol) of potassium acetate, and 40 ml of 1,4-dioxane was degassed and placed under nitrogen, and then heated at 90° C. for 16 h. After the reaction finished, the mixture was allowed to cool to room temperature. The organic phase was separated, washed with ethyl acetate and water, and then dried with magnesium sulfate. The solvent was removed in vacuo. The residue was purified by column chromatography on silica to give product (1.74 g, 75%) as an off-white solid.

Synthesis of Intermediate J

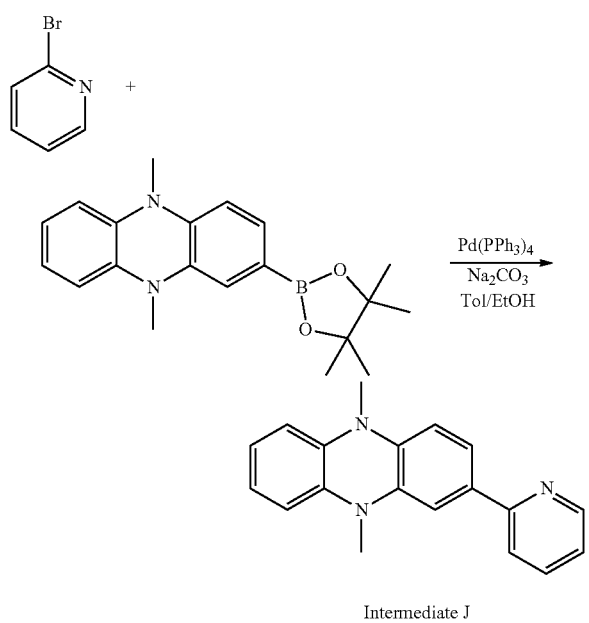

Intermediate J

A mixture of 0.74 g (4.7 mmole) of 2-Bromopyridine, 1.74 g (5.17 mmole) of Intermediate I, 0.108 g (0.094 mmole) of Pd(PPh$_3$)$_4$, 0.065 g (0.187 mmole) of 2-Dicyclophosphine-2',6'-dimethoxy-biphenyl, 1 g (9.36 mmole) of Na$_2$CO$_3$, 15 ml of Toluene and 5 ml of Ethanol, and 4.7 ml of H$_2$O was placed under nitrogen, and then heated at 80° C. while stirring for 16 h. After the reaction finished, the mixture was allowed to cool to room temperature. The solution was extracted with 20 ml of ethyl acetate (3 times) and then 50 ml of water. The organic layer was dried with anhydrous magnesium sulfate and then the solvent was evaporated under reduced pressure. The residue was purified by column chromatography on silica to give product (2.58 g, 71%) as a yellow solid.

Synthesis of Intermediate K

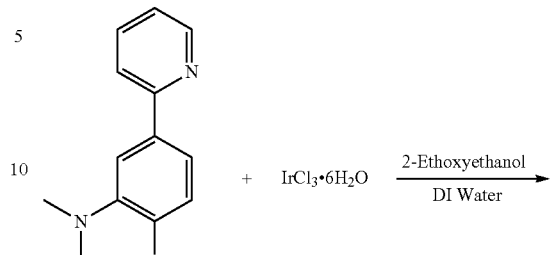

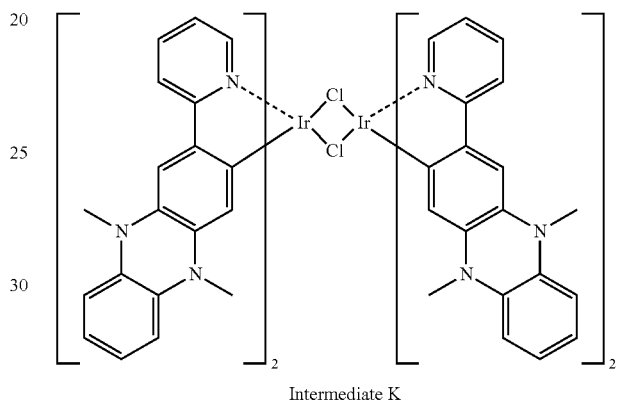

Intermediate K

A mixture of 2.58 g (8.98 mmol) of Intermediate J, 1.4 g (3.9 mmol) of Iridium(III) chloride hydrate, 45 ml of 2-Ethoxyethanol and 15 ml of DI water was degassed and placed under nitrogen, and then heated at 100° C. while stirring for 16 h. After the reaction finished, the mixture was allowed to cool to room temperature. The precipitated product was filtered with suction and then washed with water. Afterwards, 50 ml of water was added and stirred for 1 hr, and then the precipitated product was filtered with suction. Subsequently, 30 ml of EtOH was added and stirred for 1 hr, and then the precipitated product was filtered with suction to give 2.43 g (78%) of Orange product.

Synthesis of EX5

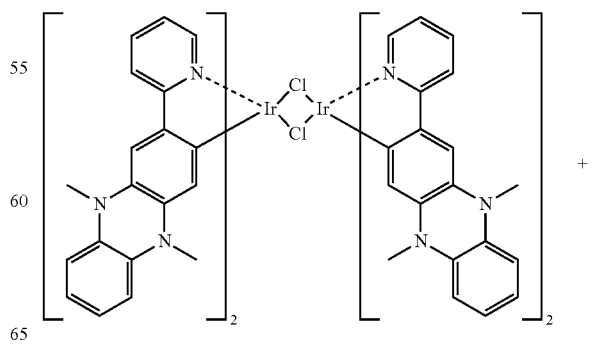

-continued

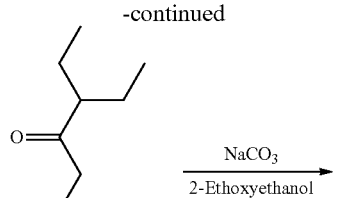

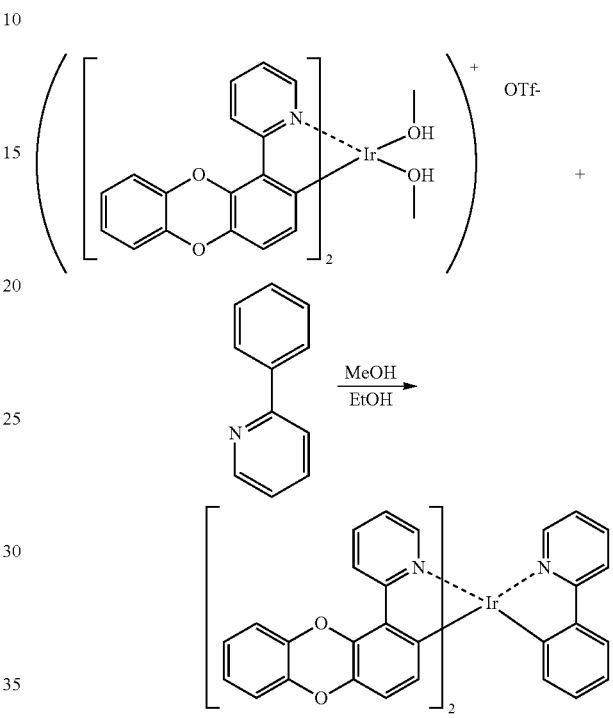

lp;-1p

A mixture of 2.43 g (1.08 mmol) of Intermediate K, 3.22 g (10.8 mmol) of 3,7-Diethylnonane-4,6-dione, 3.2 g (30.3 mmol) of sodium carbonate, and 50 ml of 2-ethoxyethanol was degassed and placed under nitrogen, and then heated at 80° C. while stirring for 16 h. After the reaction finished, the mixture was allowed to cool to room temperature. The precipitated product was filtered with suction and then washed with water. Afterwards, 100 ml of water was added and stirred for 1 hr, and then the precipitated product was filtered with suction. Subsequently, 10 ml of EtOH was added and stirred for 1 hr, and then the precipitated product was filtered with suction to give 1.56 g (62%) of red product. MS (m/z, EI$^+$):976.26

Example 5

Synthesis of EX33
Synthesis of Intermediate L

A mixture of 5 g (3.34 mmol) of Intermediate B, 1.97 g (7.68 mmol) of silver triflate, 200 ml of dichloromethane and 10 ml of methanol was placed under nitrogen, and then stirred overnight. After the reaction finished, the silver chloride was filtered off and the solvent was evaporated to obtain 6.06 g of iridium triflate precursor, which was used directly in the next step without purification.

Synthesis of EX33

A mixture of 6.06 g (6.54 mmol) of Intermediate L, 3.4 g (12.1 mmol) of 2-Phenylpyridine, 90 ml of EtOH and 90 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 4.8 g (85%) of yellow product. MS (m/z, EI$^+$):866.95

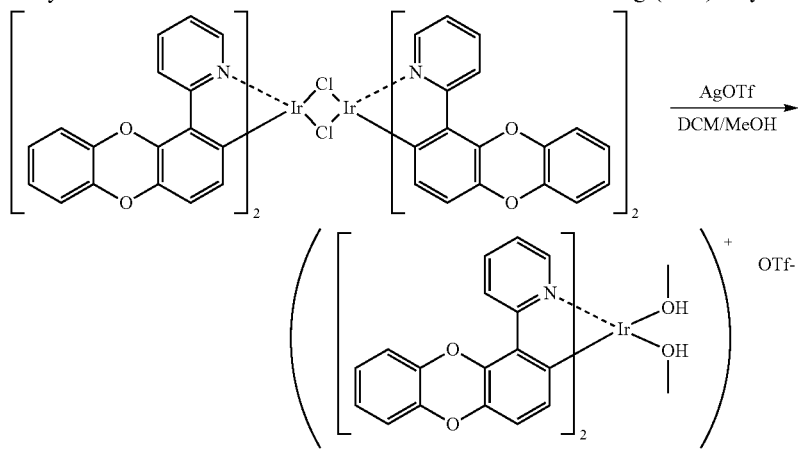

Intermediate L

Example 6

Synthesis of EX195
Synthesis of Intermediate M

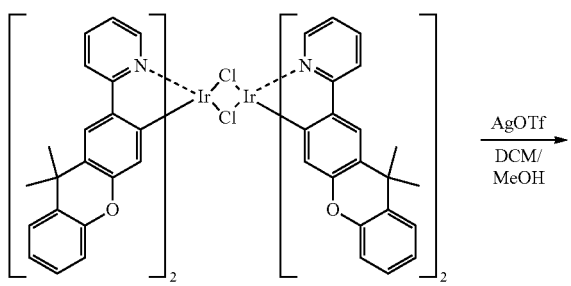

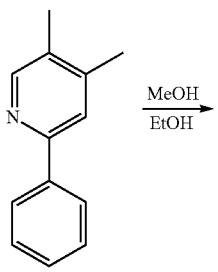

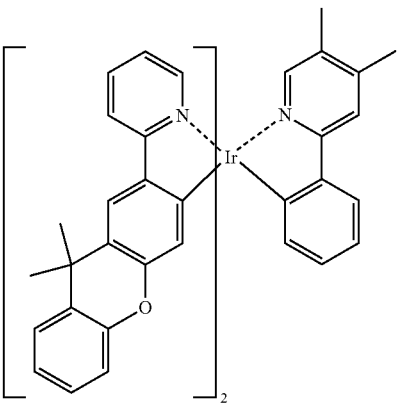

Intermediate M

A mixture of 4.5 g (2.81 mmol) of Intermediate E, 1.66 g (6.46 mmol) of silver triflate, 200 ml of dichloromethane and 10 ml of methanol was placed under nitrogen and stirred overnight. After the reaction finished, the silver chloride was filtered off and the solvent was evaporated to obtain 5.33 g of iridium triflate precursor, which was used directly in the next step without purification.

Synthesis of EX195

A mixture of 5.33 g (5.45 mmol) of Intermediate M, 3.4 g (16.3 mmol) of 4,5-Dimethyl-2-phenylpyridine, 90 ml of EtOH and 90 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.45 g (67%) of orange product. MS (m/z, EI$^+$):947.17

Example 7

Synthesis of EX46
  Synthesis of Intermediate N

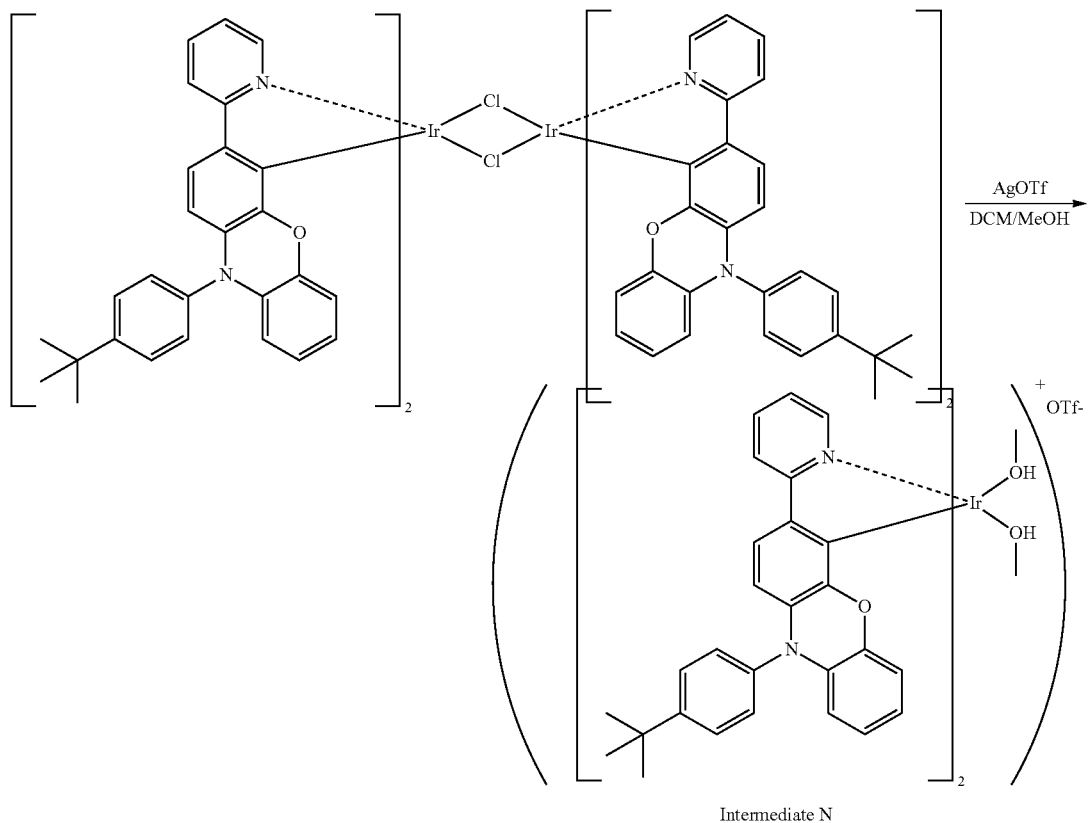

Intermediate N

A mixture of 4.5 g (2.22 mmol) of Intermediate H, 1.31 g (5.12 mmol) of silver triflate, 200 ml of dichloromethane and 10 ml of methanol was placed under nitrogen and stirred overnight. After the reaction finished, the silver chloride was filtered off and the solvent was evaporated to obtain 5.18 g of iridium triflate precursor, which was used directly in the next step without purification.

Synthesis of EX46

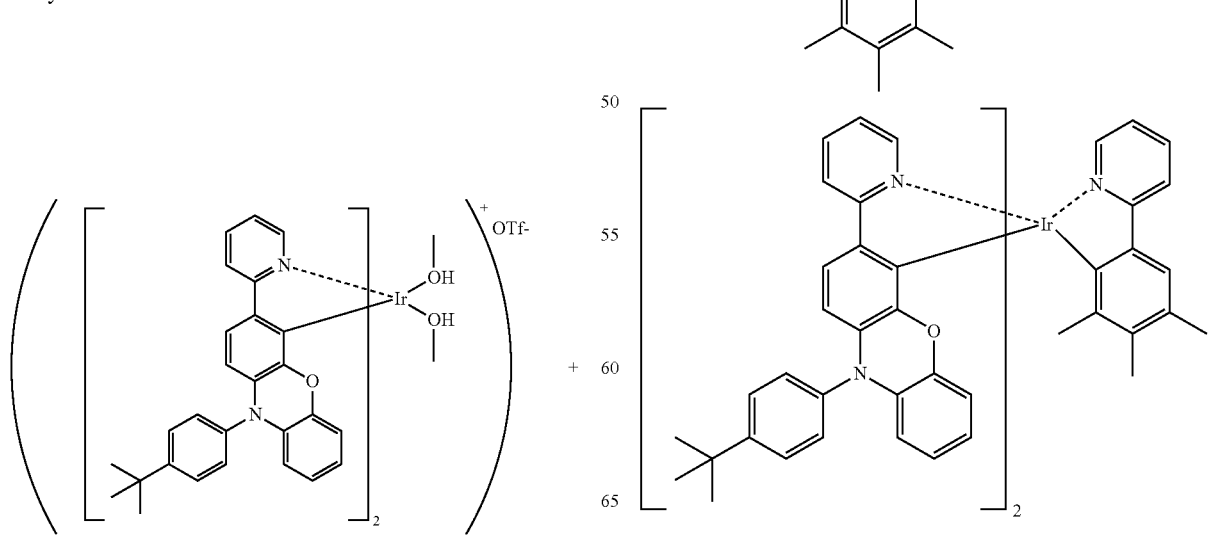

A mixture of 5.18 g (4.35 mmol) of Intermediate N, 3.4 g (13 mmol) of 2-(3,4,5-Trimethylphenyl)pyridine, 90 ml of EtOH and 90 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.47 g (68%) of yellow-orange product. MS (m/z, EI⁺):1171.48

Example 8

Synthesis of EX196
Synthesis of Intermediate O

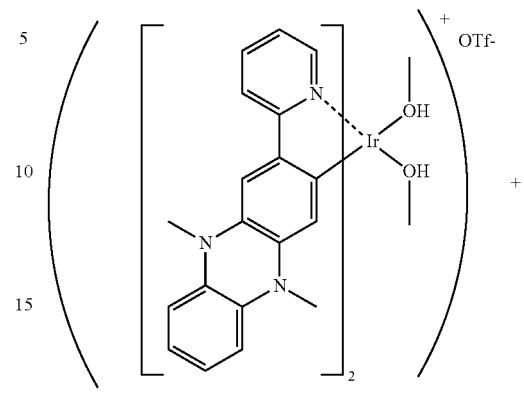

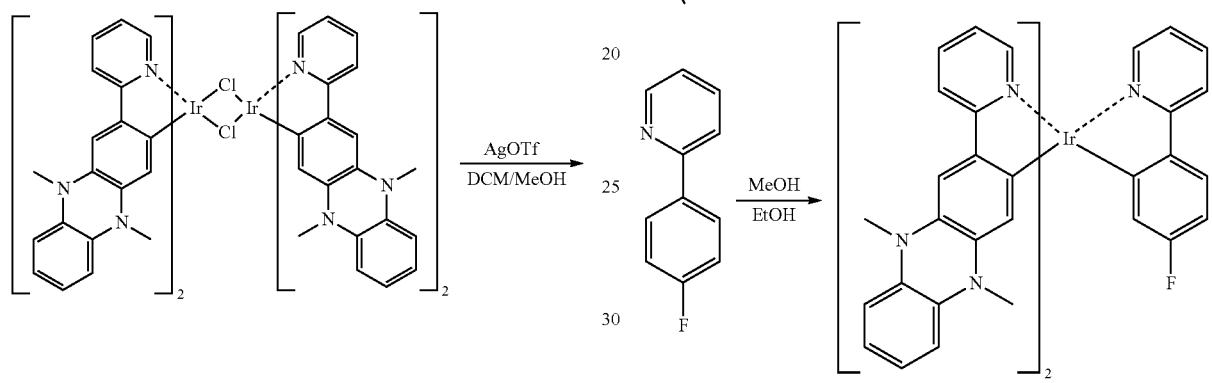

Intermediate O

A mixture of 4.5 g (2.81 mmol) of Intermediate K, 1.66 g (6.46 mmol) of silver triflate, 200 ml of dichloromethane and 10 ml of methanol was placed under nitrogen, and then stirred overnight. After the reaction finished, the silver chloride was filtered off and the solvent was evaporated to obtain 5.33 g of iridium triflate precursor, which was used directly in the next step without purification.

Synthesis of EX196

A mixture of 5.33 g (5.45 mmol) of Intermediate O, 2.83 g (16.3 mmol) of 2-(4-Fluorophenyl)pyridine, 90 ml of EtOH and 90 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.37 g (66%) of yellow product. MS (m/z, EI⁺):937.12

Example 9

Synthesis of EX65
Synthesis of EX65

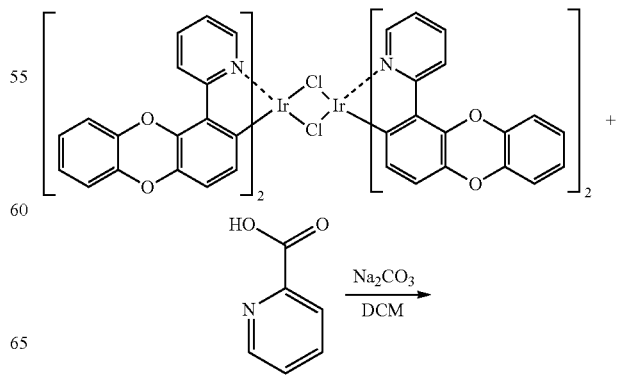

-continued

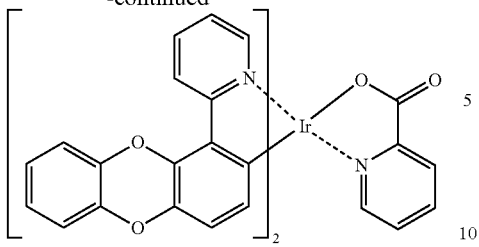

A mixture of 5 g (3.34 mole) of Intermediate B, 1.13 g (9.18 mmole) of 2-Picolinic acid, 1.41 g (13.36 mmole) of Sodium Carbonate, and 340 ml of dry dichloromethane was placed under nitrogen, and then heated to reflux for 48 hours. After the reaction finished, the mixture was allowed to cool to room temperature. The solution was extracted with Dichloromethane and water. The organic layer was dried with anhydrous magnesium sulfate and then the solvent was evaporated under reduced pressure. The residue was purified by column chromatography on silica to give 4.06 g (75%) of yellow solid. MS (m/z, EI$^+$):834.86

Example 10

Synthesis of EX197
Synthesis of EX197

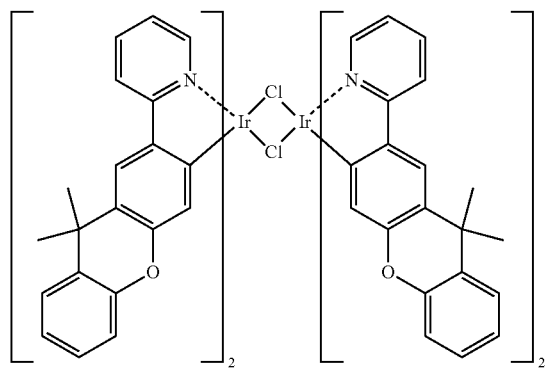

-continued

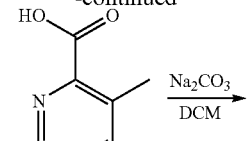

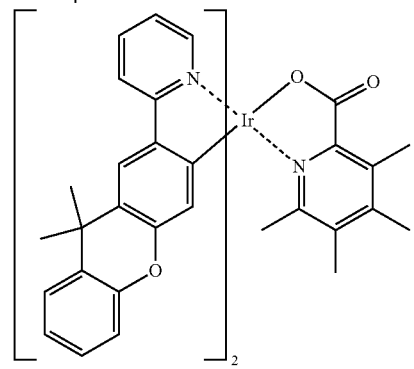

A mixture of 5 g (3.12 mole) of Intermediate E, 1.54 g (8.59 mmole) of 3,4,5,6-Tetramethylpicolinic acid, 1.32 g (12.49 mmole) of Sodium Carbonate, and 340 ml of dry dichloromethane was placed under nitrogen, and then heated to reflux for 48 hours. After the reaction finished, the mixture was allowed to cool to room temperature. The solution was extracted with Dichloromethane and water. The organic layer was dried with anhydrous magnesium sulfate and then the solvent was evaporated under reduced pressure. The residue was purified by column chromatography on silica to give 4.24 g (72%) of yellow solid. MS (m/z, EI$^+$):943.14

Example 11

Synthesis of EX78
Synthesis of EX78

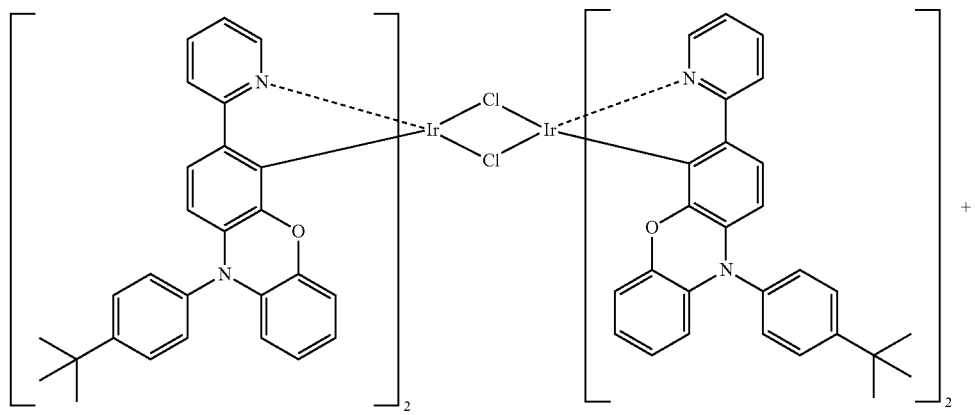

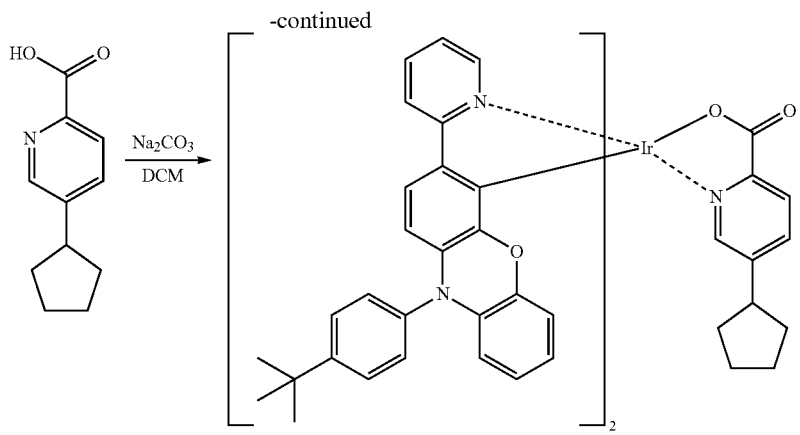

A mixture of 5 g (2.47 mole) of Intermediate H, 1.3 g (6.8 mmole) of 5-Cyclopentylpicolinic acid, 1.04 g (9.89 mmole) of Sodium Carbonate, and 340 ml of dry dichloromethane was placed under nitrogen, and then heated to reflux for 48 hours. After the reaction finished, the mixture was allowed to cool to room temperature. The solution was extracted with Dichloromethane and water. The organic layer was dried with anhydrous magnesium sulfate and then the solvent was evaporated under reduced pressure. The residue was purified by column chromatography on silica to give 3.86 g (67%) of yellow solid. MS (m/z, EI$^+$):1165.43

Example 12

Synthesis of EX198

Synthesis of EX198

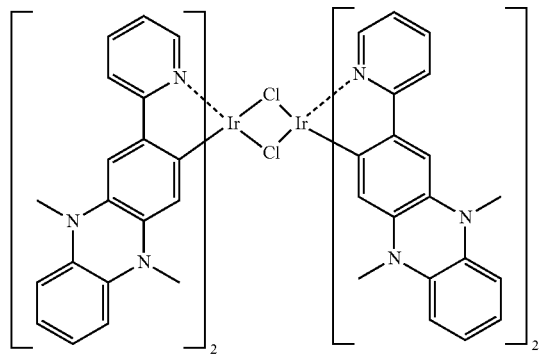

+

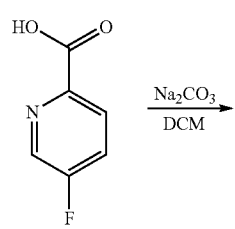

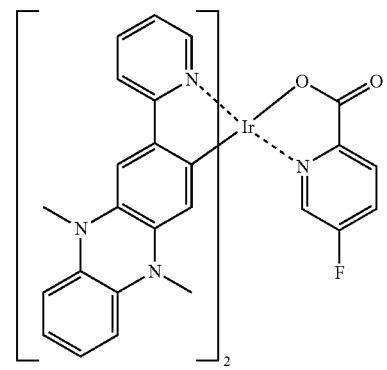

A mixture of 5 g (3.12 mole) of Intermediate K, 1.21 g (8.58 mmole) of 5-Fluoropicolinic acid, 1.32 g (12.49 mmole) of Sodium Carbonate, and 340 ml of dry dichloromethane was placed under nitrogen, and then heated to reflux for 48 hours. After the reaction finished, the mixture was allowed to cool to room temperature. The solution was extracted with Dichloromethane and water. The organic layer was dried with anhydrous magnesium sulfate and then the solvent was evaporated under reduced pressure. The residue was purified by column chromatography on silica to give 3.84 g (68%) of yellow solid. MS (m/z, EI$^+$):905.03

Example 13

Synthesis of EX97

Synthesis of EX97

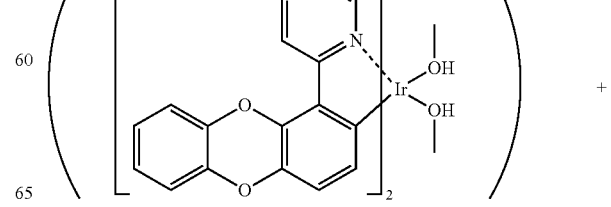

-continued

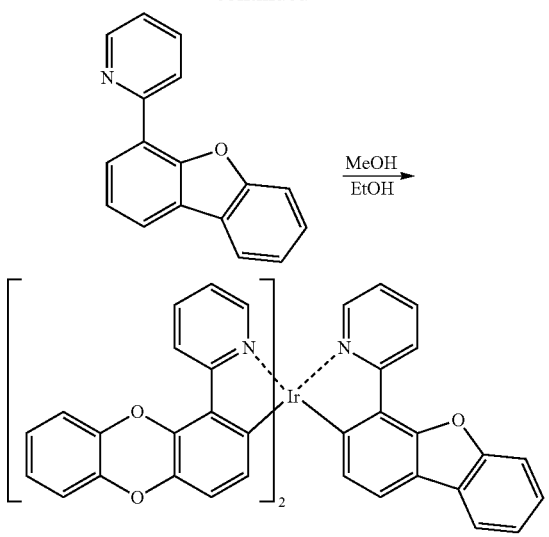

A mixture of 5 g (5.4 mmol) of Intermediate L, 3.97 g (16.2 mmol) of 2-(Dibenzo[b,d]furan-4-yl)pyridine, 90 ml of EtOH and 90 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.67 g (71%) of yellow product. MS (m/z, EI+):957.03

Example 14

Synthesis of EX199

Synthesis of EX199

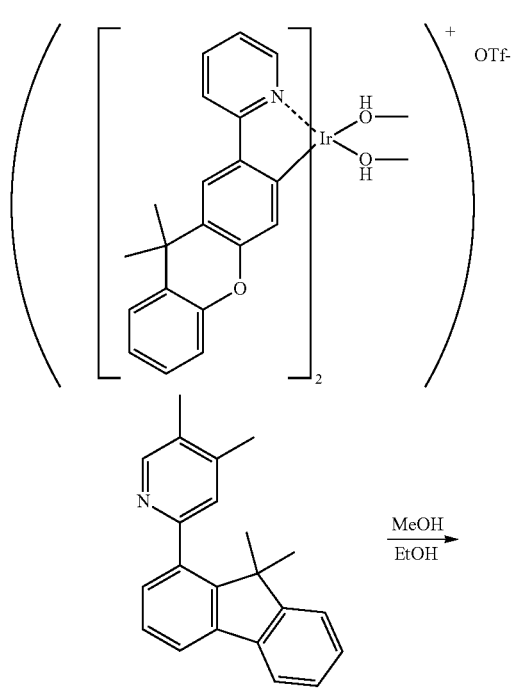

-continued

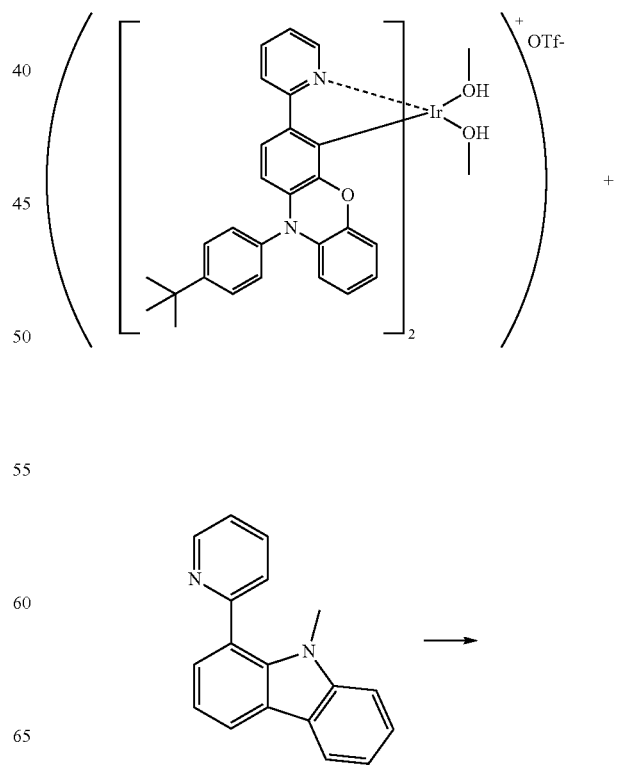

A mixture of 4.6 g (4.7 mmol) of Intermediate M, 4.2 g (14.1 mmol) of 2-(9,9-Dimethyl-9H-fluoren-1-yl)-4,5-dimethylpyridine, 100 ml of EtOH and 100 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.45 g (67%) of orange product. MS (m/z, EI+):1063.33

Example 15

Synthesis of EX110

Synthesis of EX110

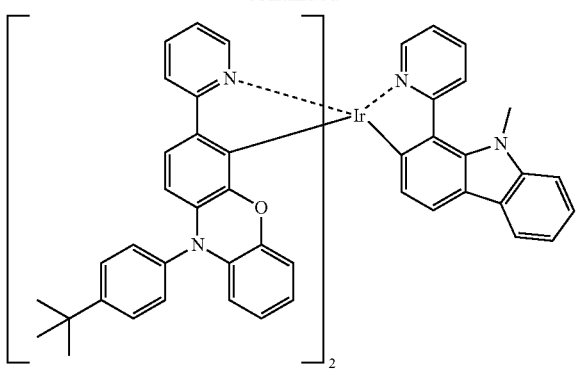

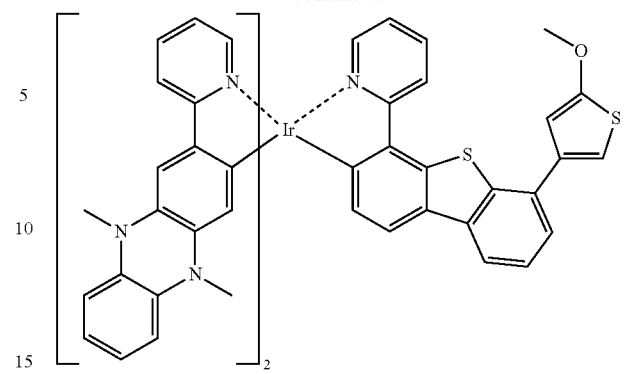

A mixture of 4.5 g (3.78 mmol) of Intermediate N, 2.93 g (11.3 mmol) of 9-Methyl-1-(pyridine-2-yl)-9H-carbazole, 100 ml of EtOH and 100 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.45 g (67%) of orange product. MS (m/z, EI$^+$):1232.52

Example 16

Synthesis of EX200
  Synthesis of EX200

A mixture of 4.8 g (4.04 mmol) of Intermediate O, 4.52 g (12.1 mmol) of 2-(6-(5-methoxythiophen-3-yl)dibenzo[b,d]thiophen-4-yl)pyridine, 100 ml of EtOH and 100 ml of MeOH was placed under nitrogen, and then heated to reflux overnight. After the reaction finished, the mixture was allowed to cool to room temperature. The yellow precipitate formed was filtered under vacuum, washed with ethanol and hexane, and then purified by vacuum sublimation to give 3.45 g (67%) of yellow-orange product. MS (m/z, EI$^+$): 1137.41

Example 17

Synthesis of EX202
  Synthesis of Intermediate P

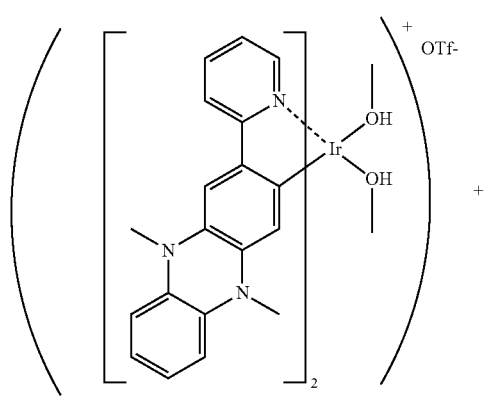

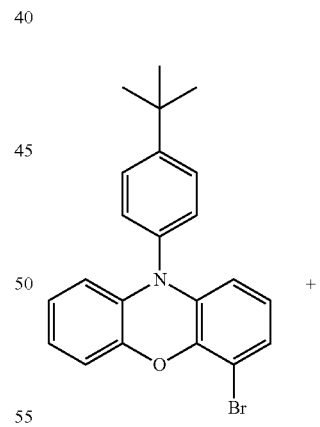

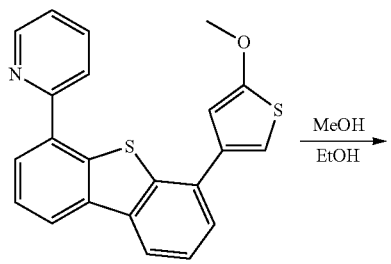

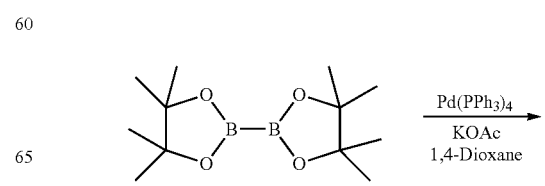

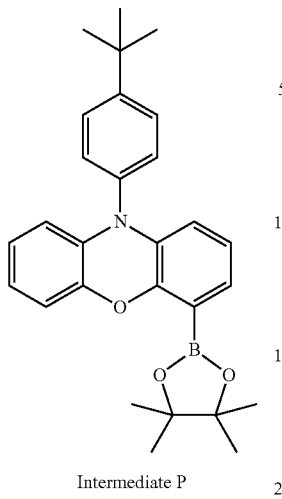

Intermediate P

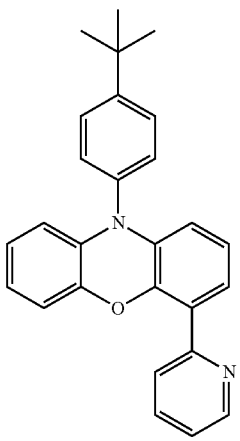

Intermediate Q

A mixture of 2 g (5.07 mmole) of 4-Bromo-10-(4-(tert-butyl) phenyl)-10H-phenoxazine, 1.93 g (7.6 mmol) of bis(pinacolato)diboron, 0.12 g (0.101 mmol) of tetrakis (triphenylphosphine)palladium, 1 g (10.14 mmol) of potassium acetate, and 40 ml of 1,4-dioxane was degassed and placed under nitrogen, and then heated at 90° C. for 16 h. After the reaction finished, the mixture was allowed to cool to room temperature. The organic phase was separated, washed with ethyl acetate and water, and then dried with magnesium sulfate. The solvent was removed in vacuo. The residue was purified by column chromatography on silica to give product (1.62 g, 73%) as an off-white solid.

Synthesis of Intermediate Q

A mixture of 0.53 g (3.33 mmole) of 2-Bromopyridine, 1.62 g (3.67 mmole) of Intermediate P, 0.08 g (0.067 mmole) of Pd(PPh$_3$)$_4$, 0.05 g (0.134 mmole) of 2-Dicyclophosphine-2',6'-dimethoxy-biphenyl, 0.7 g (6.6 mmole) of Na$_2$CO$_3$, 15 ml of Toluene and 5 ml of Ethanol, and 3.5 ml of H$_2$O was placed under nitrogen, and then heated at 80° C. while stirring for 16 h. After the reaction finished, the mixture was allowed to cool to room temperature. The solution was extracted with 20 ml of ethyl acetate (3 times) and then 50 ml of water. The organic layer was dried with anhydrous magnesium sulfate and then the solvent was evaporated under reduced pressure. The residue was purified by column chromatography on silica to give product (1.04 g, 79%) as a light yellow solid.

Synthesis of Intermediate R

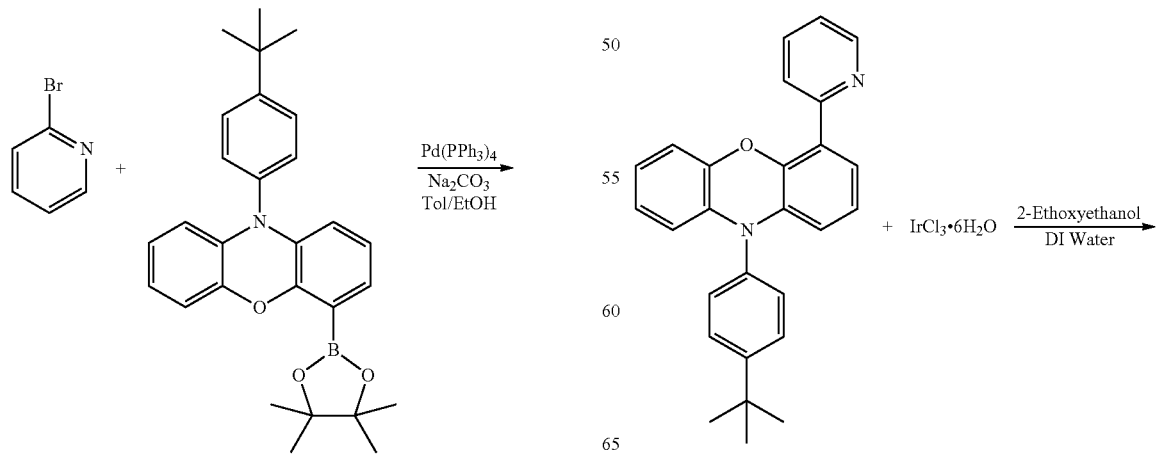

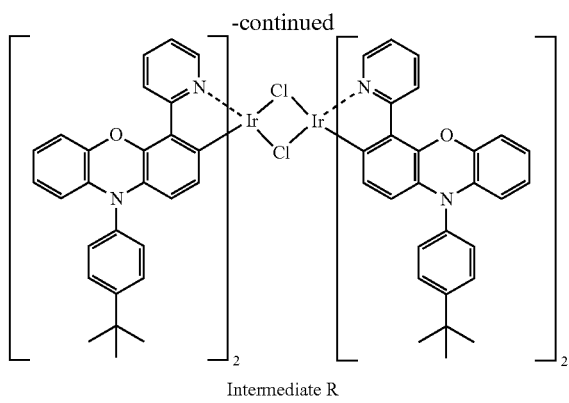

Intermediate R

A mixture of 1.04 g (2.65 mmol) of Intermediate Q, 0.41 g (1.54 mmol) of Iridium(III) chloride hydrate, 15 ml of 2-Ethoxyethanol and 5.5 ml of DI water was degassed and placed under nitrogen, and then heated at 100° C. while stirring for 16 h. After the reaction finished, the mixture was allowed to cool to room temperature. The precipitated product was filtered with suction and then washed with water. Afterwards, 30 ml of water was added and stirred for 1 hr, and then the precipitated product was filtered with suction. Subsequently, 20 ml of EtOH was added and stirred for 1 hr, and then the precipitated product was filtered with suction to give 2.19 g (82%) of red product.

Synthesis of EX202

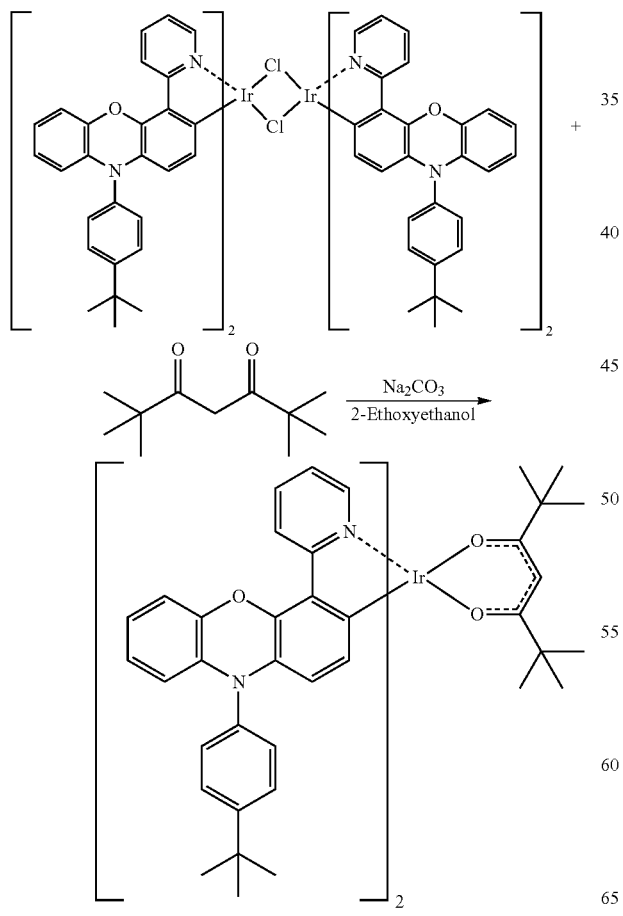

A mixture of 2.19 g (1.08 mmol) of Intermediate R, 2 g (10.8 mmol) of 2,2,6,6-tetramethylheptane-3,5-dione, 2.3 g (21.6 mmol) of sodium carbonate, and 50 ml of 2-ethoxyethanol was degassed and placed under nitrogen, and then heated at 80° C. while stirring for 16 h. After the reaction finished, the mixture was allowed to cool to room temperature. The precipitated product was filtered with suction and then washed with water. Afterwards, 100 ml of water was added and stirred for 1 hr, and then the precipitated product was filtered with suction. Subsequently, 10 ml of EtOH was added and stirred for 1 hr, and then the precipitated product was filtered with suction to give 1.56 g (62%) of red product. MS(m/z, EI$^+$):1161.49

General Method of Producing Organic EL Device

ITO-coated glasses with 9-12 ohm/square in resistance and 120-160 nm in thickness are provided (hereinafter ITO substrate) and cleaned in a number of cleaning steps in an ultrasonic bath (e.g. detergent, deionized water). Before vapor deposition of the organic layers, cleaned ITO substrates are further treated by UV and ozone. All pre-treatment processes for ITO substrate are under clean room (class 100).

The organic layers are applied onto the ITO substrate in order by vapor deposition in a high-vacuum unit ($10^{-7}$ Torr), such as: resistively heated quartz boats. The thickness of the respective layer and the vapor deposition rate (0.1-0.3 nm/sec) are precisely monitored or set with the aid of a quartz-crystal monitor. It is also possible, as described above, for individual layers to consist of more than one compound, e.g. a host material doped with a dopant material in the light emitting layer. This is successfully achieved by co-vaporization from two or more sources, which means the iridium complex of the present invention is thermally stable.

Dipyrazino[2,3-f:2,3-]quinoxaline-2,3,6,7,10,11-hexacarbonitrile (HAT-CN) is used to form the hole injection layer; N,N-bis(naphthalene-1-yl)-N,N-bis(phenyl)-benzidine (NPB) is used to form the hole transporting layer; and N-(biphenyl-4-yl)-9,9-dimethyl-N-(4'-phenyl-biphenyl-4-yl)-9H-fluoren-2-amine (EB2) is used to form the electron blocking layer. The chemical structures of the materials mentioned above are shown below:

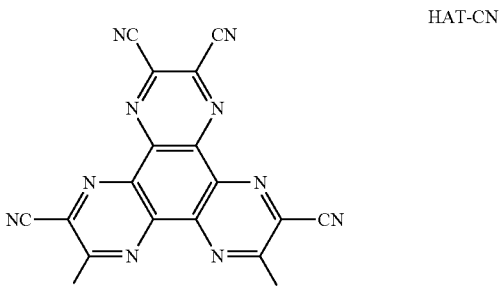

HAT-CN

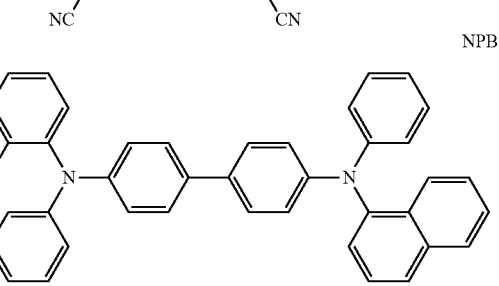

NPB

EB2

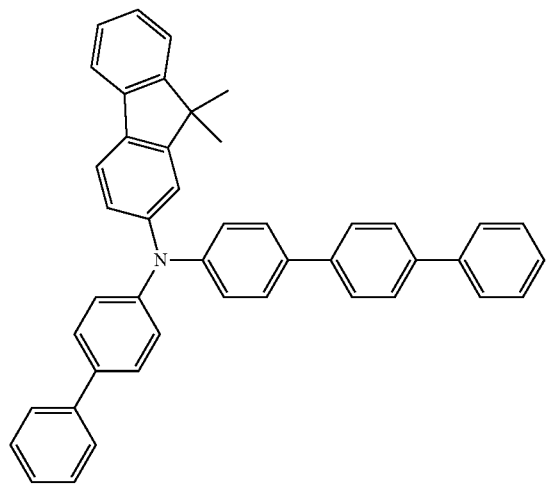

In the present invention, the host material may be selected from the following compounds and a combination thereof:

H2

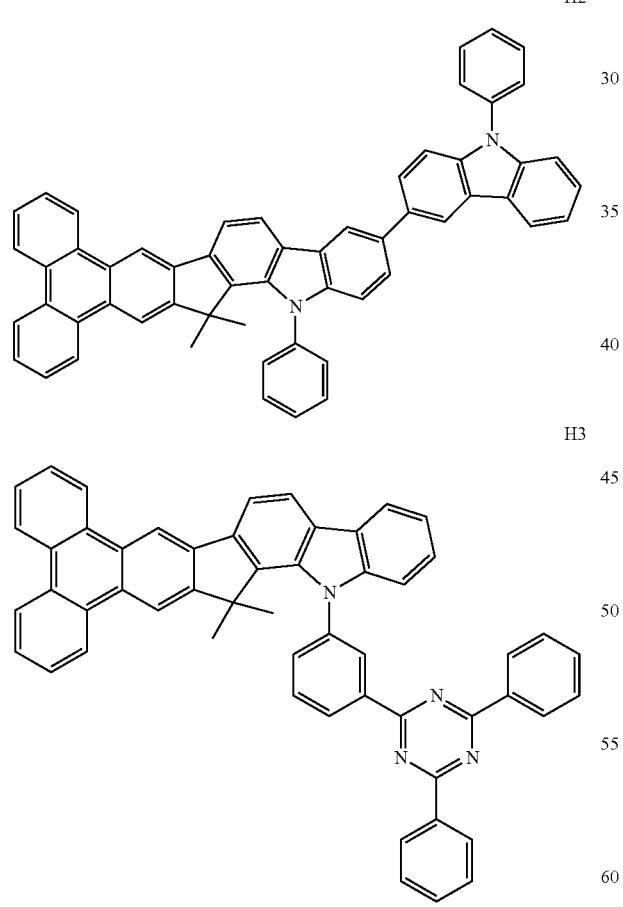

H3

The organic iridium complexes are widely used as phosphorescent dopant for light emitting layer, and Ir(2-phq)$_2$(acac), Ir(ppy)$_3$, FIrpic, and YD, as shown below, are used as phosphorescent dopant of light emitting layer for comparison in the device test.

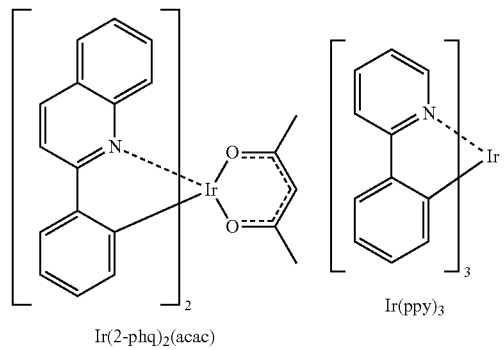

Ir(2-phq)$_2$(acac)    Ir(ppy)$_3$

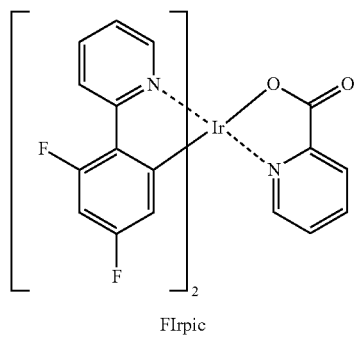

FIrpic

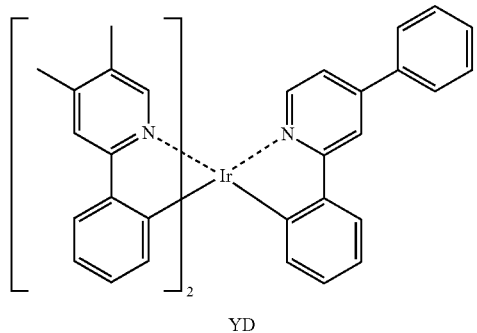

YD

The chemical structures of the exemplary iridium complexes of the present invention for producing exemplary organic EL devices in this invention are shown as follows:

EX1

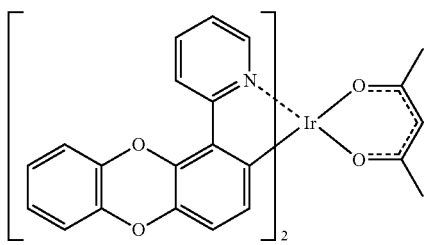

EX5
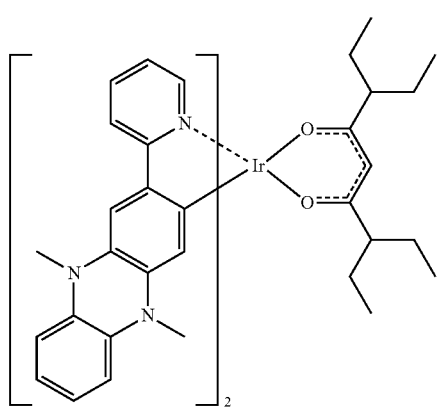
EX13
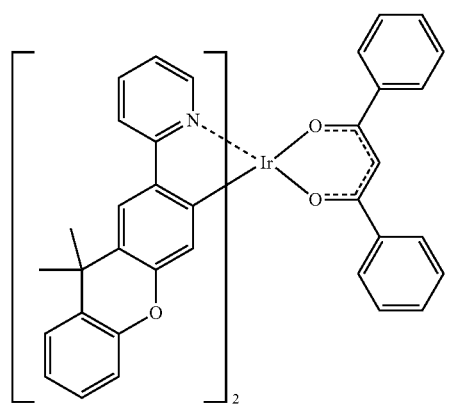
EX14
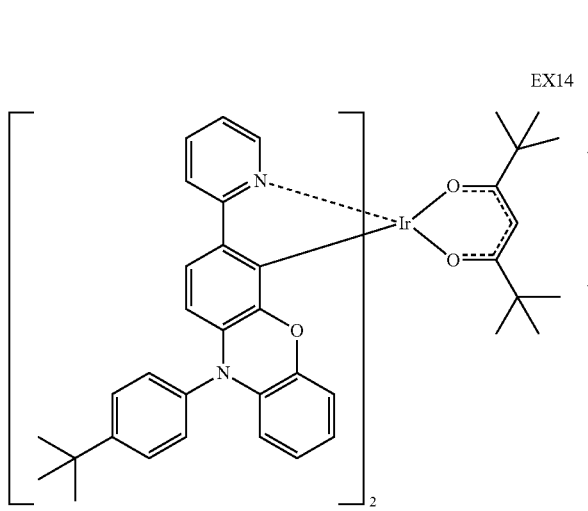
EX33
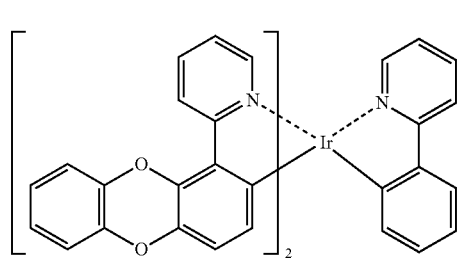
EX46
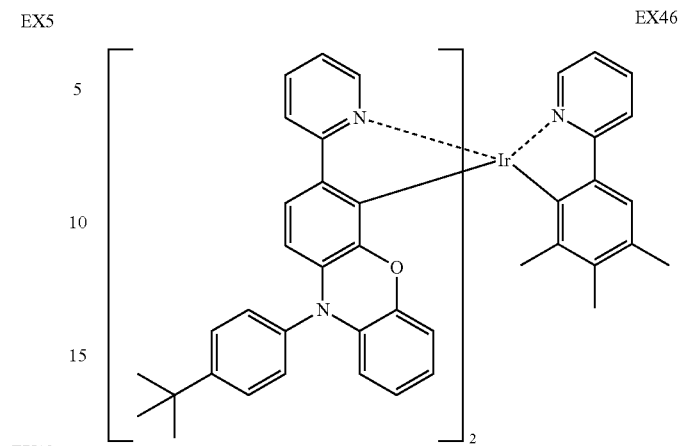
EX65
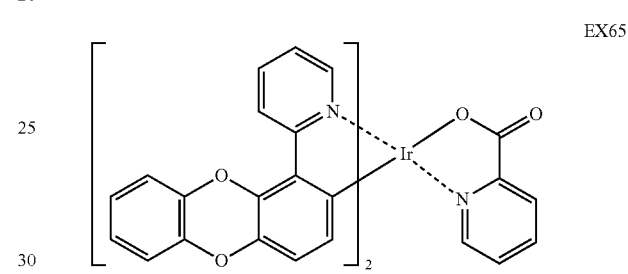
EX78
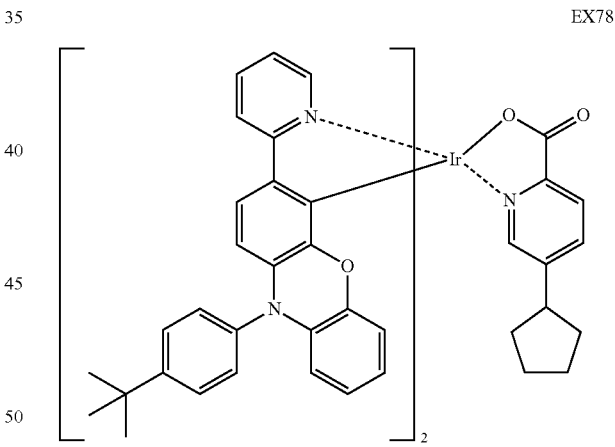
EX97
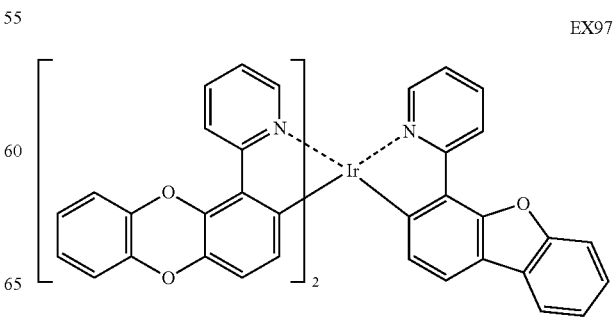

-continued
EX110
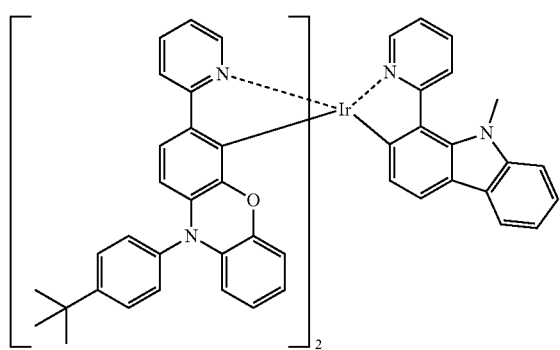
EX195
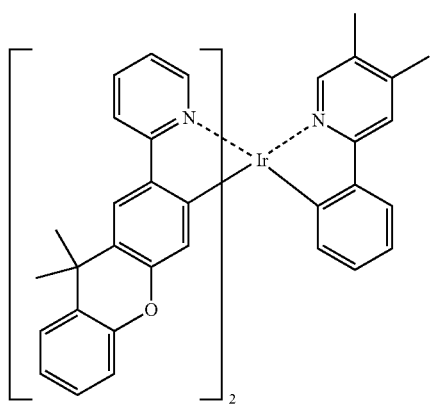
EX196
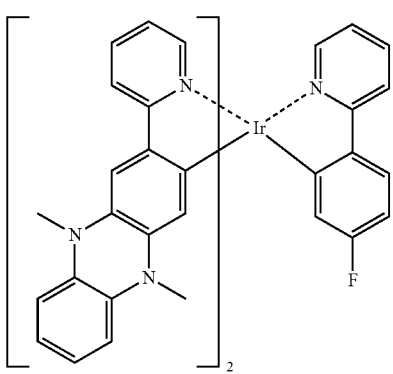
EX197
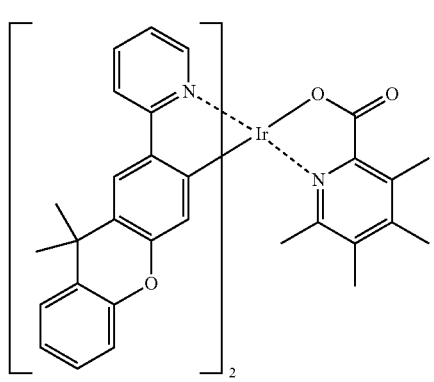
-continued
EX198
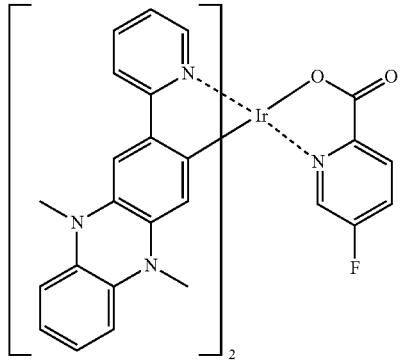
EX199
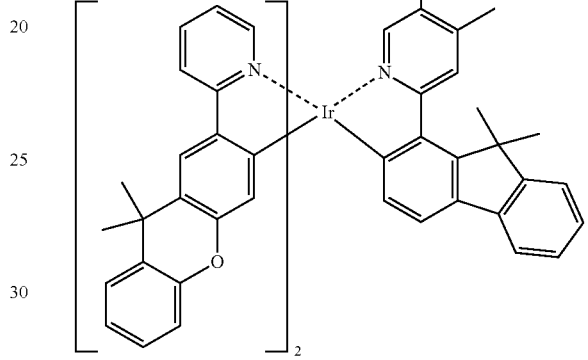
EX200
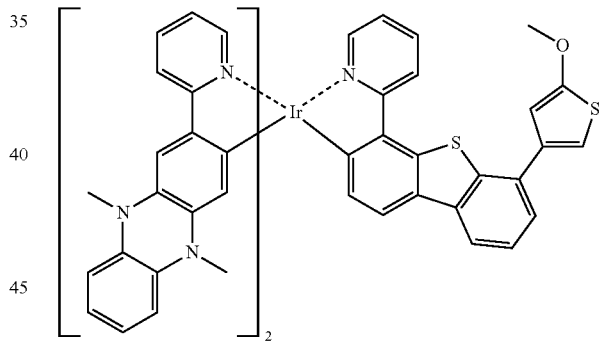
EX202
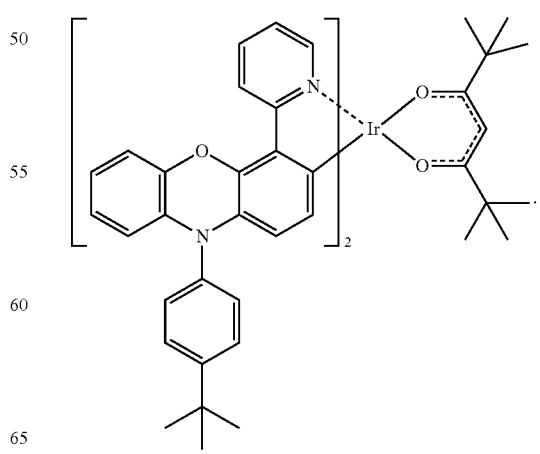

HB3 is used as hole blocking material (HBM), and 2-(10,10-dimethyl-10H-indeno[2,1-b]triphenylen-12-yl)-4,6-diphenyl-1,3,5-triazine (ET2) is used as electron transporting material to co-deposit with 8-hydroxyquinolato-lithium (LiQ) in organic EL devices. The chemical structures of the materials mentioned above are shown below:

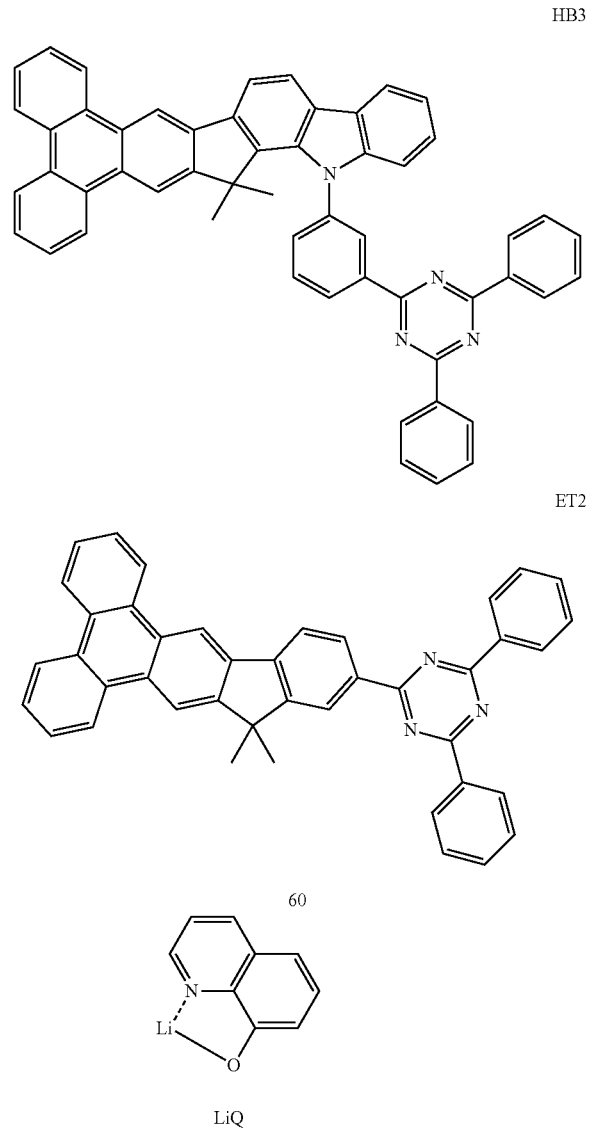

A typical organic EL device consists of low work function metals, such as Al, Mg, Ca, Li and K, as the cathode, and the low work function metals can help electrons injecting the electron transporting layer from cathode. In addition, for reducing the electron injection barrier and improving the organic EL device performance, a thin-film electron injecting layer is introduced between the cathode and the electron transporting layer. Conventional materials of electron injecting layer are metal halide or metal oxide with low work function, such as: LiF, LiQ, MgO, or $Li_2O$. On the other hand, after the organic EL device fabrication, EL spectra and CIE coordination are measured by using a PR650 spectra scan spectrometer. Furthermore, the current/voltage, luminescence/voltage and yield/voltage characteristics are taken with a Keithley 2400 programmable voltage-current source.

The above-mentioned apparatuses are operated at room temperature (about 25° C.) and under atmospheric pressure.

Example 18

Using a procedure analogous to the above mentioned general method, organic EL devices emitting phosphorescence and having the following device structure (as shown in the FIGURE) were produced: ITO/HAT-CN(20 nm)/NPB (110 nm)/EB2(5 nm)/H2 and H3 doped with 15% phosphorescent dopant (30 nm)/HB3(10 nm)/ET2 doped with 40% LiQ(35 nm)/LiQ(1 nm)/Al(160 nm). In the device illustrated in the FIGURE, the hole injection layer 20 is deposited onto the transparent electrode 10, the hole transport layer 30 is deposited onto the hole injection layer 20, the electron blocking layer 40 is deposited onto the hole transport layer 30, the phosphorescence emitting layer 50 is deposited onto the electron blocking layer 40, the hole blocking layer 60 is deposited onto the phosphorescence emitting layer 50, the electron transport layer 70 is deposited onto the hole blocking layer 60, the electron injection layer 80 is deposited onto the electron transport layer 70, and the metal electrode 90 is deposited onto the electron injection layer 80. The I-V-B (at 1000 nits) and half-life time test reports of these organic EL devices are summarized in Table 1 below. The half-life time is defined as the time the initial luminance of 1000 $cd/m^2$ has dropped to half.

TABLE 1

| Host | Dopant | Voltage (V) | Efficiency (cd/A) | Color | Half-life time (hour) |
|---|---|---|---|---|---|
| H2 + H3 | Ir(2-phq)$_2$(acac) | 4.5 | 18 | Red | 430 |
| H2 + H3 | EX1 | 4.1 | 22 | Red | 720 |
| H2 + H3 | EX5 | 4.2 | 21 | Red | 750 |
| H2 + H3 | EX13 | 4.0 | 23 | Red | 730 |
| H2 + H3 | EX14 | 4.2 | 22 | Red | 750 |
| H2 + H3 | EX202 | 4.1 | 23 | Red | 770 |
| H2 + H3 | Ir(ppy)$_3$ | 4.3 | 45 | Green | 500 |
| H2 + H3 | EX33 | 4.1 | 47 | Green | 700 |
| H2 + H3 | EX46 | 4.1 | 50 | Green | 710 |
| H2 + H3 | EX195 | 4.0 | 47 | Green | 720 |
| H2 + H3 | EX196 | 4.2 | 49 | Green | 700 |
| H2 + H3 | FIrpic | 4.5 | 35 | Blue | 420 |
| H2 + H3 | EX65 | 4.3 | 39 | Blue | 500 |
| H2 + H3 | EX78 | 4.4 | 38 | Blue | 510 |
| H2 + H3 | EX197 | 4.3 | 40 | Blue | 550 |
| H2 + H3 | EX198 | 4.4 | 38 | Blue | 500 |
| H2 + H3 | YD | 4.8 | 38 | Yellow | 310 |
| H2 + H3 | EX97 | 4.6 | 42 | Yellow | 500 |
| H2 + H3 | EX110 | 4.7 | 43 | Yellow | 520 |
| H2 + H3 | EX199 | 4.5 | 45 | Yellow | 520 |
| H2 + H3 | EX200 | 4.6 | 45 | Yellow | 510 |

In Table 1, we show that the iridium complex of formula (1) used as the dopant material of light emitting layer for organic EL device of the present invention exhibits better performance than the prior art organic EL materials. More specifically, the organic EL devices of the present invention use the iridium complex of formula (1) as light emitting dopant material to collocate with the co-host material (i.e. H2 and H3), showing reduced power consumption, increased current efficiency, and extended half-life time.

To sum up, the present invention discloses an iridium complex, which can be used as the phosphorescent dopant material of the light emitting layer in organic EL devices. The mentioned iridium complex is represented by the following formula (1):

Formula (1)

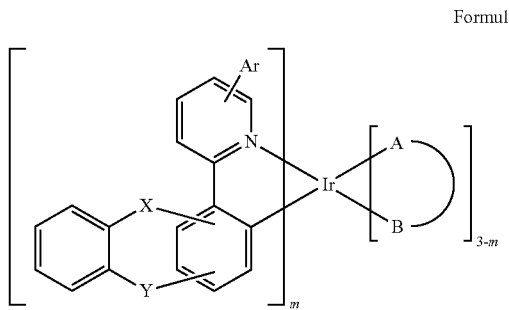

wherein A-B represents a bidentate ligand; Ar represents a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, a substituted or unsubstituted heteroaryl group having 3 to 30 carbon atoms, or a fused carbocyclic ring; m represents an integer of 1 or 2; X and Y are independently O, Se, $CR_1R_2$, $SiR_3R_4$, or $NR_5$; and $R_1$ to $R_5$ are independently a hydrogen atom, a halide, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, or a substituted or unsubstituted heteroaryl group having 3 to 30 carbon atoms.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. An iridium complex having the structure:

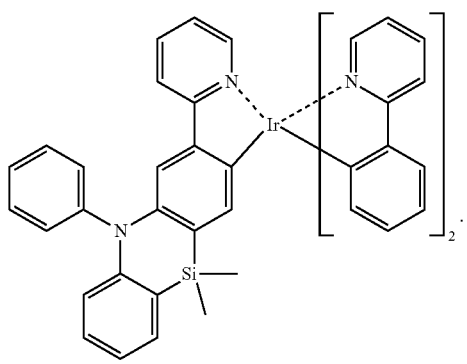

2. An iridium complex selected from the following compounds:

EX1

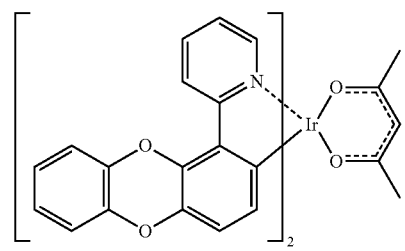

EX2

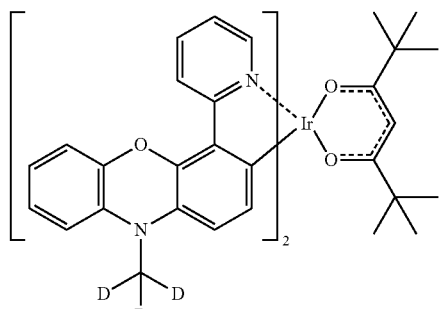

EX3

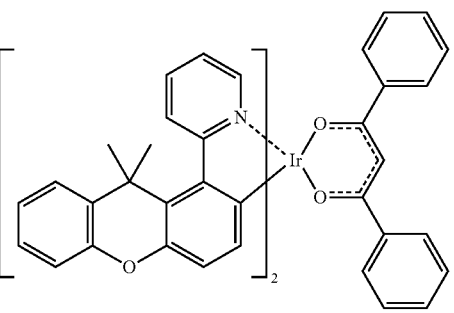

EX4

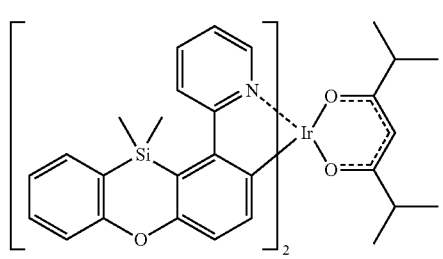

EX5

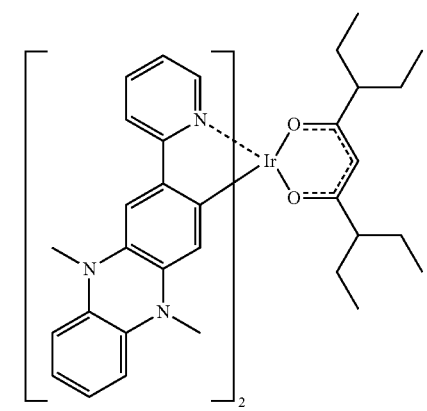

EX6
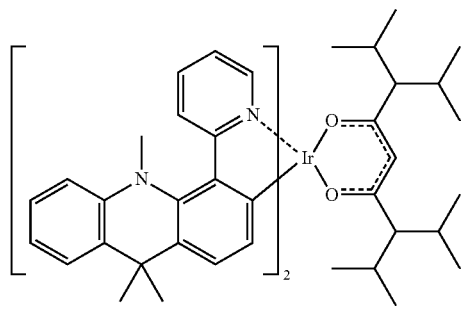
EX7
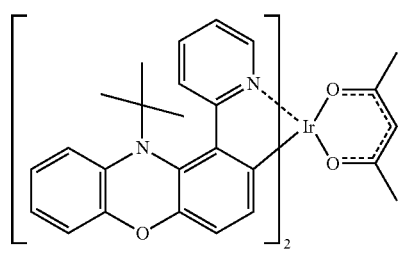
EX8
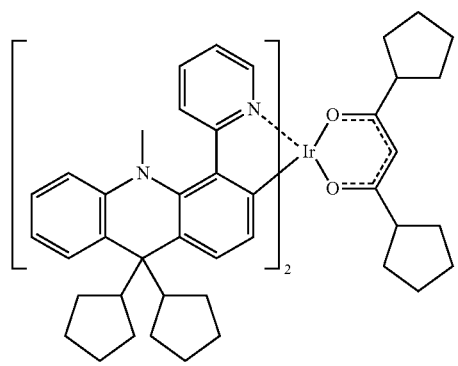
EX9
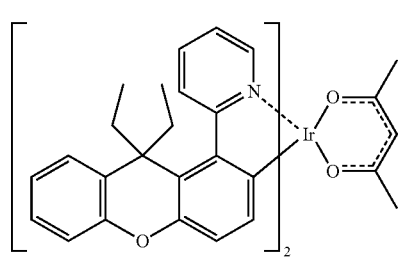
EX10
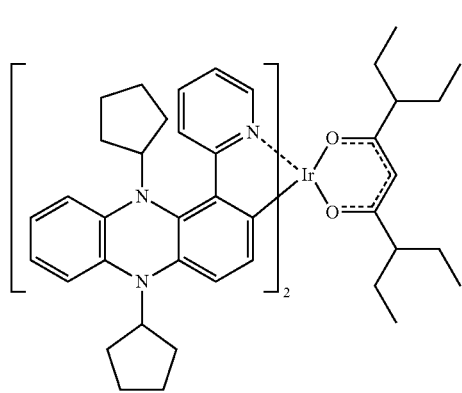
EX11
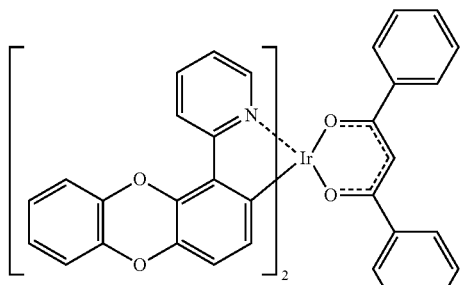
EX12
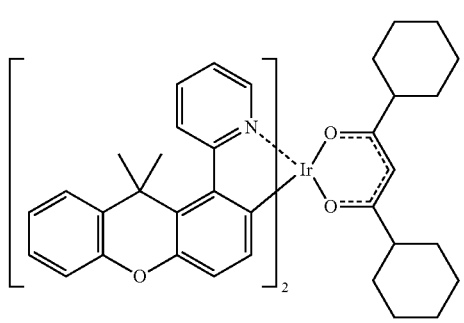
EX13
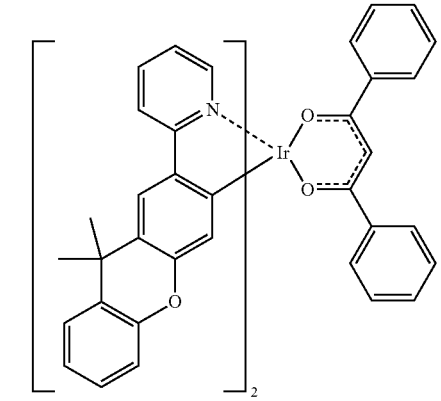
EX14
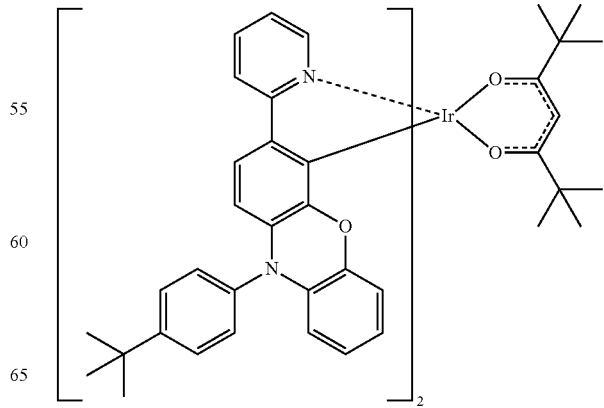

EX15
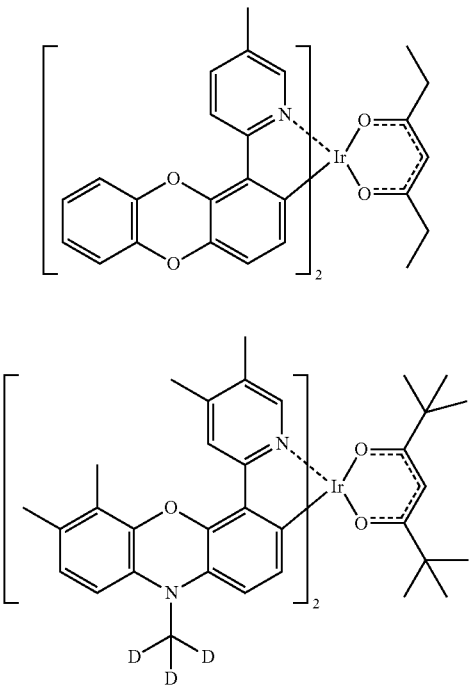
EX16
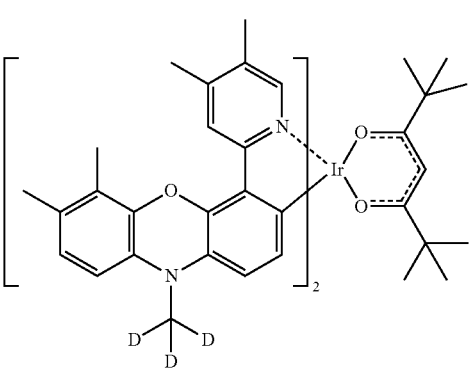
EX17
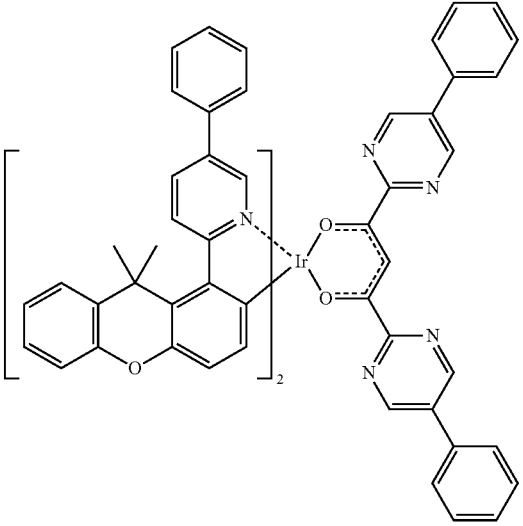
EX18
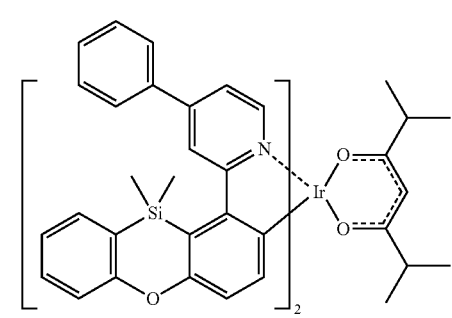
EX19
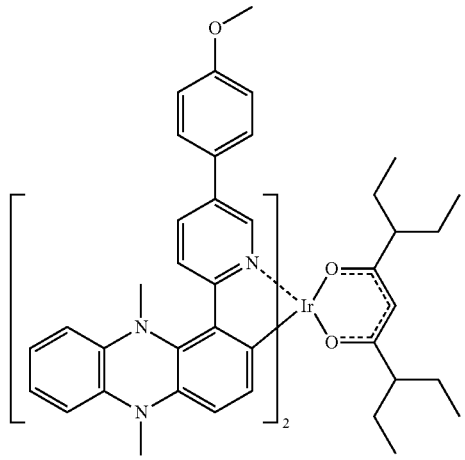
EX20
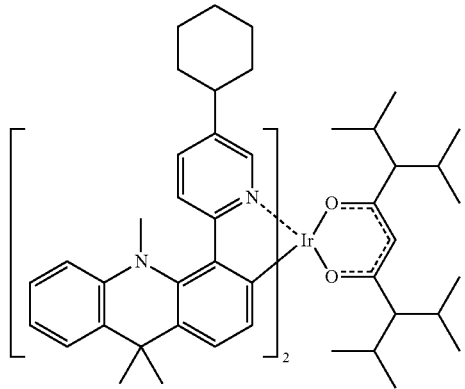
EX21
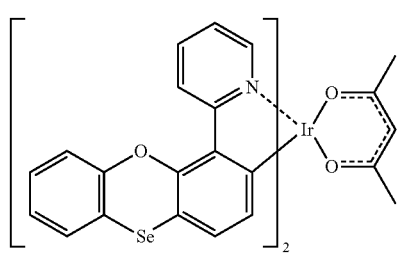
EX22
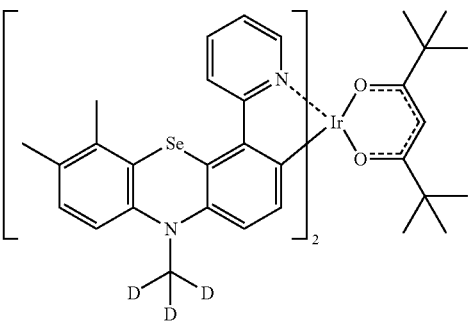

EX23
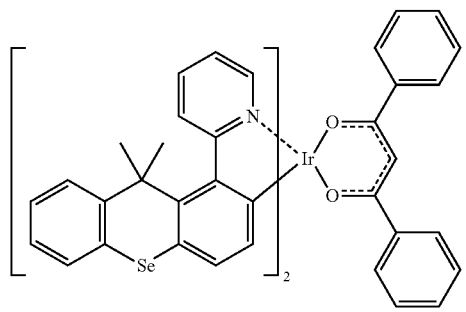
EX24
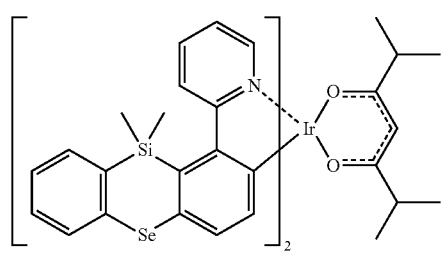
EX25
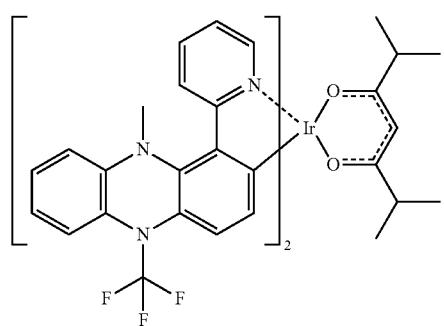
EX26
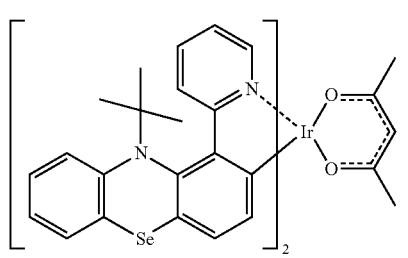
EX27
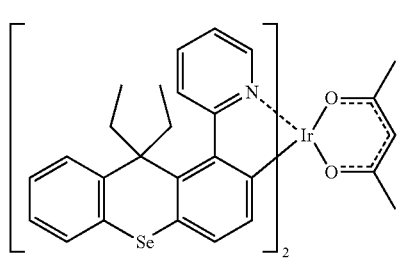
EX28
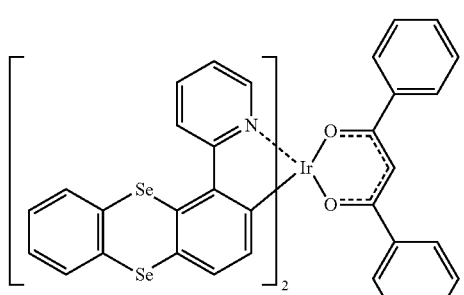
EX29
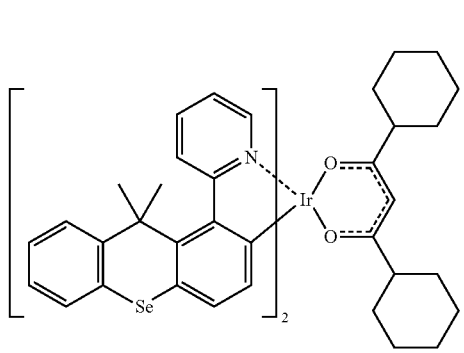
EX30
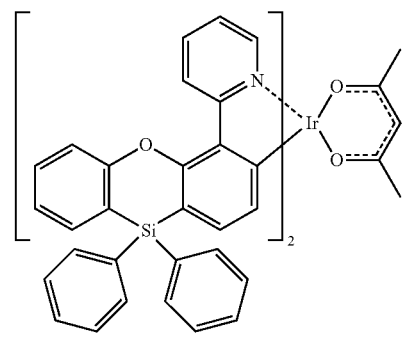
EX31
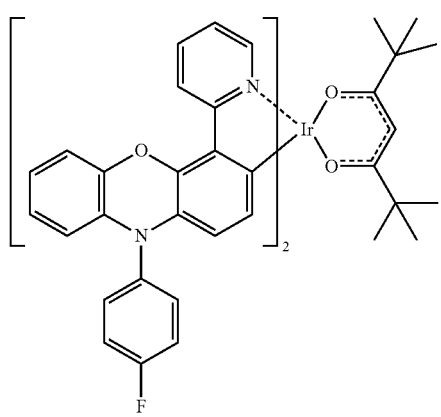

-continued
EX32
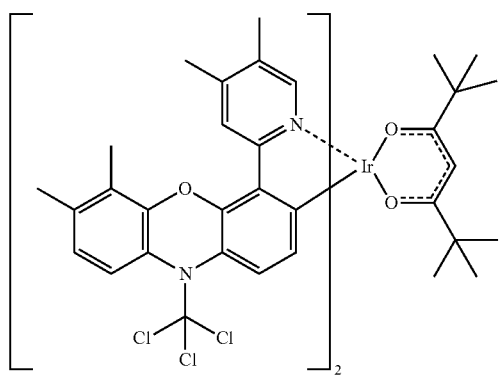
EX34
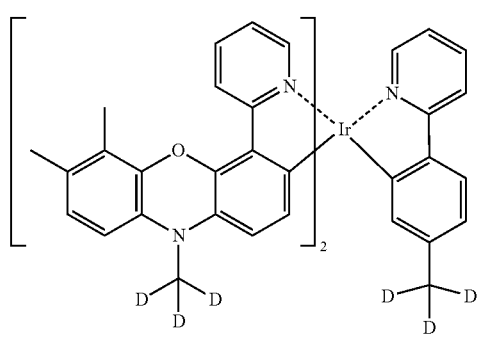
EX36
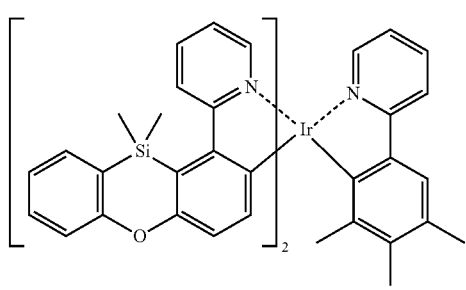
EX39
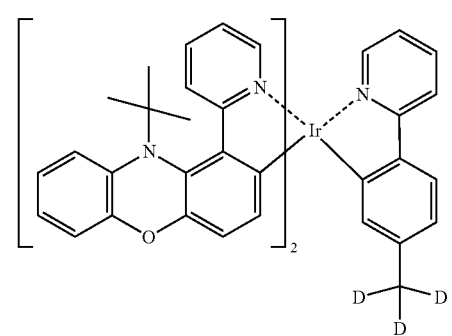
-continued
EX40
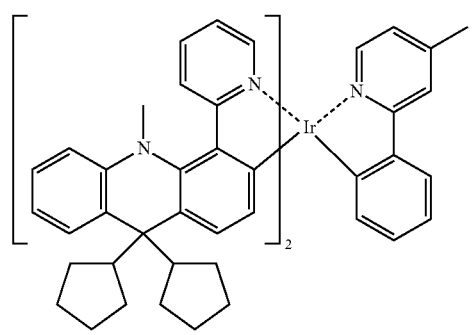
EX41
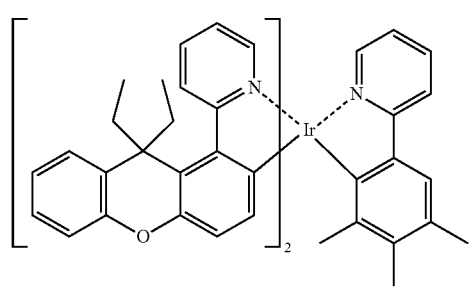
EX42
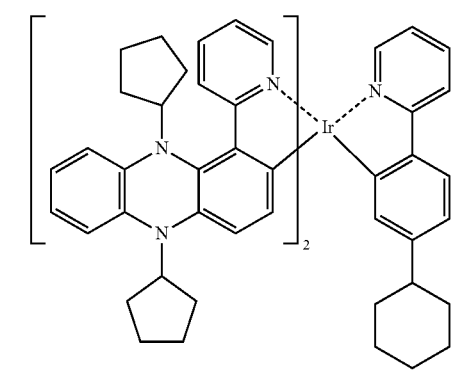
EX43
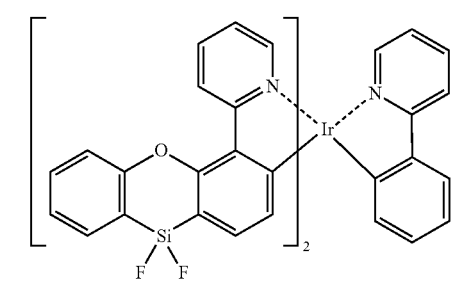

-continued
EX45
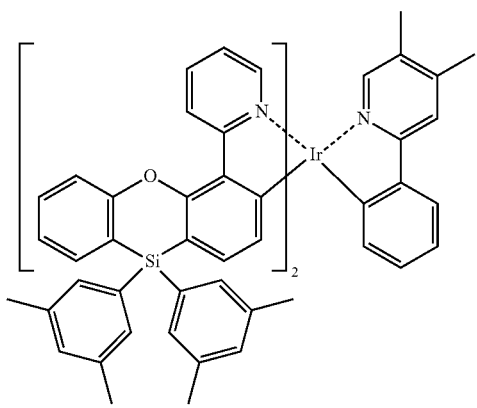
EX46
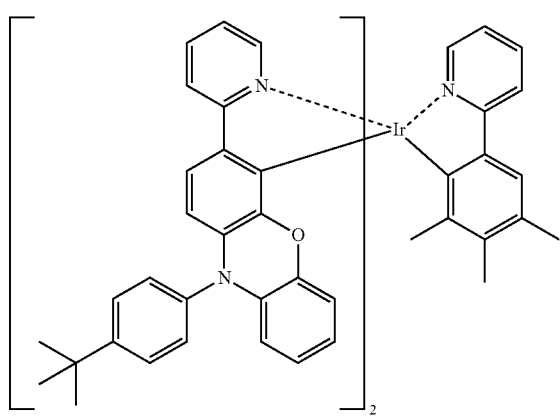
EX48
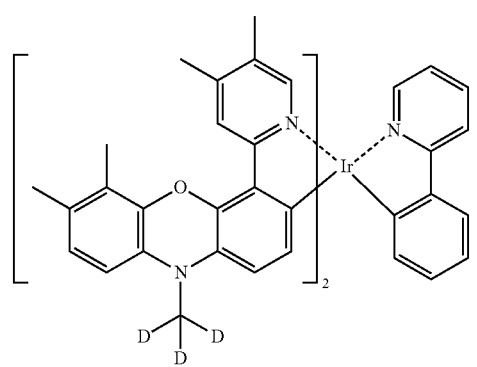
EX49
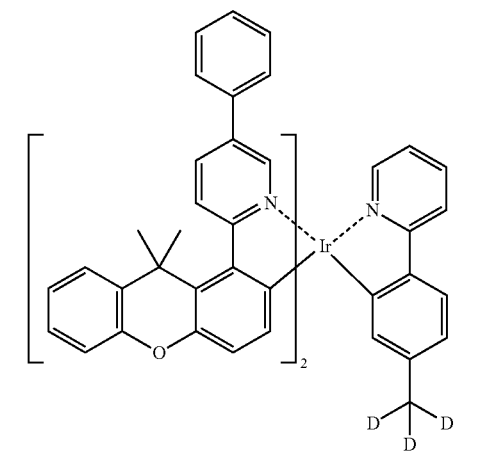
-continued
EX50
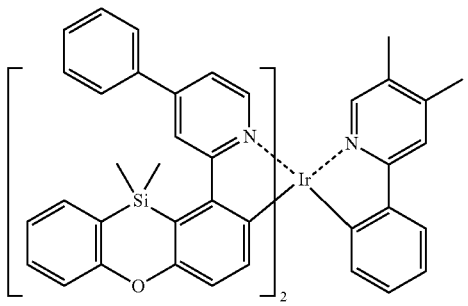
EX51
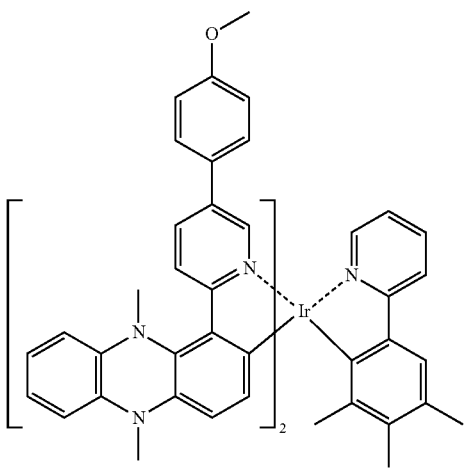
EX52
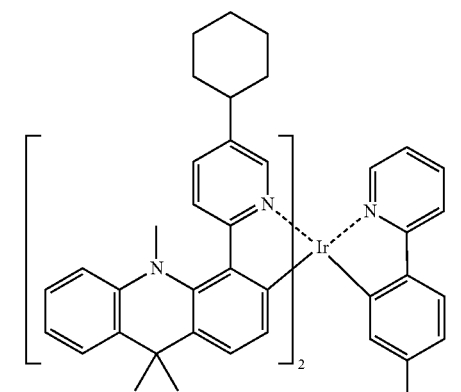
EX53
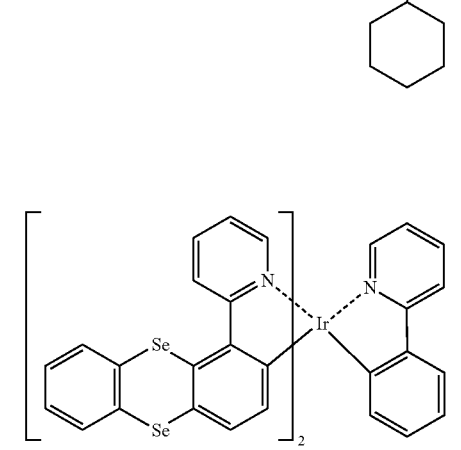

EX54
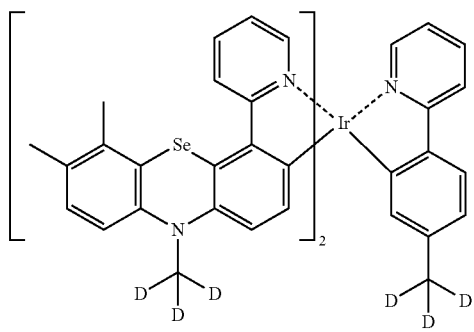
EX55
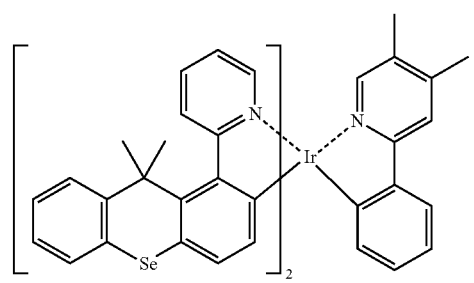
EX56
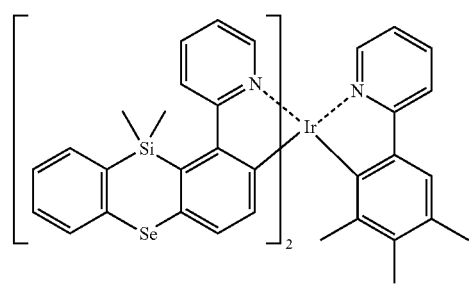
EX58
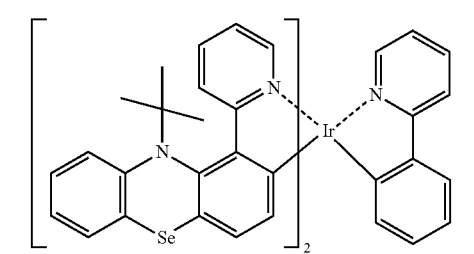
EX59
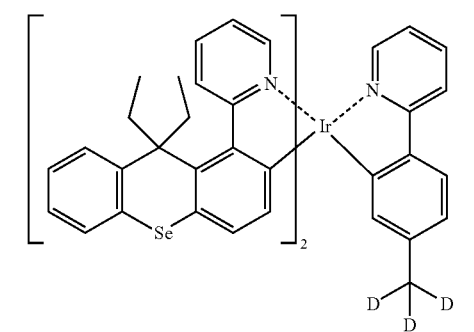
EX60
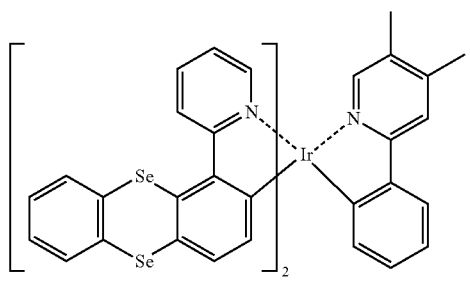
EX61
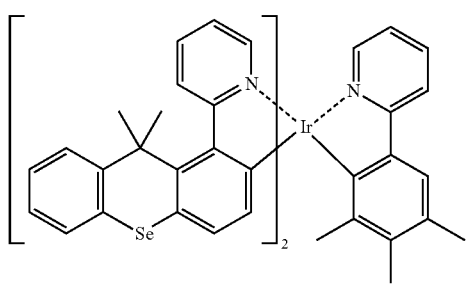
EX62
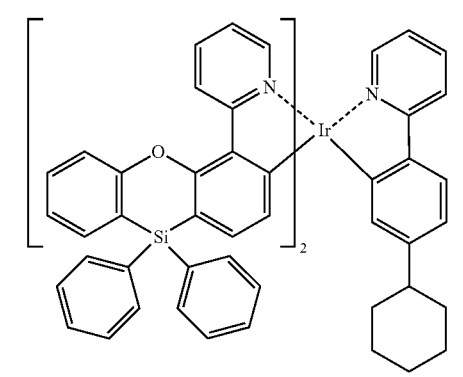
EX63
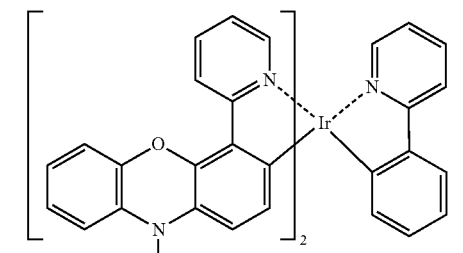
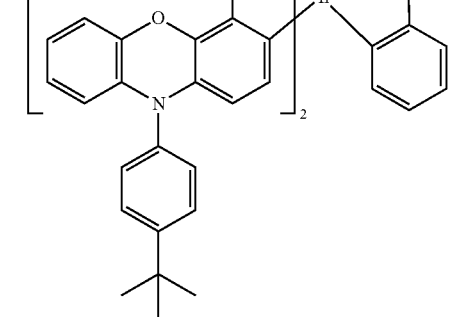

EX64
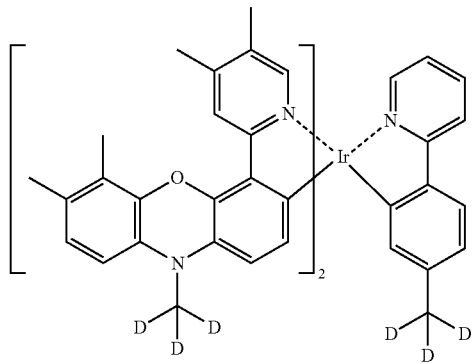
EX65
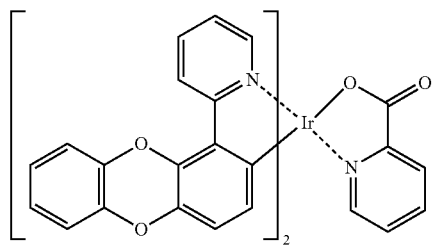
EX66
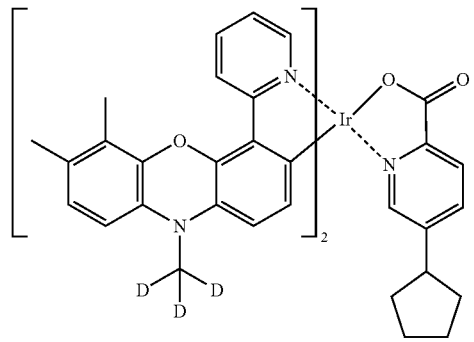
EX67
EX68
EX69
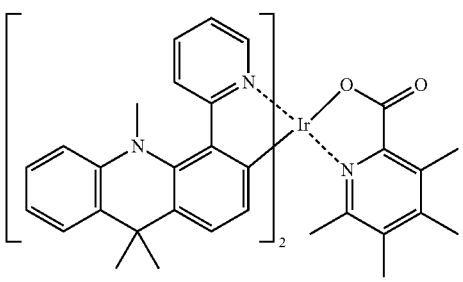
EX70
EX71
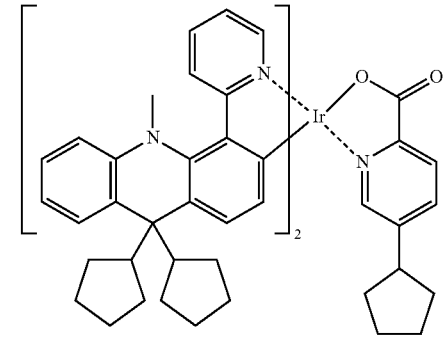
EX72
EX73
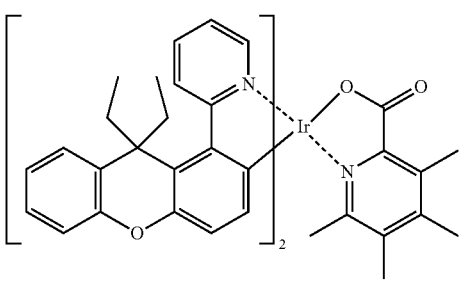

EX74
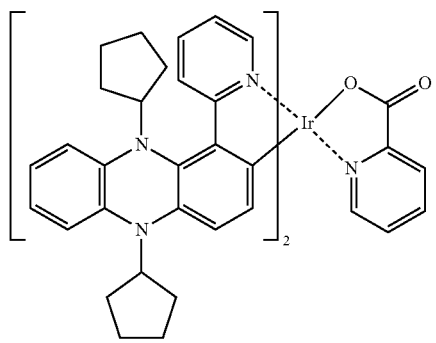
EX75
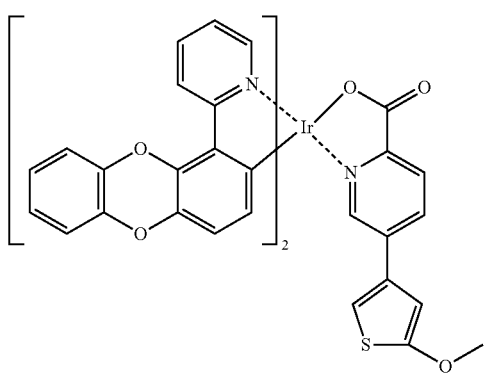
EX76
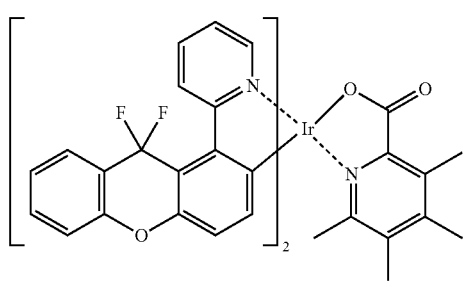
EX77
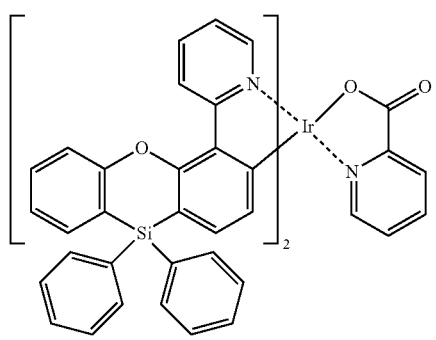
EX78
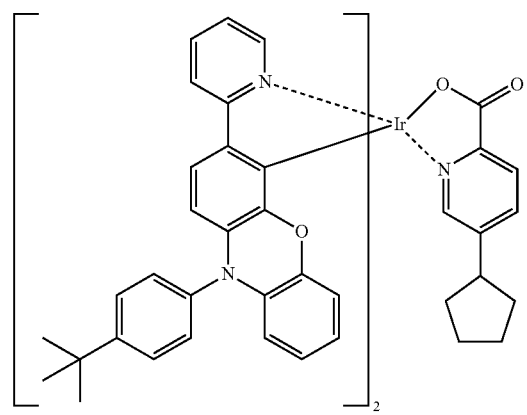
EX79
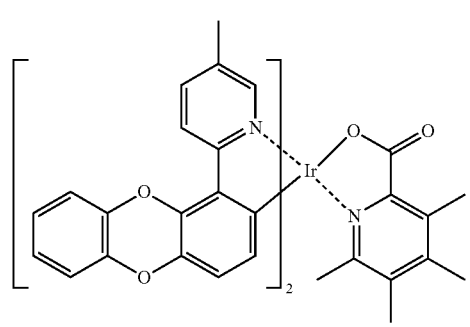
EX80
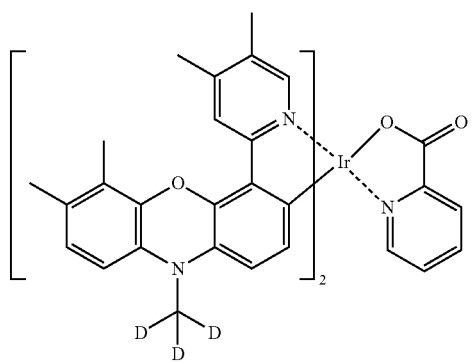
EX81
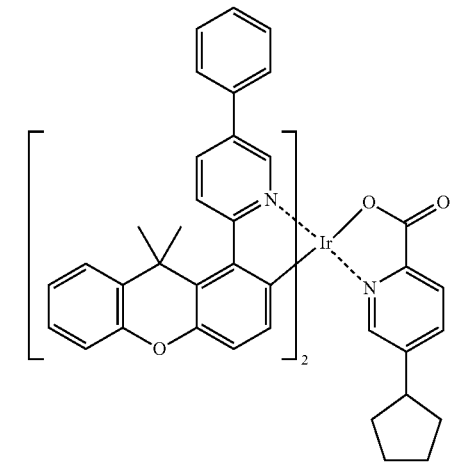

-continued
EX82
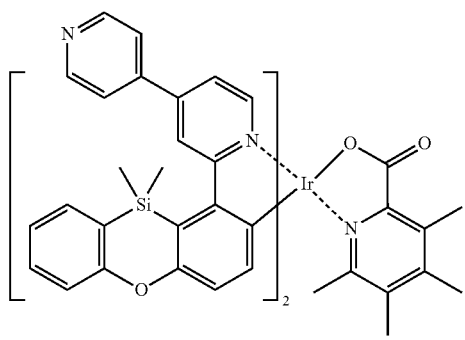
EX83
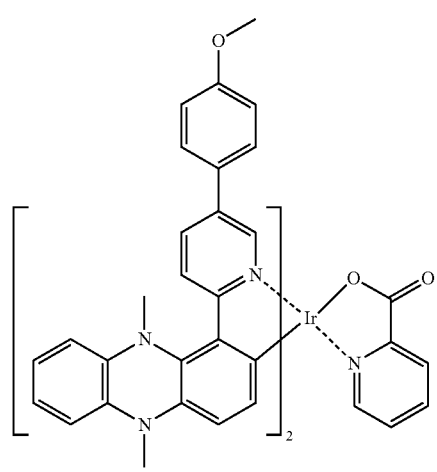
EX84
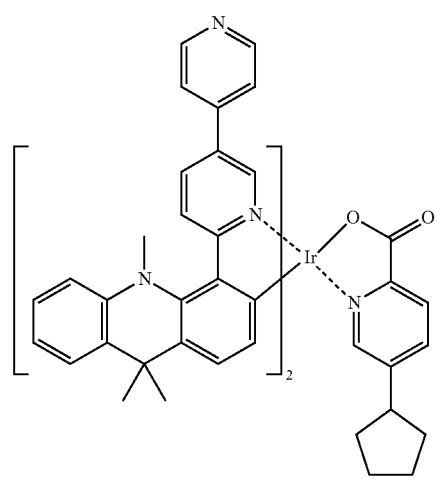
EX85
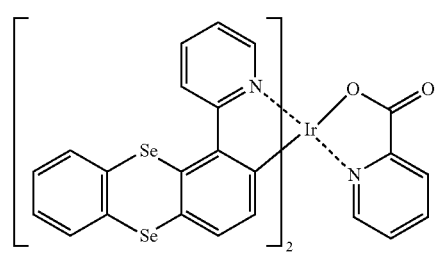
EX86
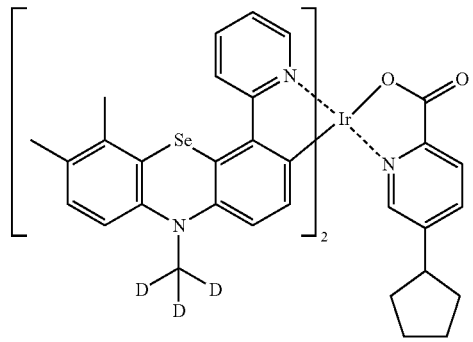
EX87
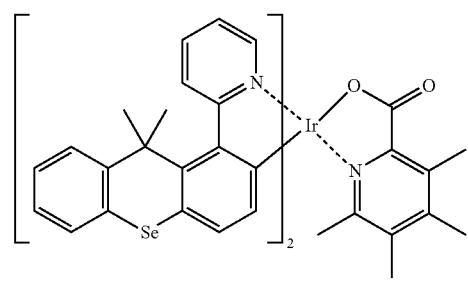
EX88
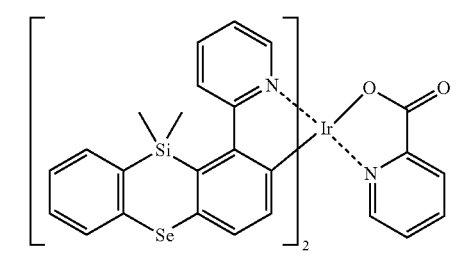
EX89
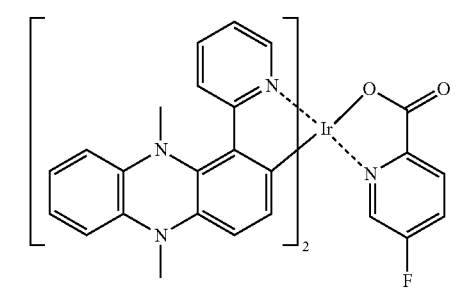
EX90
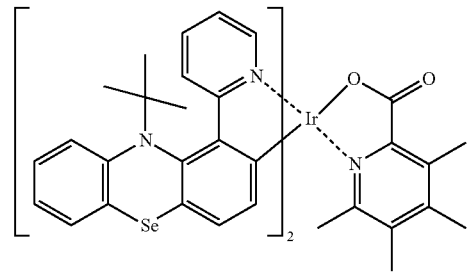

EX91
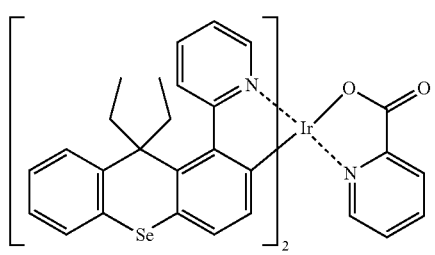
EX92
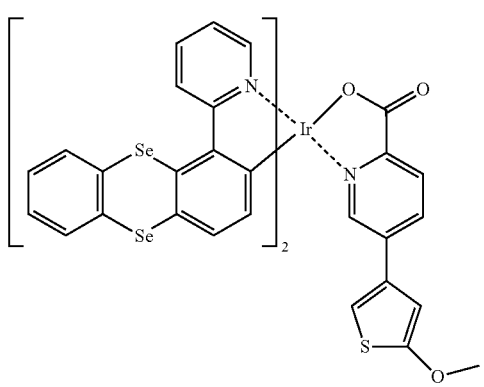
EX93
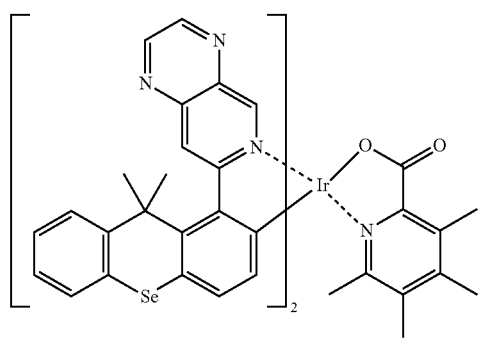
EX94
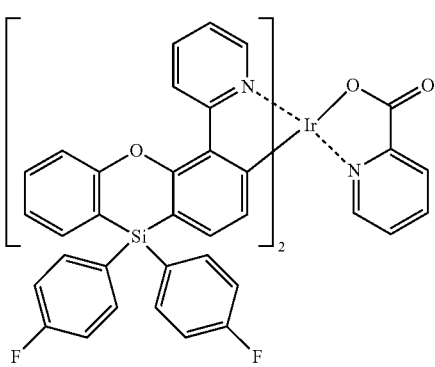
EX95
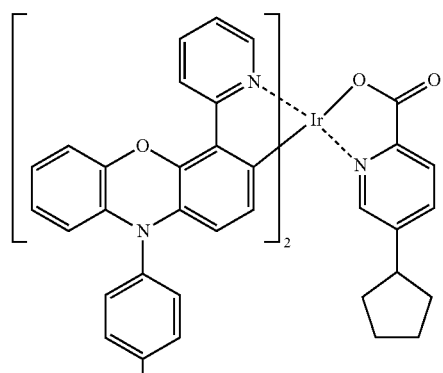
EX96
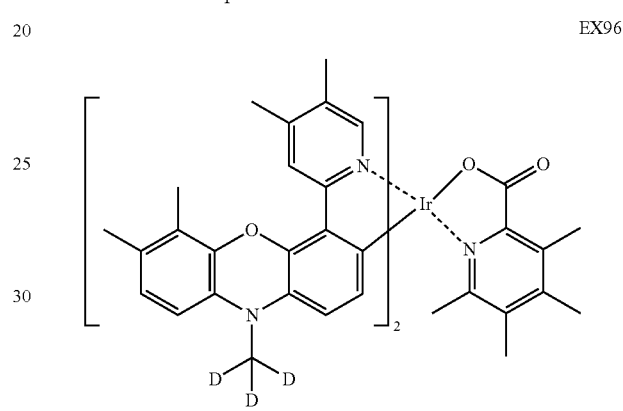
EX97
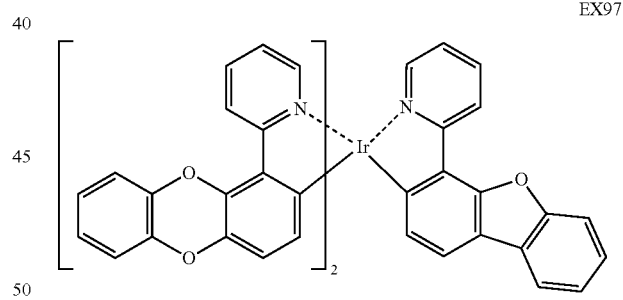
EX98
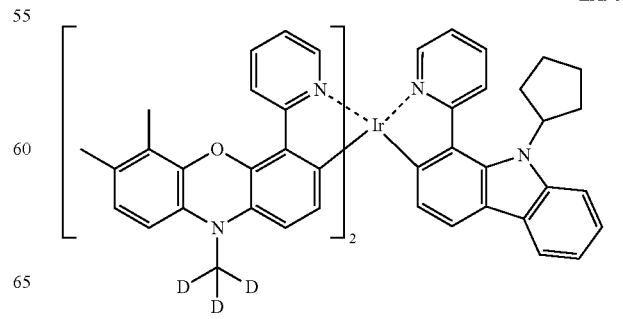

EX99
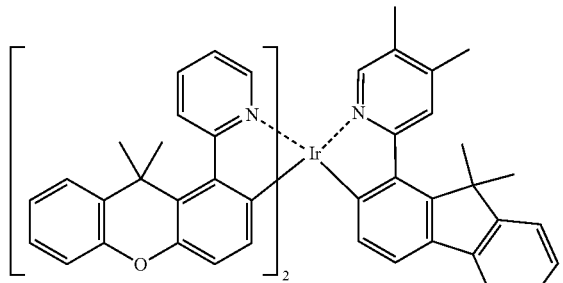
EX100
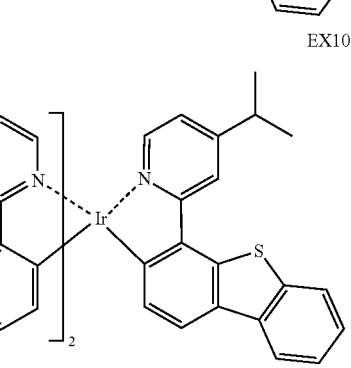
EX101
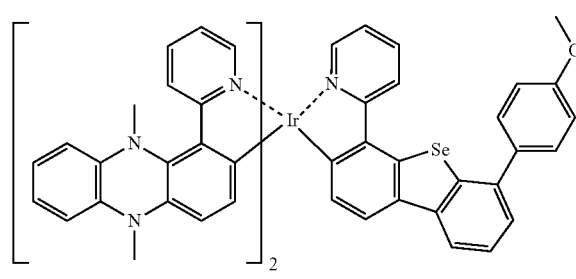
EX102
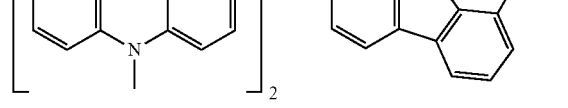
EX103
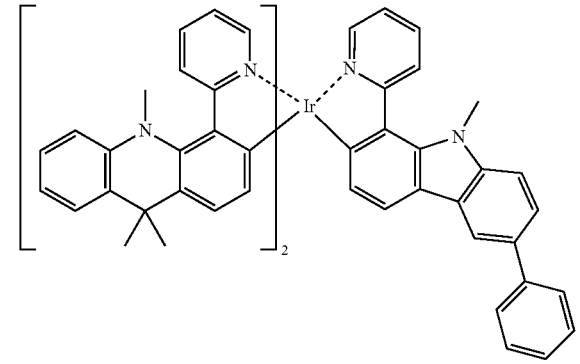
EX104
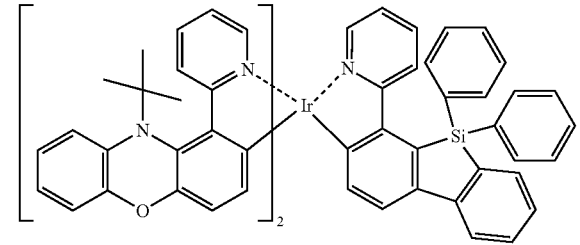
EX105
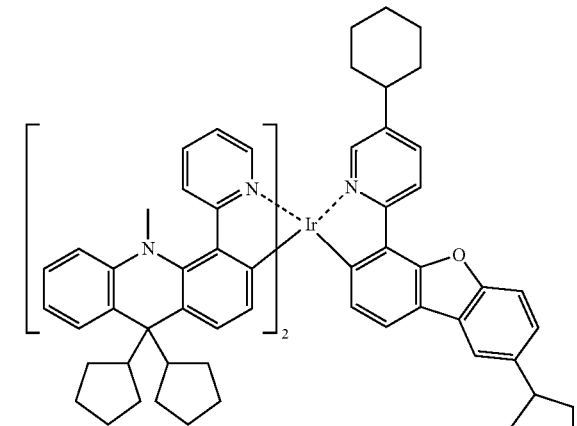
EX106
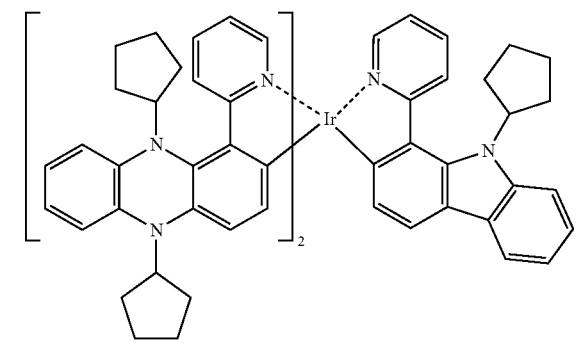
EX107

EX108
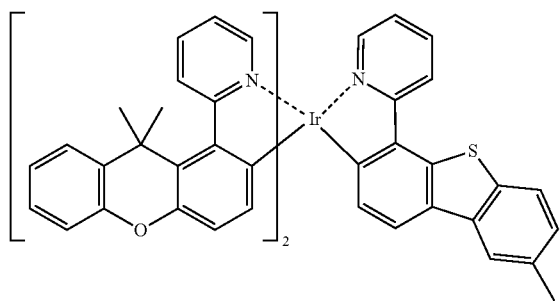
EX112
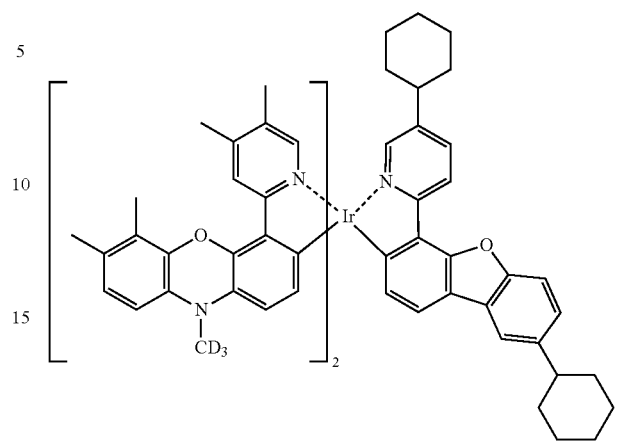
EX109
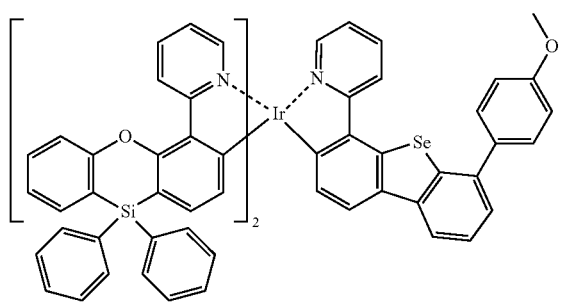
EX110
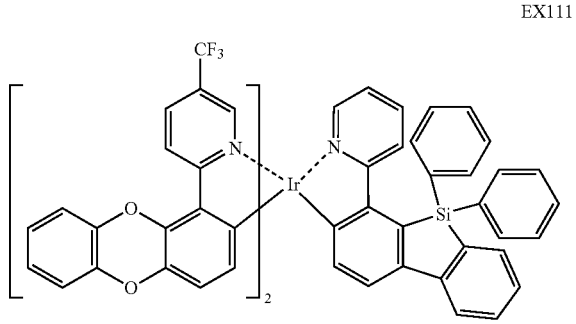
EX113
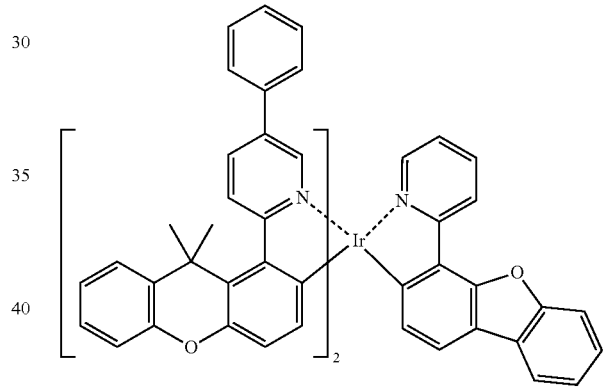
EX114
EX111
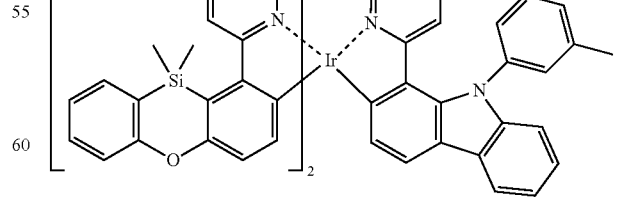

EX115
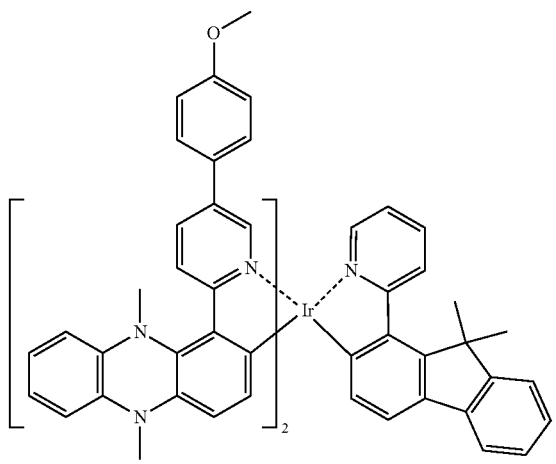
EX116
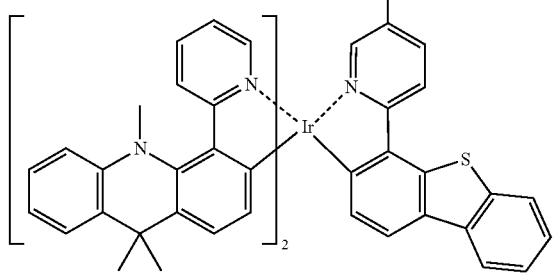
EX117
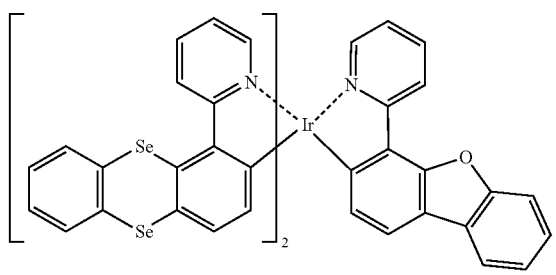
EX118
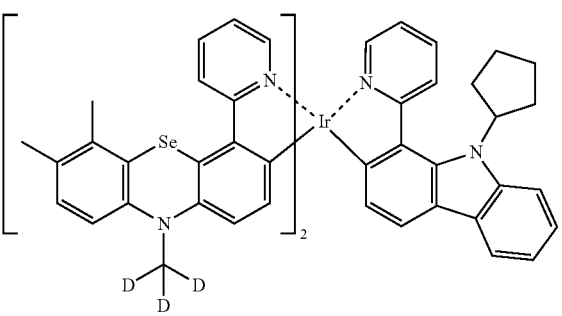
EX119
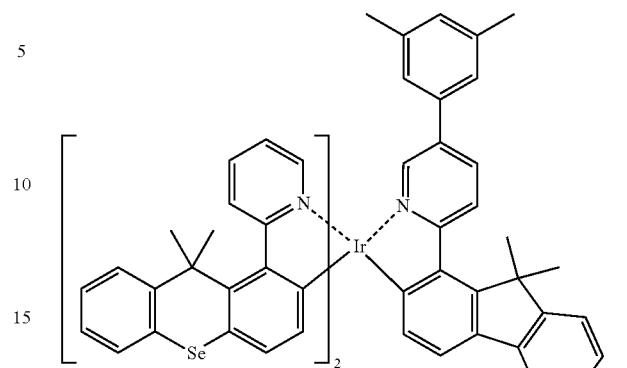
EX120
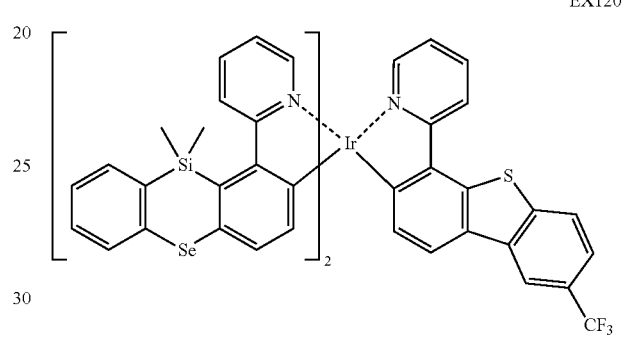
EX121
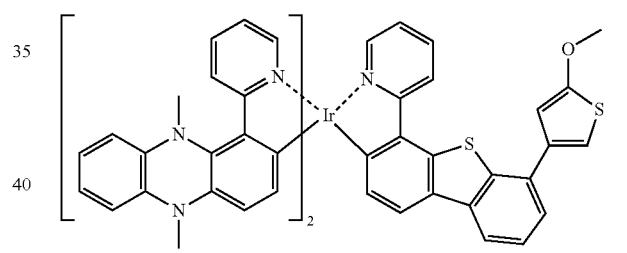
EX122
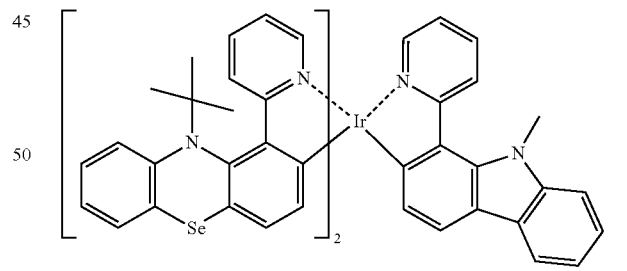
EX123
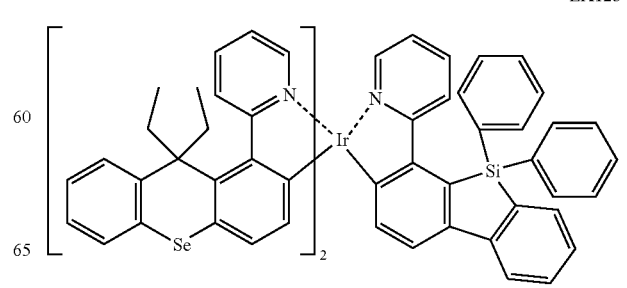

EX124
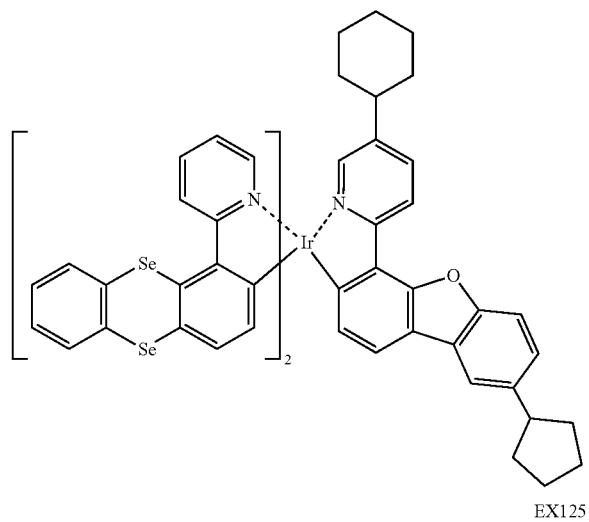
EX125
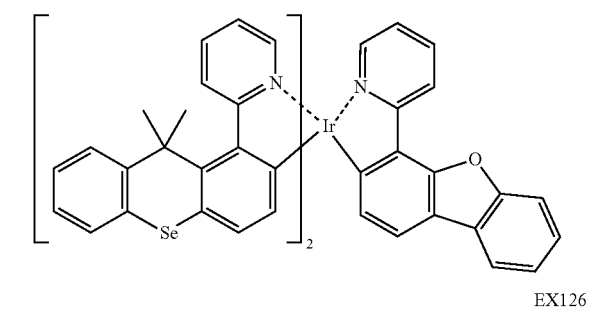
EX126
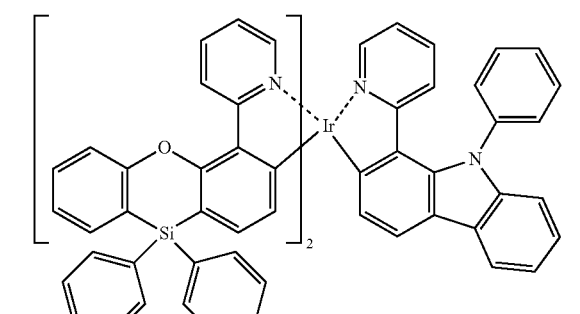
EX127
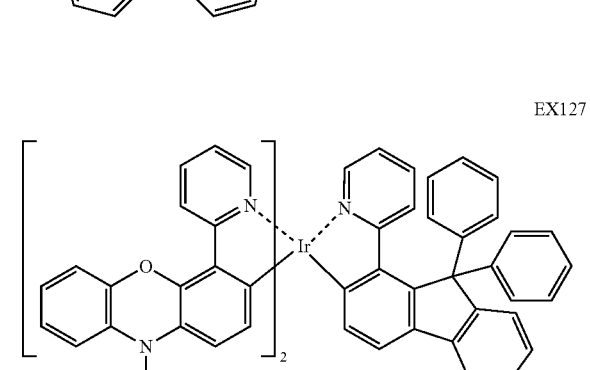
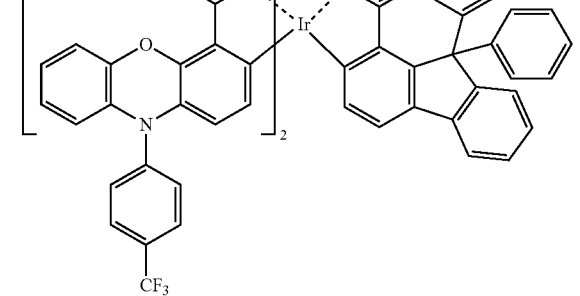
EX128
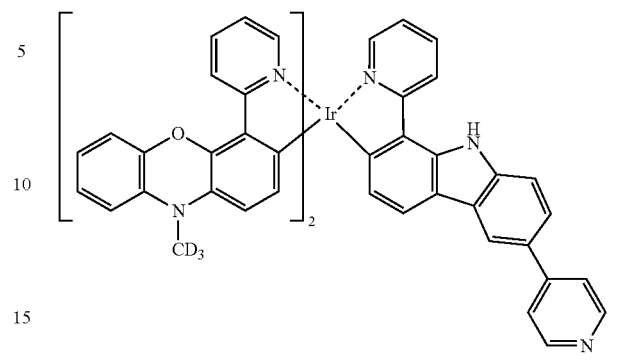
EX129
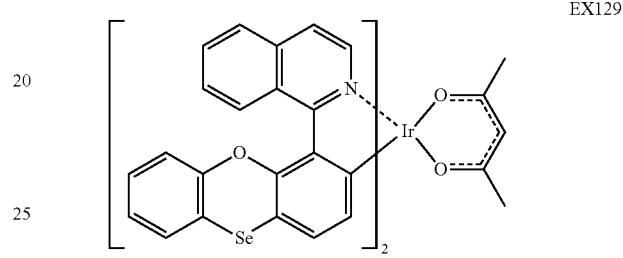
EX130
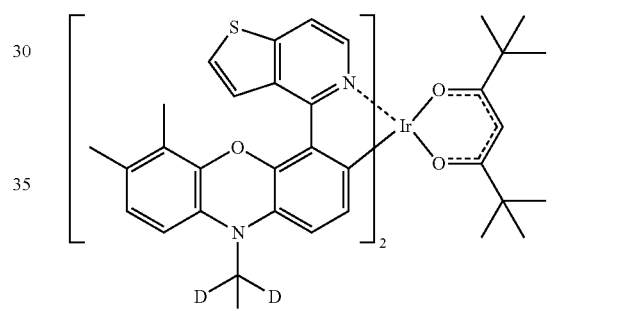
EX131
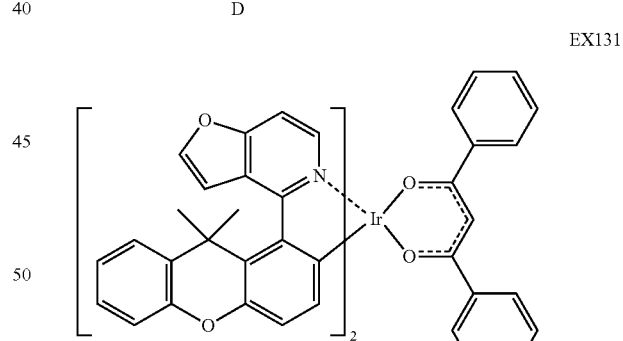
EX132
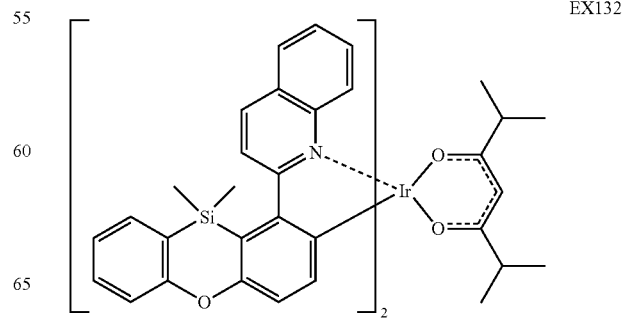

EX133
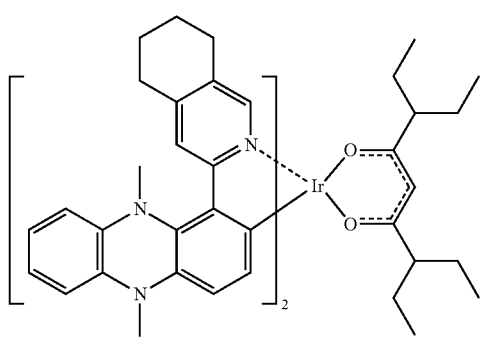
EX134
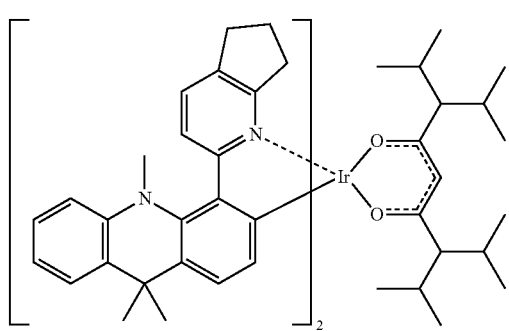
EX135
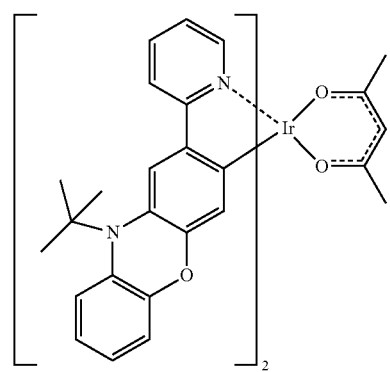
EX136
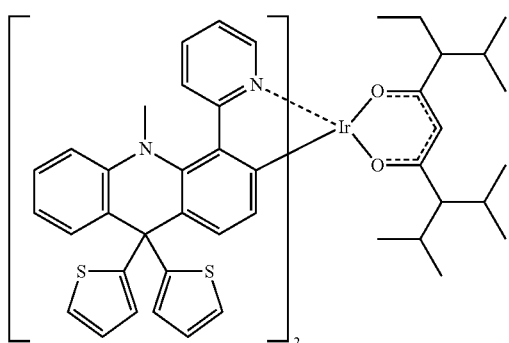
EX137
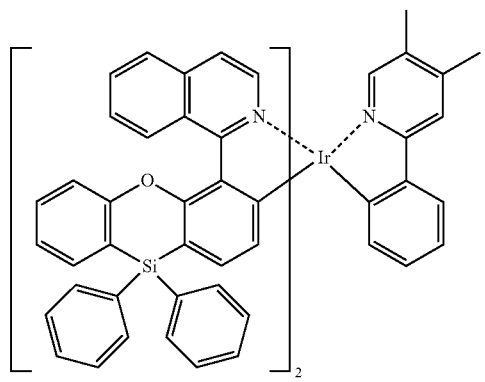
EX138
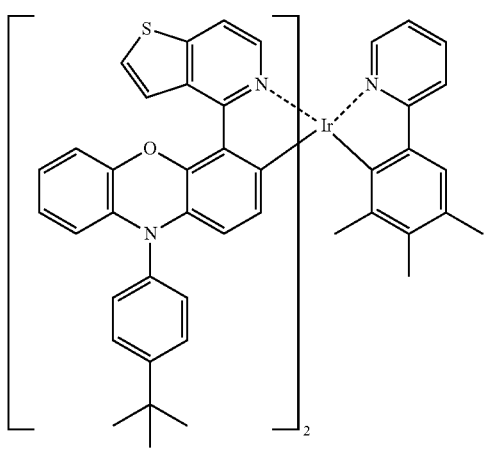
EX139
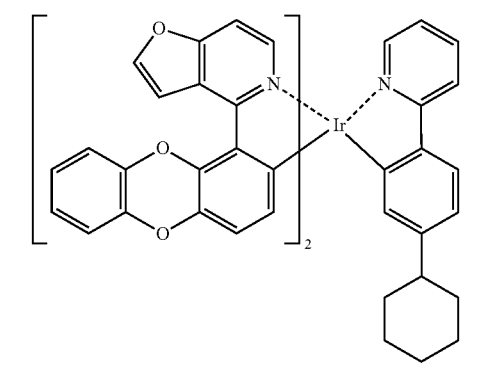
EX140
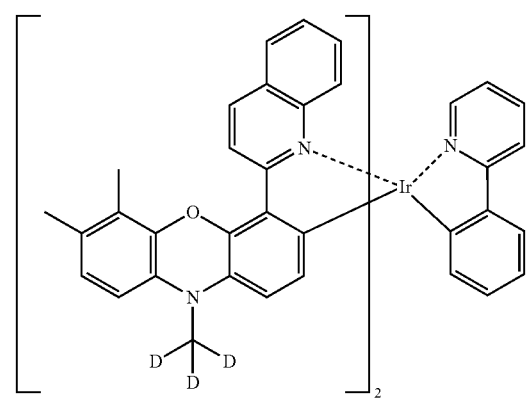

EX141
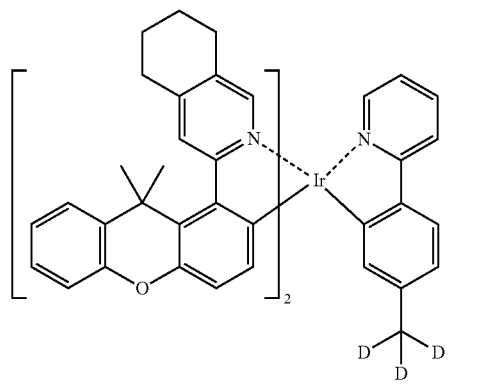
EX142
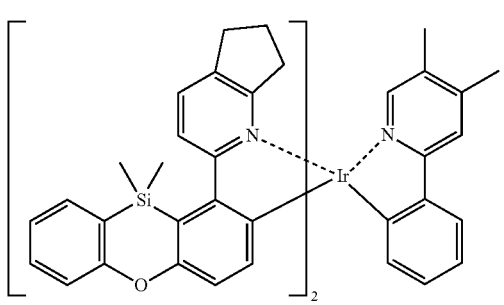
EX143
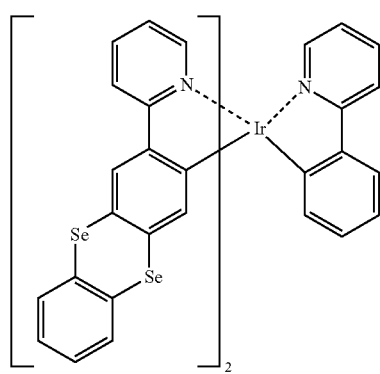
EX144
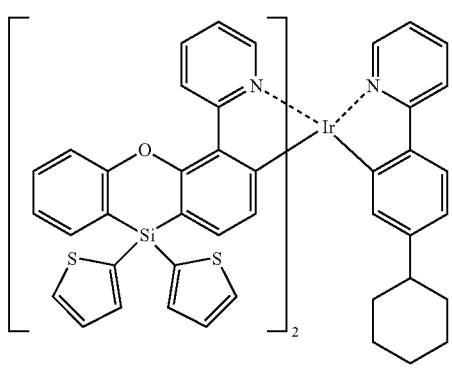
EX145
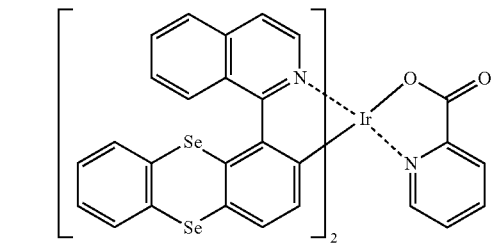
EX146
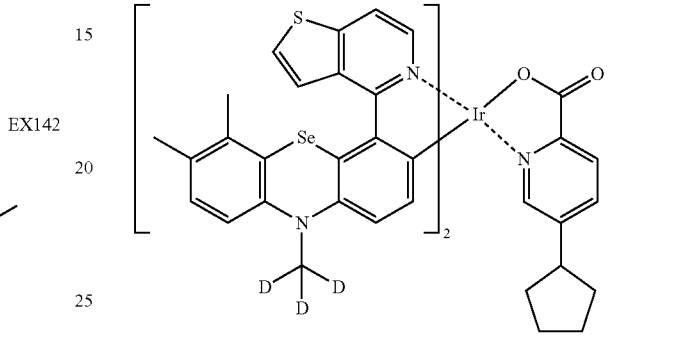
EX147
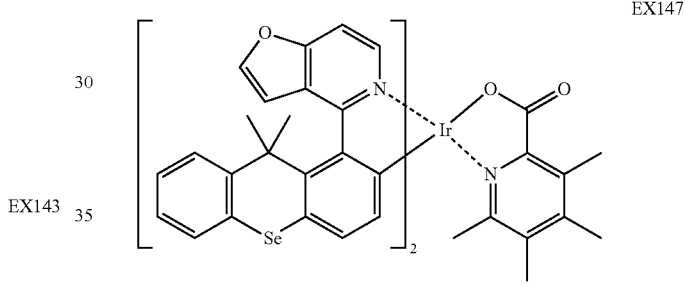
EX148
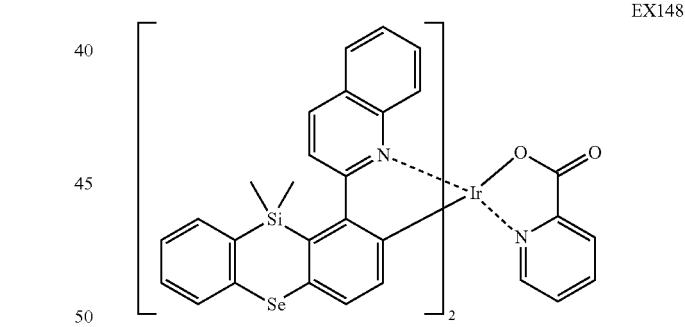
EX149
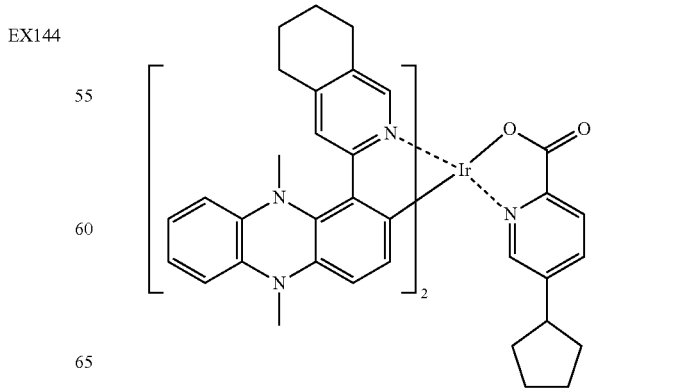

EX150
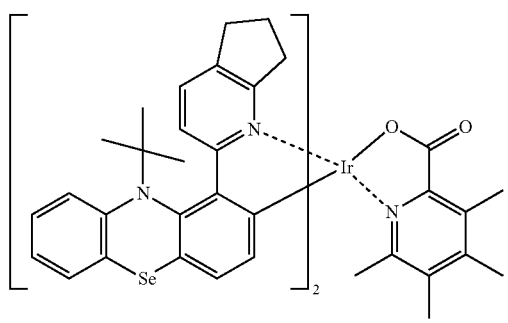
EX151
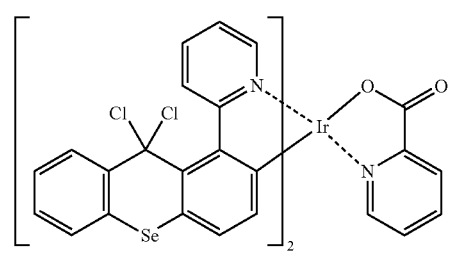
EX152
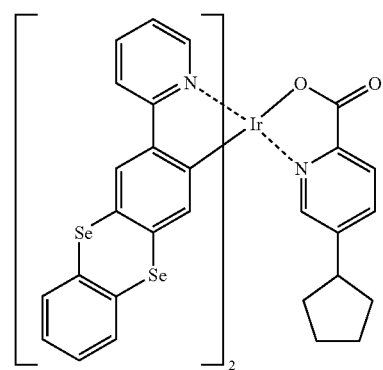
EX153
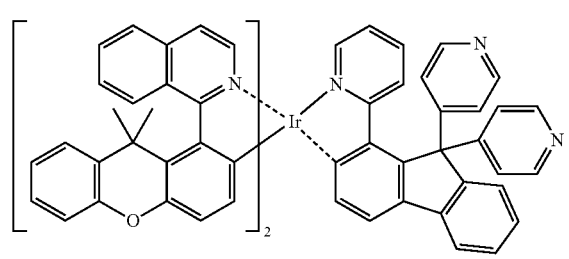
EX154
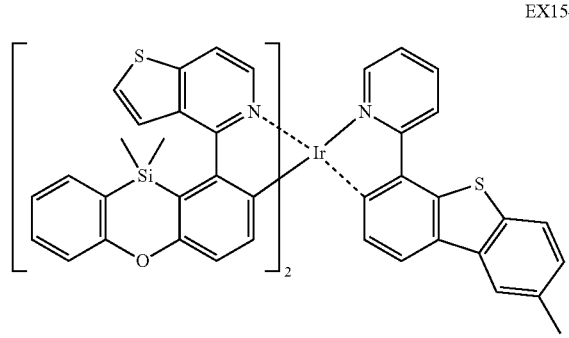
EX155
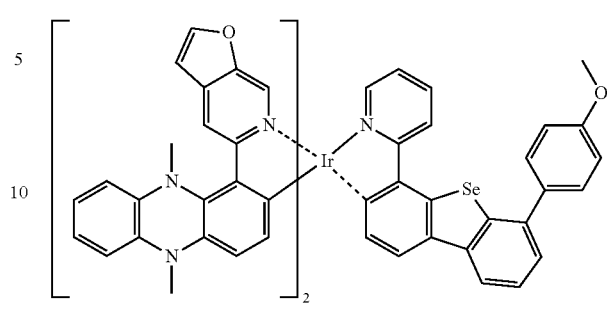
EX156
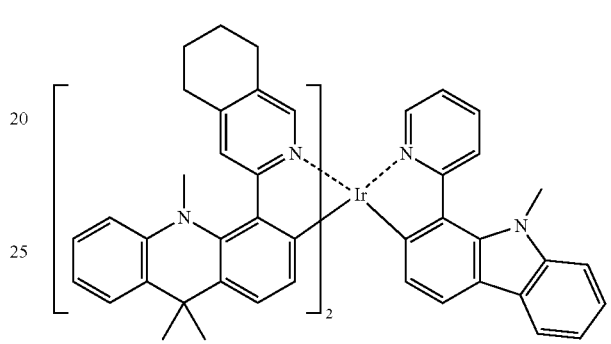
EX157
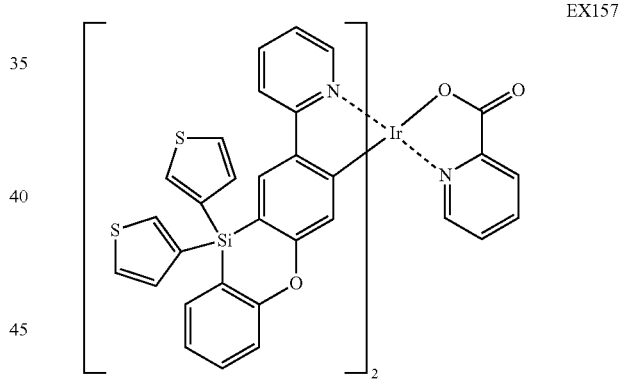
EX158
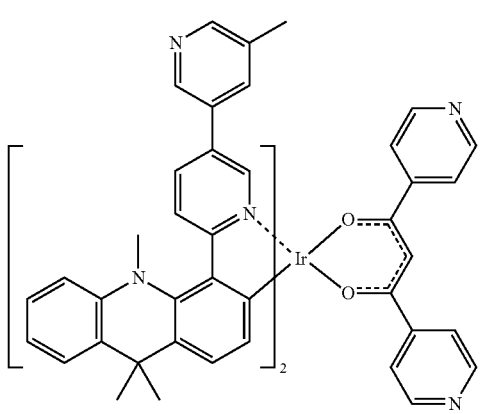

EX159
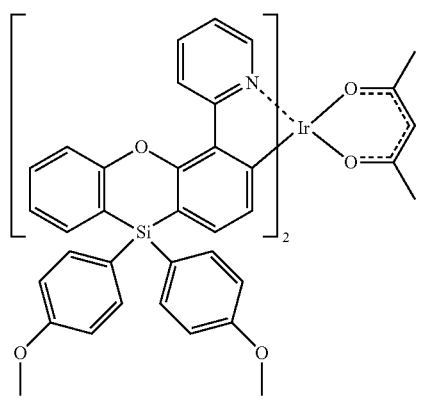
EX160
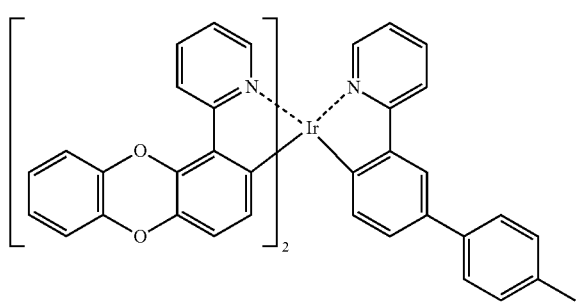
EX161
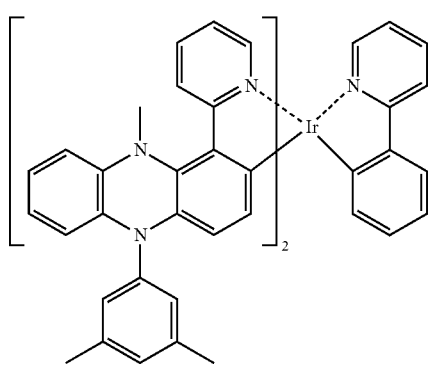
EX162
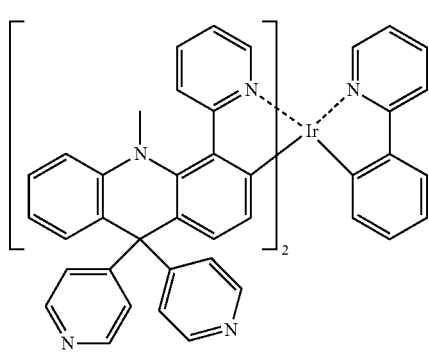
EX163
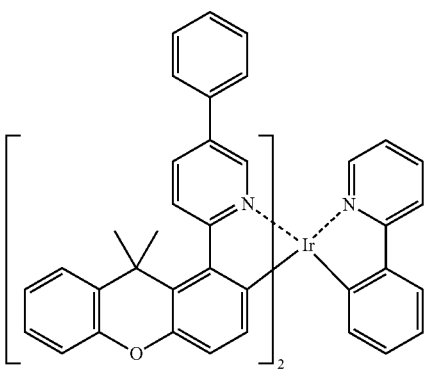
EX164
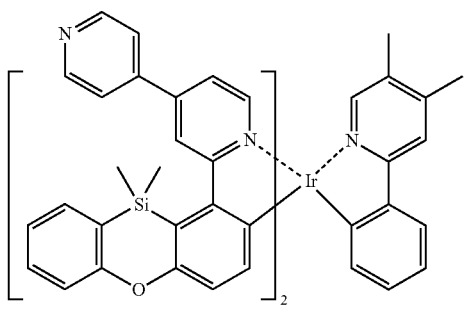
EX165
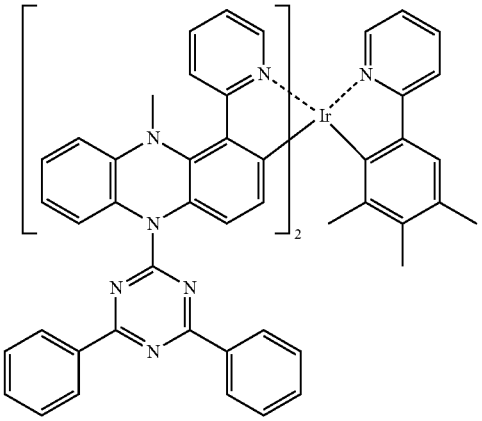
EX166
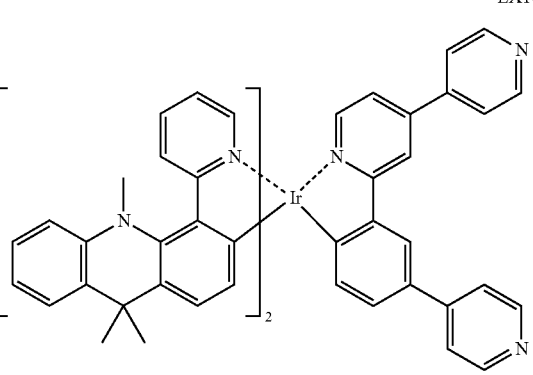

EX168
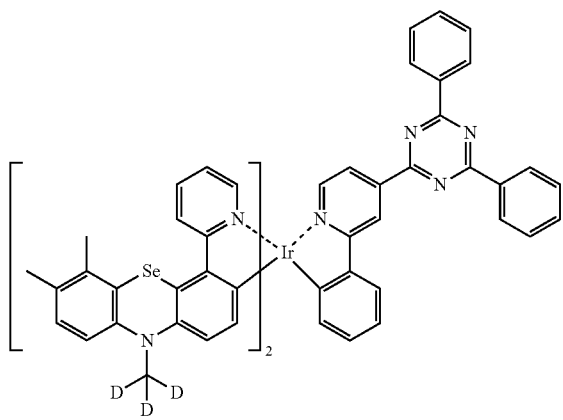
EX169
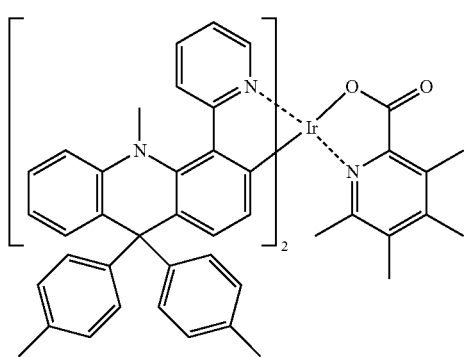
EX170
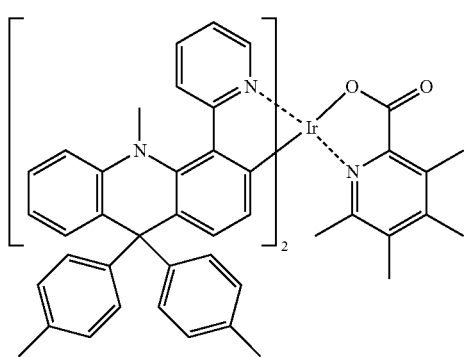
EX171
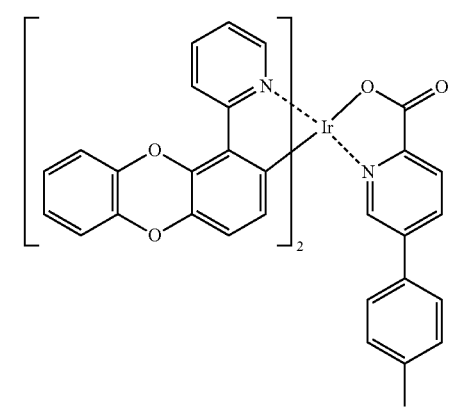
EX172
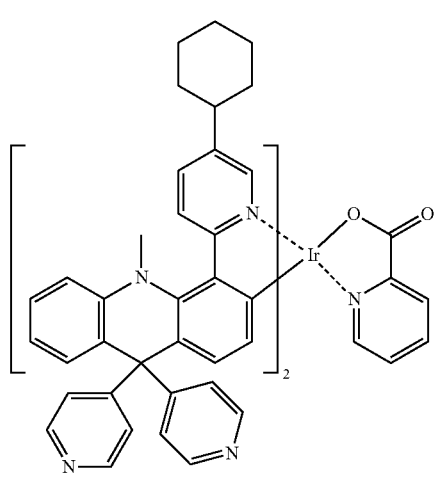
EX173
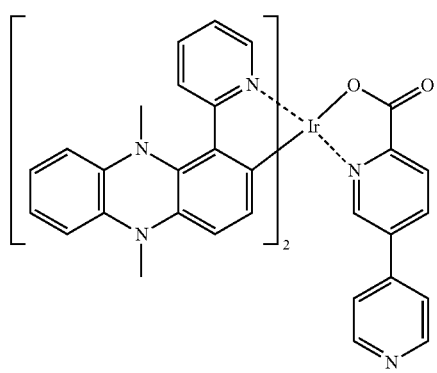
EX174
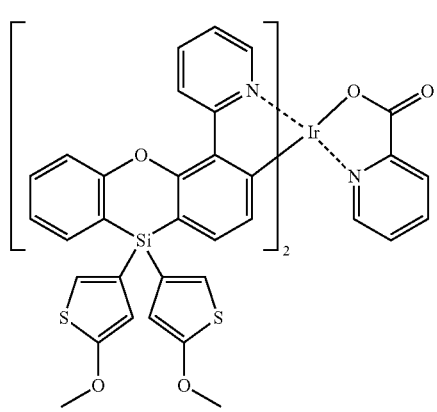
EX175
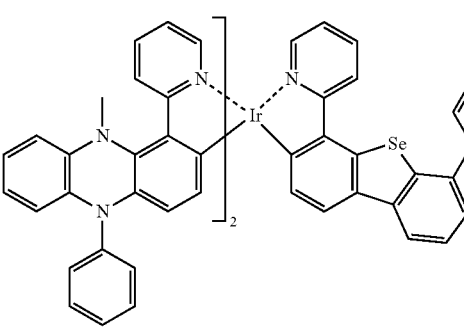

EX176
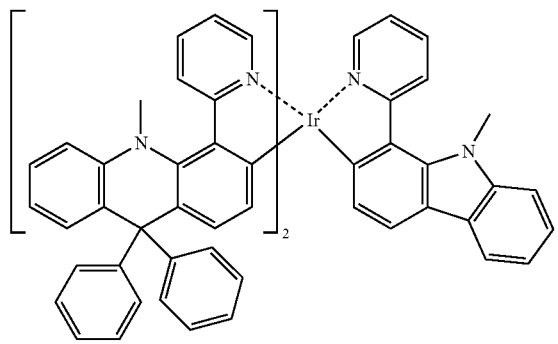
EX181
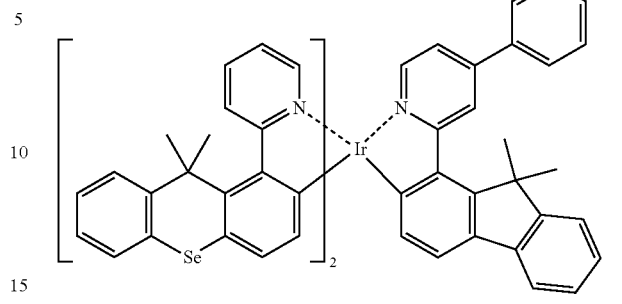
EX177
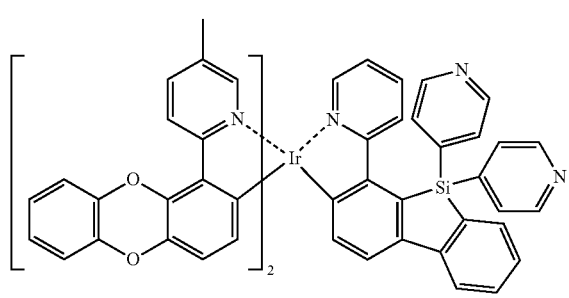
EX182
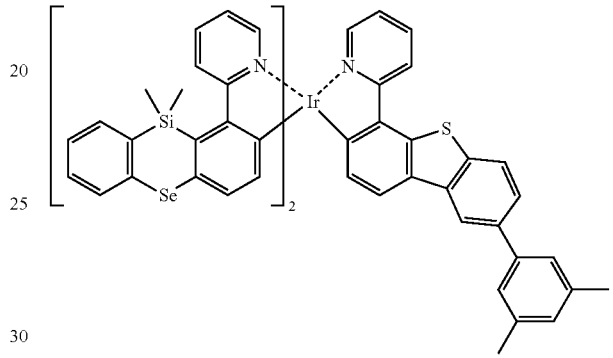
EX178
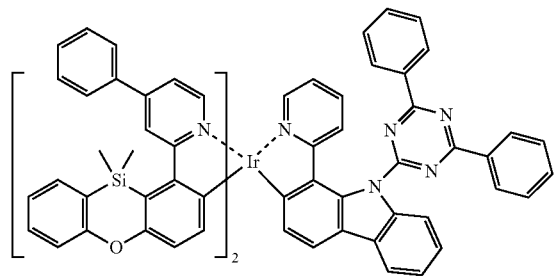
EX183
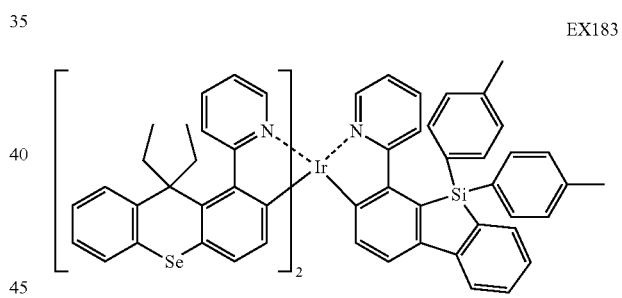
EX179
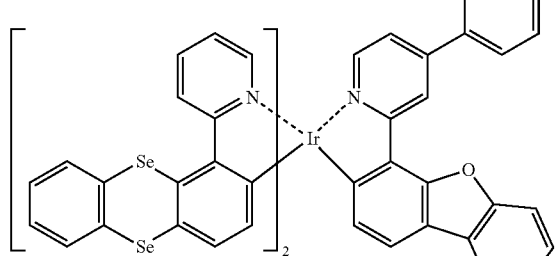
EX184
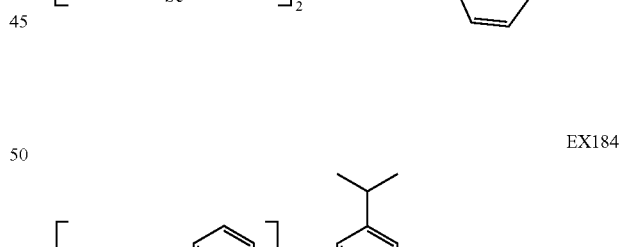
EX180
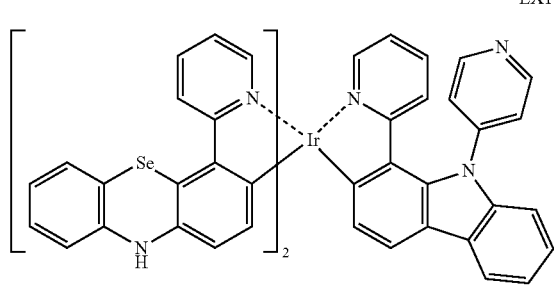
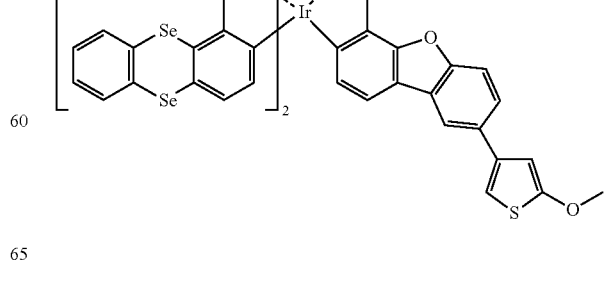

-continued
EX185
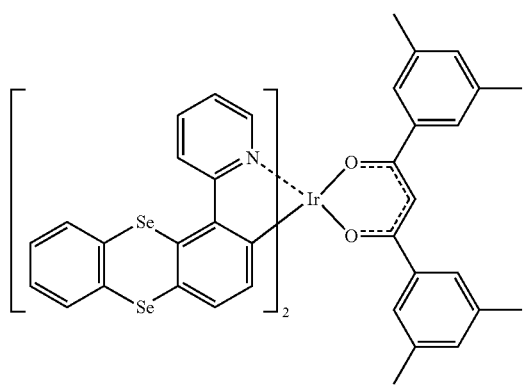
EX186
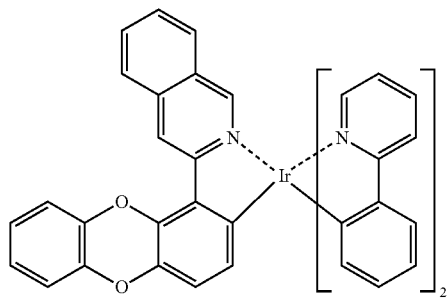
EX187
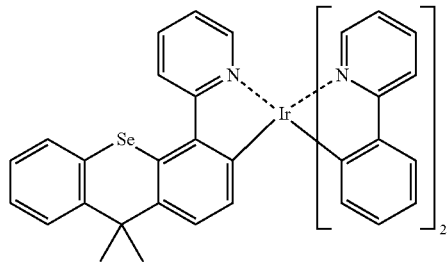
EX188
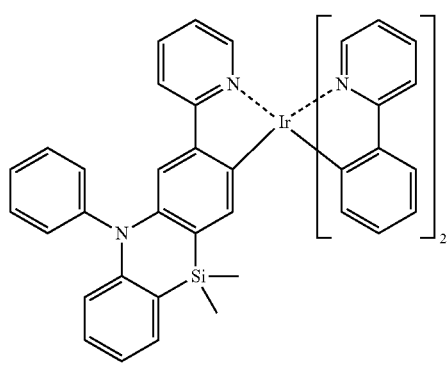
EX189
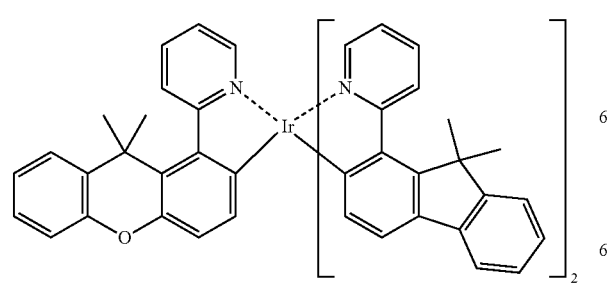
-continued
EX190
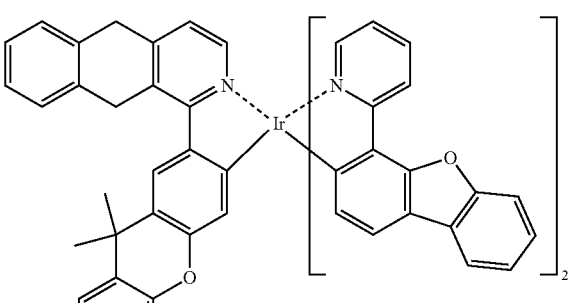
EX191
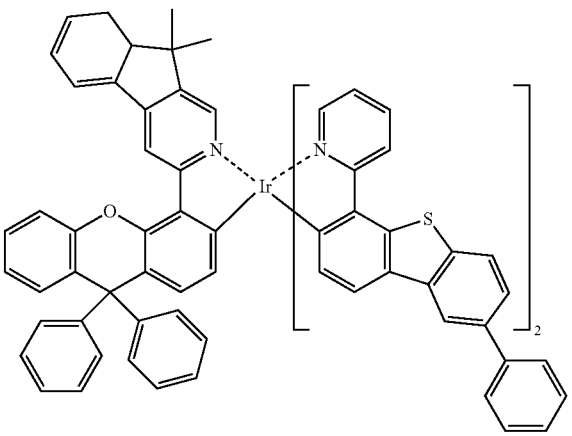
EX193
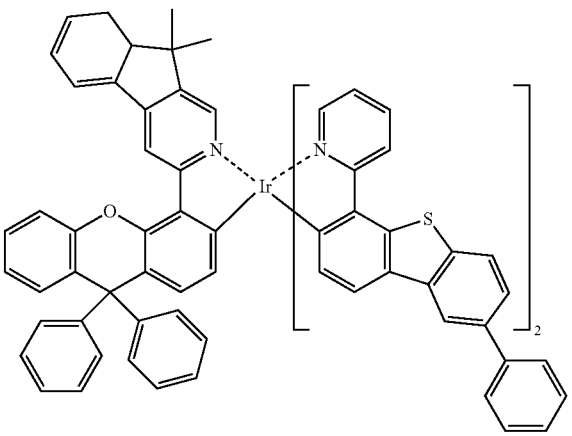
EX194
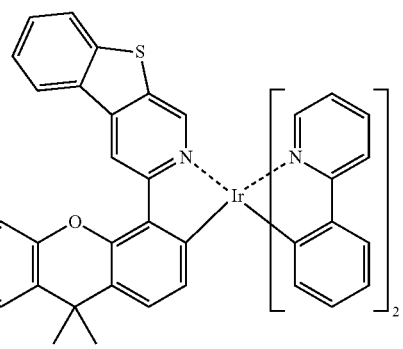

EX195
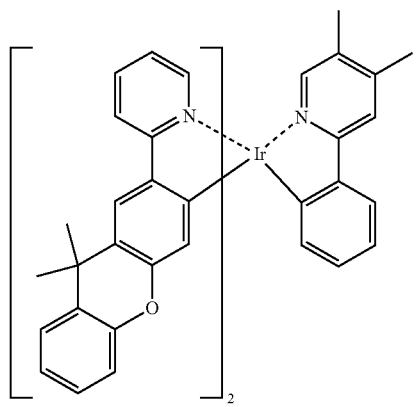

EX200
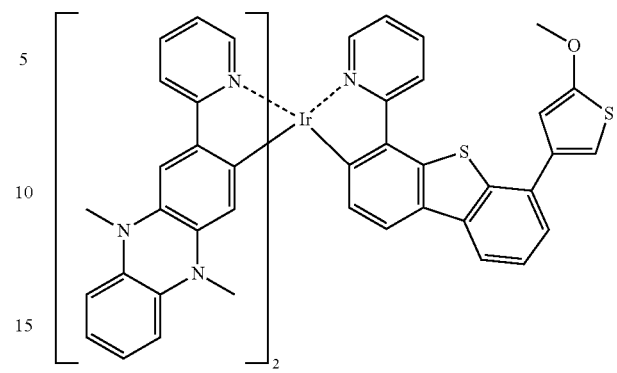

EX197
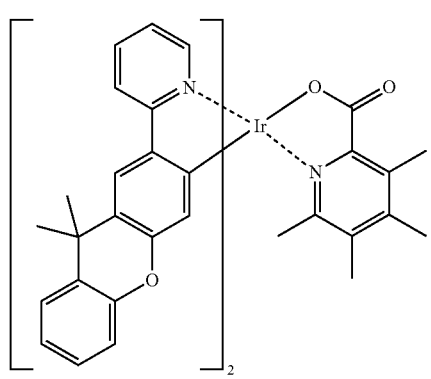

EX201
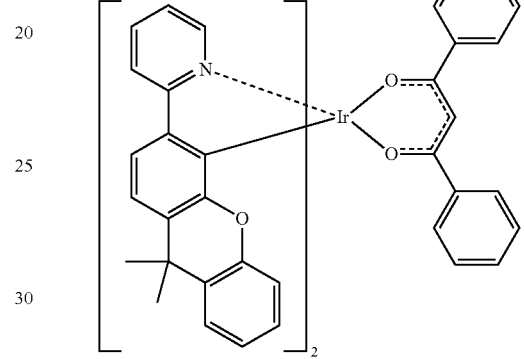

EX198
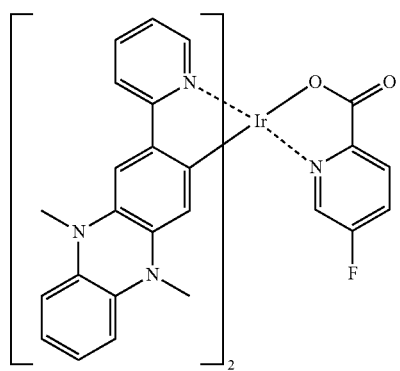

EX202
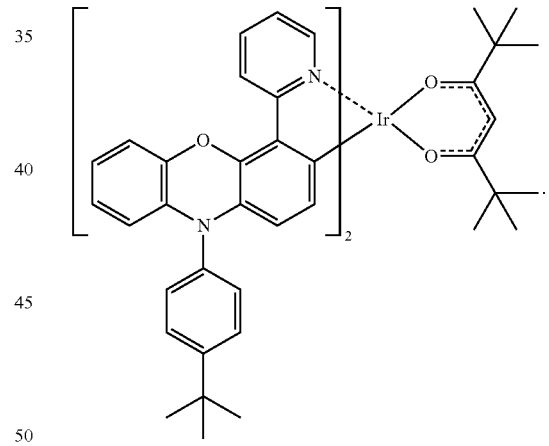

EX199
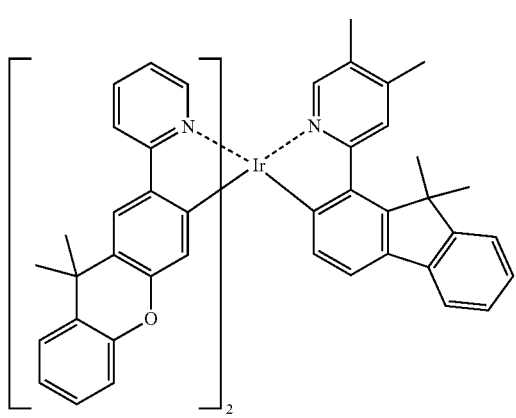

3. An organic electroluminescence device, comprising a pair of electrodes composed of a cathode and an anode, and a light emitting layer between the pair of electrodes, wherein the light emitting layer comprises the iridium complex of claim 2.

4. The organic electroluminescence device of claim 3, wherein the light emitting layer further includes a host material, and the iridium complex of formula (1) is used as a phosphorescent dopant material.

5. The organic electroluminescence device of claim 4, wherein the host material is selected from the following compounds:

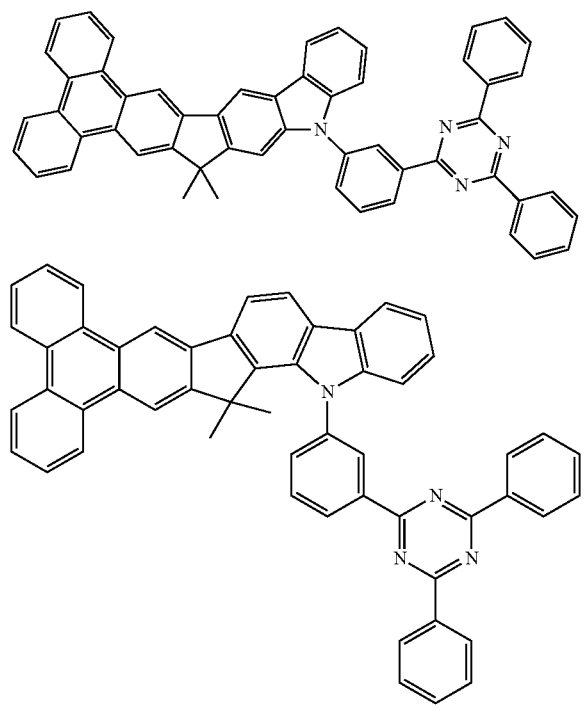
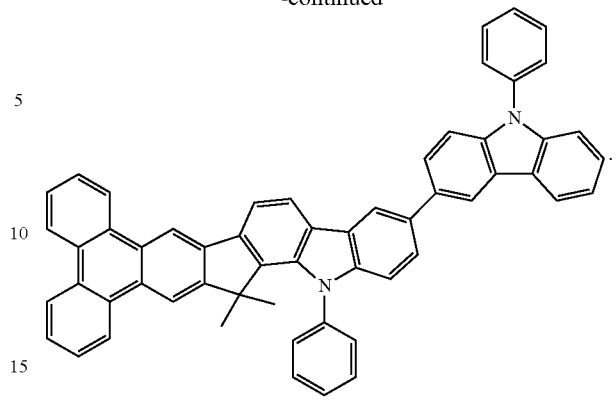

6. The organic electroluminescence device of claim 3, wherein the light emitting layer emits red, green, blue, or yellow phosphorescence.

7. The organic electroluminescence device of claim 3, wherein the organic electroluminescence device is a lighting panel.

8. The organic electroluminescence device of claim 3, wherein the organic electroluminescence device is a backlight panel.

\* \* \* \* \*